(12) United States Patent
Okimoto et al.

(10) Patent No.: US 11,778,737 B2
(45) Date of Patent: Oct. 3, 2023

(54) WIRING BOARD AND METHOD FOR MANUFACTURING WIRING BOARD

(71) Applicants: DAI NIPPON PRINTING CO., LTD., Tokyo-to (JP); THE UNIVERSITY OF TOKYO, Tokyo-to (JP)

(72) Inventors: Naoko Okimoto, Tokyo-to (JP); Kenichi Ogawa, Tokyo-to (JP); Takao Someya, Tokyo-to (JP)

(73) Assignees: DAI NIPPON PRINTING CO., LTD., Tokyo (JP); THE UNIVERSITY OF TOKYO, Tokyo (JP)

(*) Notice: Subject to any disclaimer, the term of this patent is extended or adjusted under 35 U.S.C. 154(b) by 120 days.

(21) Appl. No.: 17/388,448

(22) Filed: Jul. 29, 2021

(65) Prior Publication Data

US 2022/0015228 A1     Jan. 13, 2022

Related U.S. Application Data

(63) Continuation of application No. 16/755,780, filed as application No. PCT/JP2018/038132 on Oct. 12, 2018, now Pat. No. 11,109,479.

(30) Foreign Application Priority Data

Oct. 12, 2017 (JP) ................................. 2017-198764

(51) Int. Cl.
*H05K 1/02*       (2006.01)
*H05K 1/03*       (2006.01)
*H05K 3/00*       (2006.01)

(52) U.S. Cl.
CPC ......... *H05K 1/0283* (2013.01); *H05K 1/0393* (2013.01); *H05K 3/0014* (2013.01)

(58) Field of Classification Search
CPC ............... H05K 1/0286; H05K 1/0393; H05K 3/0014
See application file for complete search history.

(56) References Cited

U.S. PATENT DOCUMENTS 8,987,707 B2   3/2015   Arnold et al.
9,740,035 B2   8/2017   Kwon et al.
(Continued)

FOREIGN PATENT DOCUMENTS

JP   2007-281406 A   10/2007
JP   2013-187308 A   9/2013
(Continued)

OTHER PUBLICATIONS

Mar. 8, 2022 Office Action issued in Japanese Patent Application No. 2019-142499.
Jul. 6, 2018 Office Action issued in Japanese Patent Application No. 2017-198764.
(Continued)

*Primary Examiner* — Hoa C Nguyen
(74) *Attorney, Agent, or Firm* — Oliff PLC

(57) ABSTRACT

A substrate that is stretchable and that at least has a wiring region; wiring at least positioned in the wiring region on a first surface side of the substrate, the wiring having a meandering shape section that includes peaks and valleys aligned along a first direction that is one of planar directions of the first surface of the substrate; and a stretching control mechanism that controls extension and contraction of the substrate. The stretching control mechanism at least includes stretching control parts that are positioned in the wiring region of the substrate and that are aligned along the first direction.

30 Claims, 36 Drawing Sheets

(56) References Cited

U.S. PATENT DOCUMENTS

| | | |
|---|---|---|
| 2004/0192082 A1 | 9/2004 | Wagner et al. |
| 2008/0257586 A1 | 10/2008 | Chen et al. |
| 2012/0051005 A1* | 3/2012 | Vanfleteren ............ H01L 24/81 |
| | | 29/854 |
| 2012/0241198 A1 | 9/2012 | Kajiya et al. |
| 2014/0098557 A1* | 4/2014 | Veerasamy ....... B32B 17/10761 |
| | | 362/545 |
| 2014/0218872 A1* | 8/2014 | Park .................... H05K 1/0283 |
| | | 216/13 |
| 2014/0299362 A1 | 10/2014 | Park et al. |
| 2015/0053927 A1 | 2/2015 | Arnold et al. |
| 2015/0147854 A1 | 5/2015 | Jung et al. |
| 2015/0282295 A1 | 10/2015 | Matsumoto et al. |
| 2016/0020500 A1 | 1/2016 | Matsuda |
| 2017/0034907 A1 | 2/2017 | Iwase |
| 2017/0231082 A1 | 8/2017 | Yoshida et al. |
| 2018/0068759 A1* | 3/2018 | Bihler ...................... A61N 1/05 |
| 2018/0192520 A1 | 7/2018 | Choong et al. |

FOREIGN PATENT DOCUMENTS

| | | |
|---|---|---|
| JP | 2015-198103 A | 11/2015 |
| JP | 2016-04875 A | 1/2016 |
| JP | 2016-040793 A | 3/2016 |
| JP | 2016-143557 A | 8/2016 |
| KR | 2014-0058239 A | 5/2014 |
| WO | 2010/086034 A1 | 8/2010 |
| WO | 2014/127557 A1 | 8/2014 |
| WO | 2015/183264 A1 | 12/2015 |

OTHER PUBLICATIONS

Dec. 18, 2018 International Search Report issued in International Patent Application No. PCT/JP2018/038132.
Apr. 14, 2020 International Preliminary Report on Patentability issued in International Patent Application No. PCT/JP2018/038132.
Aug. 3, 2021 Extended European Search Report issued in European Patent Application No. 18866444.5.

* cited by examiner

WIRING BOARD AND METHOD FOR MANUFACTURING WIRING BOARD

CROSS-REFERENCE TO RELATED APPLICATION(S)

This application is a continuation of U.S. application Ser. No. 16/755,780 filed Apr. 13, 2020, which in turn is a National Stage Application of PCT/JP2018/038132 filed Oct. 12, 2018, and which is based on and claims priority under 35 U.S.C. 119 10 from Japanese Patent Application No. 2017-198764 filed on Oct. 12, 2017. The contents of the above applications are incorporated herein by reference.

TECHNICAL FIELD

An embodiment of the present disclose relates to a wiring board comprising a substrate, and electronic components and wiring that are positioned on a first surface side of the substrate. The embodiment of the present disclosure further relates to a method for manufacturing a wiring board.

BACKGROUND ART

In recent years, there has been research on electronic devices that have deformability such as stretchability. For example, devices in which extensible silver wiring is formed on a stretchable substrate and devices in which horseshoe-shaped wiring is formed on a stretchable substrate are known (see Patent Literature 1, for example). However, electronic devices of such types are confronted by the problem that the resistance value of the wiring readily changes as the substrate extends and contracts.

As another type of electronic device, for example, Patent Literature 2 discloses a wiring board that comprises a substrate and wiring provided on the substrate, and that is stretchable. In Patent Literature 2, a manufacturing method is adopted in which a circuit is provided on a substrate that is in a pre-extended state and the substrate is relaxed after the circuit has been formed. Patent Literature 2 is directed toward enabling a thin film transistor on the substrate to function favorably irrespective of whether the substrate is in a stretched state or a relaxed state.

CITATION LIST

Patent Literature

Patent Literature 1: Japanese Unexamined Patent Publication No. 2013-187308
Patent Literature 2: Japanese Unexamined Patent Publication No. 2007-281406

SUMMARY

When the substrate is in a relaxed state, the wiring provided on the substrate has a meandering shape section in which peaks and valleys appear repeatedly along a planar direction of the substrate. In this case, when the substrate is extended, the wiring is able to accommodate the extension of the substrate due to the spreading of the meandering shape section in the planar direction. Hence, with an electronic device of the type that has a meandering shape section, it is possible to suppress a change in the resistance value of the wiring that accompanies an extension or a contraction of the substrate.

However, there are sometimes inconsistencies in the height of the peaks and depth of the valleys of the meandering shape section according to position, due to variation in substrate thickness, variation in substrate elongation at the time of extension, or a difference in the distribution density of the wiring provided on the substrate, and so forth. Furthermore, when the substrate extends significantly, the periodicity of the meandering shape section is sometimes disturbed such that the height of the peaks and depth of the valleys are then locally large. When the height of the peaks and depth of the valleys varies according to position, the degree of curvature and bending generated in the wiring is also then locally significant. Damage such as breaks in the wiring is conceivable, particularly when the degree of substrate extension is significant.

The purpose of the embodiment of the present disclosure is to provide a wiring board and a method for manufacturing the wiring board that enable the foregoing problems to be resolved effectively.

One embodiment of the present disclosure is a wiring board, comprising: a substrate that is stretchable and that at least has a wiring region; wiring at least positioned in the wiring region on a first surface side of the substrate, the wiring having a meandering shape section that includes peaks and valleys aligned along a first direction that is one of planar directions of the first surface of the substrate; and a stretching control mechanism that controls extension and contraction of the substrate, wherein the stretching control mechanism at least includes stretching control parts that are positioned in the wiring region of the substrate and that are aligned along the first direction.

In a wiring board according to one embodiment of the present disclosure, the stretching control part positioned in the wiring region may have a bending rigidity greater than the bending rigidity of the substrate. Alternatively, the stretching control part positioned in the wiring region may have a bending rigidity that is equal to or smaller than the bending rigidity of the substrate. Furthermore, the stretching control part positioned in the wiring region may have an elastic modulus greater than the elastic modulus of the substrate. Alternatively, the stretching control part positioned in the wiring region may have an elastic modulus that is equal to or smaller than the elastic modulus of the substrate.

In a wiring board according to one embodiment of the present disclosure, the amplitude of the meandering shape section of the wiring may be 1 μm or more.

In a wiring board according to one embodiment of the present disclosure, the amplitude of peaks and the valleys on a second surface of the substrate positioned on the opposite side of the first surface may be smaller than the amplitude of peaks and valleys on the first surface of the substrate. For example, the amplitude of peaks and the valleys on the second surface may be a 0.9 multiple or less or may be a 0.8 multiple or less of the amplitude of the peaks and the valleys on the first surface. The peaks and the valleys on the second surface appear in a section overlapping the meandering shape section. The peaks and the valleys on the first surface appear in a section overlapping the meandering shape section.

In a wiring board according to one embodiment of the present disclosure, the stretching control parts positioned in the wiring region may be aligned with a periodicity corresponding to the periodicity of the meandering shape section.

In a wiring board according to one embodiment of the present disclosure, when the average value of intervals between the peaks of the meandering shape section is referred to as a first periodicity, and when the average value of intervals between the stretching control parts positioned in the wiring region is referred to as a second periodicity, the second periodicity may be an m multiple or 1/n of the first periodicity, m and n being positive integers.

In a wiring board according to one embodiment of the present disclosure, the periodicity of peaks and valleys on a second surface of the substrate positioned on the opposite side of the first surface may be greater than the periodicity of peaks and valleys on the first surface of the substrate. For example, the periodicity of peaks and the valleys on the second surface may be a 1.1 multiple or more or may be a 1.2 multiple or more of the periodicity of the peaks and the valleys on the first surface. The peaks and the valleys on the second surface appear in a section overlapping the meandering shape section. The peaks and the valleys on the first surface appear in a section overlapping the meandering shape section.

In a wiring board according to one embodiment of the present disclosure, when the periodicity of peaks and valleys on the first surface of the substrate is F1, the positions of peaks and valleys on a second surface of the substrate positioned on the opposite side of the first surface may be displaced from the positions of the peaks and the valleys on the first surface of the substrate. For example, the positions of the peaks and the valleys on the second surface may be displaced by 0.1×F1 or more from the positions of the peaks and the valleys on the first surface. The peaks and the valleys on the second surface appear in a section overlapping the meandering shape section. The peaks and the valleys on the first surface appear in a section overlapping the meandering shape section.

In a wiring board according to one embodiment of the present disclosure, the stretching control part positioned in the wiring region may include a first section and a second section having a higher deformability than the first section.

In a wiring board according to one embodiment of the present disclosure, the thickness of the second section of the stretching control part positioned in the wiring region may be at least partially reduced as distance from the first section increases.

In a wiring board according to one embodiment of the present disclosure, the elastic modulus of the second section of the stretching control part positioned in the wiring region may be smaller than the elastic modulus of the first section of the stretching control part positioned in the wiring region.

In a wiring board according to one embodiment of the present disclosure, the density distribution of the second section of the stretching control part positioned in the wiring region may be smaller than the density distribution of the first section of the stretching control part positioned in the wiring region.

In a wiring board according to one embodiment of the present disclosure, at least two of the second stretching control in the wiring region are positioned in a range of one period of the meandering shape section and are in contact with each other.

In a wiring board according to one embodiment of the present disclosure, the stretching control part of the stretching control mechanism in the wiring region may be positioned on the wiring or on the first surface of the substrate.

In a wiring board according to one embodiment of the present disclosure, the stretching control part of the stretching control mechanism in the wiring region may be positioned between the wiring and the substrate.

In a wiring board according to one embodiment of the present disclosure, the stretching control part of the stretching control mechanism in the wiring region may be embedded inside the substrate.

In a wiring board according to one embodiment of the present disclosure, the stretching control part of the stretching control mechanism in the wiring region may be positioned on a second surface side on the opposite side of the first surface of the substrate.

The wiring board according to one embodiment of the present disclosure may further comprise a support substrate that is positioned between the wiring and the first surface of the substrate, that has an elastic modulus greater than the elastic modulus of the substrate, and that supports the wiring.

In a wiring board according to one embodiment of the present disclosure, the substrate further may have a component region that is adjacent to the wiring region and on that an electronic component having an electrode is mounted. In this case, the wiring board may further comprise the electronic component positioned in the component region on the first surface side of the substrate and having the electrode. The wiring may be electrically connected to the electrode of the electronic component. The component region of the substrate may include a component-fixing region overlapping an electronic component mounted on the wiring board when viewed along the normal direction of the first surface of the substrate and a component-surrounding region positioned around the component-fixing region. The stretching control mechanism may further include a stretching control part that is positioned in the component-surrounding region and that spreads to the border between the component-surrounding region and the component-fixing region.

In a wiring board according to one embodiment of the present disclosure, the substrate may include a thermoplastic elastomer, a silicone rubber, a urethane gel, or a silicone gel having a thickness of 10 μm or more and 1 mm or less.

In a wiring board according to one embodiment of the present disclosure, the stretching control part may include, for example, an acrylic-based, urethane-based, epoxy-based, polyester-based, vinyl ether-based, thiol-based, or silicone-based monomer, oligomer, or polymer.

In a wiring board according to one embodiment of the present disclosure, the wiring may include a plurality of conductive particles.

One embodiment of the present disclosure is a method for manufacturing a wiring board, the method comprising: a first step of applying tensile stress to a substrate so as to extend the substrate, the substrate being stretchable and at least having a wiring region; a second step of providing wiring in the wiring region, on a first surface side of the substrate which is in the extended state; and a third step of removing the tensile stress from the substrate, wherein, after the tensile stress has been removed from the substrate, the wiring has a meandering shape section that includes pluralities of peaks and valleys aligned along a first direction that is one of planar directions of the first surface of the substrate, wherein the wiring board is provided with a stretching control mechanism that controls extension and contraction of the substrate, and wherein the stretching control mechanism at least includes stretching control parts that are positioned in the wiring region of the substrate and that are aligned along the first direction.

According to the embodiment of the present disclosure, it is possible to restrain the meandering shape section from varying according to position.

DESCRIPTION OF EMBODIMENTS

Figure 1:
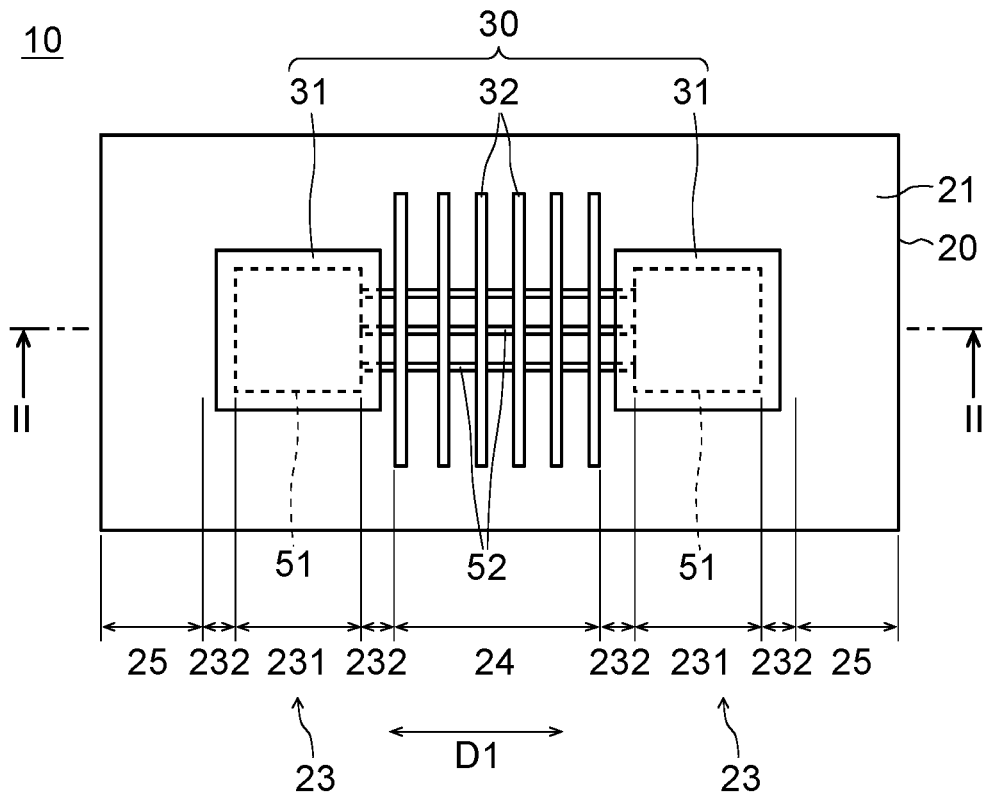
FIG. 1 is a plan view illustrating a wiring board according to an embodiment.

A configuration of a wiring board according to the embodiment of the present disclosure and a method for manufacturing the same will be described in detail hereinbelow with reference to the drawings. Note that the embodiments indicated hereinbelow are an example of the embodiment of the present disclosure and that the present disclosure should not be interpreted as being limited to or by such embodiments. Furthermore, in the present specification, terminology such as "board", "substrate", "sheet" and "film" are not distinguished only on the basis of term distinctions. For example, "substrate" is a concept that also includes members like those that may be referred to as boards, sheets, and films. Furthermore, it is assumed that length and angle values and terms such as "parallel" or "orthogonal", for example, which specify shape and geometric conditions as well as their degree, as used in this specification, are not bound by strict meanings and are interpreted to include a scope within which similar functions are to be expected. Moreover, the same or similar reference signs are assigned to the same parts or to parts with similar functions in the drawings referred to in the present embodiment, and repetitious descriptions of such parts are sometimes omitted. In addition, there may be cases where the dimensional ratios in the drawings differ from the actual ratios for the sake of convenience in the description and cases where parts of configurations are omitted from the drawings.

One embodiment of the present disclosure will be described hereinbelow with reference to FIGS. 1 to 8.

(Wiring Board)

Figure 2:
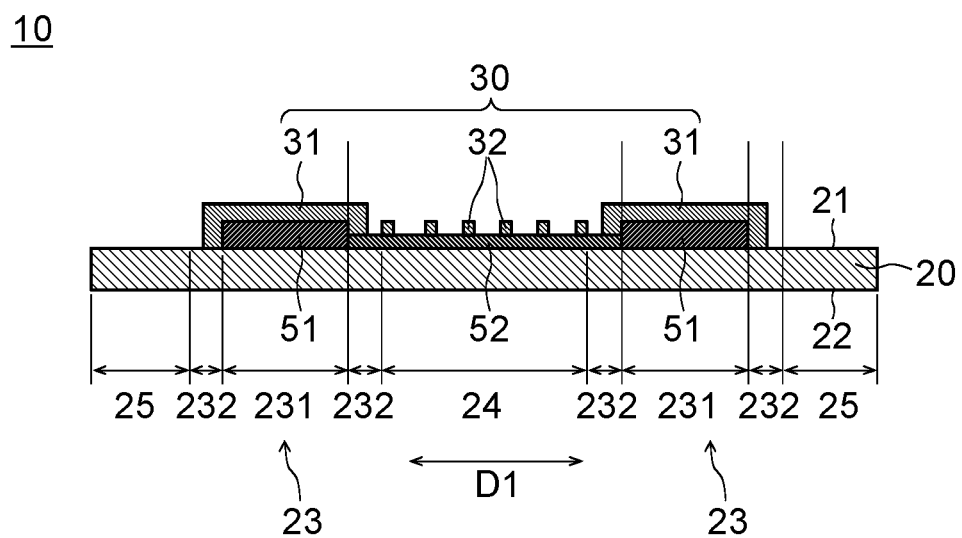
FIG. 2 is a cross-sectional view illustrating a case where the wiring board of FIG. 1 is cut along a line II-II.

First, a wiring board 10 according to the present embodiment will be described. FIGS. 1 and 2 are a plan view and a cross-sectional view, respectively, illustrating the wiring board 10. The cross-sectional view illustrated in FIG. 2 is a diagram for a case in which the wiring board 10 of FIG. 1 is cut along a line II-II.

The wiring board 10 comprises a substrate 20, a stretching control mechanism 30, an electronic component 51, and wiring 52. The constituent elements of the wiring board 10 will be described hereinbelow.

[Substrate]

The substrate 20 is a member that is configured to be stretchable. The substrate 20 includes a first surface 21 positioned on the side of the electronic component 51 and the wiring 52, and a second surface 22 positioned on the opposite side of the first surface 21. The thickness of the substrate 20 may, for example, be 10 μm or more and 10 mm or less, and more preferably 20 μm or more and 3 mm or less. By setting the thickness of the substrate 20 at 10 μm or more, the durability of the substrate 20 can be ensured. Furthermore, by setting the thickness of the substrate 20 at 10 mm or less, the wearing comfort of the wiring board 10 can be ensured. Note that when the thickness of the substrate 20 is made too small, the stretchability of the substrate 20 may be impaired.

Note that the stretchability of the substrate 20 refers to a material property enabling the substrate 20 to extend and contract, that is, a material property enabling the substrate 20 to be extended from a non-extended state which is a normal state and enabling the substrate 20 to be restored when released from the extended state. The non-extended state is a state of the substrate 20 when tensile stress is not being applied thereto. In the present embodiment, a stretchable substrate is preferably capable of extending 1% or more from a non-extended state without breaking, is more preferably capable of extending 20% or more, and is still more preferably capable of extending 75% or more. By using a substrate 20 with such a capability, the whole of the wiring board 10 can be made stretchable. Furthermore, the wiring board 10 can be used for products and applications where a high degree of stretching is required, as in the case of attachment to a body part such as a person's arm. Generally, it may be said that 72% stretchability in a vertical direction and 27% stretchability in a horizontal direction are required for a product that is attached to a person's armpit. Furthermore, it may be said that a stretchability of 26% or more and 42% or less in a vertical direction is required for a product that is attached to a person's knee, elbow, buttocks, ankle, or side. It may also be said that stretchability of 20% or less is required for a product that is attached to another part of a person's body.

In addition, the difference between the shape of the substrate 20 in the non-extended state and the shape of the substrate 20 when restored once again to the non-extended state after being extended from the non-extended state is preferably small. This difference is also referred to as a shape change in the description hereinbelow. The shape change of the substrate 20 is, for example, 20% or less in terms of an area ratio, more preferably 10% or less, and still more preferably 5% or less. By using a substrate 20 for which the shape change is small, the formation of the meandering shape section, described subsequently, is straightforward.

Possible examples of parameters representing the stretchability of the substrate 20 include the elastic modulus of the substrate 20. The elastic modulus of the substrate 20 is, for example, 10 MPa or less and more preferably 1 MPa or less. By using a substrate 20 with such an elastic modulus, the whole of the wiring board 10 can be made stretchable. The elastic modulus of the substrate 20 is also referred to as the first elastic modulus in the following description. The first elastic modulus of the substrate 20 may be 1 kPa or more.

As a method for calculating the first elastic modulus of the substrate 20, a method in which tensile testing is carried out in conformance with JIS K6251 by using a sample of the substrate 20 may be adopted. Furthermore, a method in which the elastic modulus of the sample of the substrate 20 is measured using nanoindentation in conformance with ISO 14577 may also be adopted. A nano indenter may be employed as the measuring instrument used in the nanoindentation. Conceivable methods for preparing the sample of the substrate 20 include a method in which a portion of the substrate 20 is removed as a sample from the wiring board 10 and a method in which a portion of the substrate 20 before the wiring board 10 is constituted is removed as a sample. In addition to such methods, as a method for calculating the first elastic modulus of the substrate 20, a method in which the material constituting the substrate 20 is analyzed and the first elastic modulus of the substrate 20 is calculated on the basis of an existing database of materials may also be adopted. Note that the elastic modulus of the present application is an elastic modulus in an environment of 25° C.

Other examples of parameters representing the stretchability of the substrate 20 may include the bending rigidity of the substrate 20. The bending rigidity is the product of the second moment of area of the member of interest and the elastic modulus of the material constituting the member of interest, and the units of the bending rigidity are $N \cdot m^2$ or $Pa \cdot m^4$. The second moment of area of the substrate 20 is calculated on the basis of the cross-section when the section of the substrate 20 that overlaps the wiring 52 is cut according to a plane orthogonal to the stretching direction of the wiring board 10.

Examples of the material constituting the substrate 20 may include elastomers, for example. Furthermore, as the material of the substrate 20, cloth such as woven fabric, knitted fabric, or nonwoven fabric, for example, may also be used. Elastomers that can be used include general thermoplastic elastomers and thermoset elastomers and, more specifically, polyurethane-based elastomers, styrene-based elastomers, nitrile-based elastomers, olefin-based elastomers, polyvinyl chloride-based elastomers, ester-based elastomers, amide-based elastomers, 1,2-BR elastomers, fluorine-based elastomers, silicone rubbers, urethane rubber, fluorine rubber, polybutadiene, polyisobutylene, polystyrene-butadiene, and polychloroprene, and the like, may be used. When mechanical strength and wear resistance are considered, urethane-based elastomers are preferably employed. Furthermore, the substrate 20 may contain silicone. Silicone exhibits superior heat resistance, chemical resistance, and incombustibility and is preferable as the material of the substrate 20.

As illustrated in FIGS. 1 and 2, the substrate 20 includes a component region 23, a wiring region 24, and a surrounding region 25. The wiring region 24 is a region adjacent to the component region 23. The surrounding region 25 is a region between the component region 23 or the wiring region 24, and the outer perimeter of the substrate 20.

Figure 3:
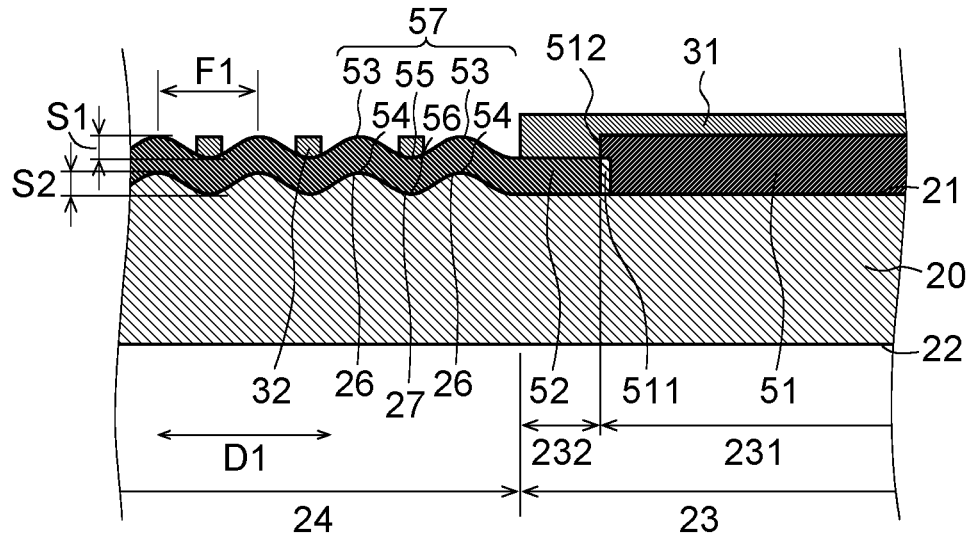
FIG. 3 is a cross-sectional view illustrating an enlargement of the wiring board illustrated in FIG. 2.

FIG. 3 is a cross-sectional view illustrating an enlargement of the wiring board 10 of FIG. 2. As illustrated in FIG. 3, the component region 23 includes a component-fixing region 231 and a component-surrounding region 232. The component-fixing region 231 is a region which overlaps the electronic component 51 when viewed along the normal direction of the first surface 21 of the substrate 20. The component-surrounding region 232 is a region positioned around the component-fixing region 231.

The component-surrounding region 232 is a region in which the foregoing stretching control mechanism 30 is provided to suppress a concentration of stress in a border section between the electronic component 51 and the wiring 52. The dimensions of the component-surrounding region 232 are defined so as to enable suppression of a concentration of stress in the border section between the electronic component 51 and the wiring 52. For example, the surface area of the component-surrounding region 232 may be one quarter or more of the surface area of the component-fixing region 231 or may be one half or more of the surface area of the component-fixing region 231. In addition, the surface area of the component-surrounding region 232 may be equal to or smaller than the surface area of the component-fixing region 231 or may be three-quarters or less of the surface area of the component-fixing region 231, for example.

The component-surrounding region 232 may also be defined as a region within a fixed distance from an end portion 512 of the electronic component 51. For example, the component-surrounding region 232 may be a region 5 mm or less from the end portion 512 of the electronic component 51 or may be a region 2 mm or less from the end portion 512.

[Stretching Control Mechanism]

The stretching control mechanism 30 is a mechanism that is provided on the wiring board 10 in order to control extension and contraction of the substrate 20. In the example illustrated in FIG. 2, the stretching control mechanism 30 has stretching control parts 31 and 32 that are positioned on the electronic component 51, on the wiring 52 or on the first surface 21 of the substrate 20, in the component region 23 and the wiring region 24. In the description hereinbelow, the stretching control part 31 positioned in the component region 23 is also referred to as the first stretching control part 31 and the stretching control part 32 positioned in the wiring region 24 is also referred to as the second stretching control part 32. In addition, when items common to the first stretching control part 31 and the second stretching control part 32 are described, the first stretching control part 31 and the second stretching control part 32 are also referred to as the "stretching control parts 31 and 32".

The stretching control parts 31 and 32 may have an elastic modulus greater than the first elastic modulus of the substrate 20. The elastic modulus of the stretching control parts 31 and 32 is, for example, 10 GPa or more and 500 GPa or less, and more preferably 1 GPa or more and 300 GPa or less. When the elastic modulus of the stretching control parts 31 and 32 is too low, control of the extension and contraction is sometimes difficult. Furthermore, when the elastic modulus of the stretching control parts 31 and 32 is too high, structural damage may occur in the stretching control parts 31 and 32 such as splitting and cracking when the substrate 20 extends or contracts. The elastic modulus of the stretching control parts 31 and 32 may be 1.1 times or more and 5000 times or less the first elastic modulus of the substrate 20 and is more preferably ten times or more and 3000 times or less the first elastic modulus of the substrate 20. By providing such stretching control parts 31 and 32 on the substrate 20, stretching of the section of the substrate 20 which overlaps the stretching control parts 31 and 32 can be suppressed. Thus, the substrate 20 can be divided into a section in which extension and contraction occur readily and a section in which extension and contraction does not readily occur. Accordingly, the periodicity and amplitude and the like of the meandering shape section, described subsequently, that appears in the substrate 20 can be controlled. The elastic modulus of the stretching control parts 31 and 32 is also referred to as the second elastic modulus in the following description. Note that "overlapping" means that two constituent elements overlap each other when viewed along the normal direction of the first surface 21 of the substrate 20.

The method for calculating the second elastic modulus of the stretching control parts 31 and 32 is suitably decided according to the form of the stretching control parts 31 and 32. For example, the method for calculating the second elastic modulus of the stretching control parts 31 and 32 may be the same as or may be different from the foregoing method for calculating the elastic modulus of the substrate 20. A method for calculating the elastic modulus of a support substrate 40, described subsequently, may also be the same as or may be different from the foregoing method for calculating the elastic modulus of the substrate 20. For example, as a method for calculating the elastic modulus of the stretching control parts 31 and 32 or the support substrate 40, a method in which tensile testing is carried out in conformance with ASTM D882 by using a sample of the stretching control parts 31 and 32 or the support substrate 40 may be adopted.

When the second elastic modulus of the stretching control parts 31 and 32 is greater than the first elastic modulus of the substrate 20, a metallic material can be used as the material constituting the stretching control parts 31 and 32. Possible examples of the metallic material include copper, aluminum, and stainless steel, and the like. Furthermore, as the material constituting the stretching control parts 31 and 32, materials that may be used include general thermoplastic elastomers, acrylic-based, urethane-based, epoxy-based, polyester-based, vinyl ether-based, polyene thiol-based or silicone-based oligomers and polymers, and the like. When the materials constituting the stretching control parts 31 and 32 are such resins, the stretching control parts 31 and 32 may also be transparent. Moreover, the stretching control parts 31 and 32 may have light blocking properties, such as the characteristic of blocking ultra-violet waves, for example. For example, the stretching control parts 31 and 32 may be black. The color of the stretching control parts 31 and 32 and the color of the substrate 20 may also be the same. The thickness of the stretching control parts 31 and 32 is, for example, 1 µm or more and 100 µm or less.

Alternatively, the second elastic modulus of the stretching control parts 31 and 32 may be equal to or smaller than the first elastic modulus of the substrate 20. The second elastic modulus of the stretching control parts 31 and 32 may, for example, be 10 MPa or less or may be 1 MPa or less. The second elastic modulus of the stretching control parts 31 and 32 may be one multiple or less of the first elastic modulus of the substrate 20 or may be a 0.8 multiple or less of the first elastic modulus. In this case, because the amplitude of the meandering shape section that appears in the substrate 20 is large in comparison with a case where the second elastic modulus of the stretching control parts 31 and 32 is greater than the first elastic modulus of the substrate 20, the stretchability of the wiring board 10 is then also large. Furthermore, even in a case where the second elastic modulus of the stretching control parts 31 and 32 is equal to or smaller than the first elastic modulus of the substrate 20, there is a difference in stretchability between the section, overlapping the stretching control parts 31 and 32, of the substrate 20 and the section, not overlapping the stretching control parts 31 and 32, of the substrate 20. That is, the substrate 20 can be divided into a section in which extension and contraction occur readily and a section in which extension and contraction does not readily occur. Accordingly, the periodicity and amplitude and the like of the meandering shape section that appears in the substrate 20 can be controlled.

General thermoplastic elastomers and thermoset elastomers can be used as the material constituting the stretching control parts 31 and 32 when the second elastic modulus of the stretching control parts 31 and 32 is equal to or smaller than the first elastic modulus of the substrate 20. Examples of the General thermoplastic elastomers and thermoset elastomers include styrene-based elastomers, acrylic-based elastomers, olefin-based elastomers, urethane-based elastomers, silicone rubbers, urethane rubber, fluorine rubber, nitrile rubber, polybutadiene, and polychloroprene, for example. The thickness of the stretching control parts 31 and 32 is, for example, 1 µm or more and 100 µm or less.

Note that the elastic modulus of the first stretching control part 31 positioned in the component-surrounding region 232 and the elastic modulus of the second stretching control part 32 positioned in the wiring region 24 may also be the same. In this case, because the first stretching control part 31 and the second stretching control part 32 can be formed simultaneously in the same production process, the process of forming the stretching control parts 31 and 32 is then straightforward. The elastic modulus of the first stretching control part 31 and the elastic modulus of the second stretching control part 32 may also differ. In this case, the elastic modulus of the first stretching control part 31 is preferably higher than the elastic modulus of the second stretching control part 32.

The material and thickness of the first stretching control part 31 and the material and thickness of the second stretching control part 32 may also be the same. In this case, the process of forming the stretching control parts 31 and 32 is then straightforward. The material and thickness of the first stretching control part 31 and the material and thickness of the second stretching control part 32 may also differ. In this case, the thickness of the first stretching control part 31 is preferably smaller than the thickness of the second stretching control part 32. This is because the electronic component 51 is generally thicker than the wiring 52. By making the thickness of the first stretching control part 31 smaller than the thickness of the second stretching control part 32, unevenness and a step between the component-surrounding region 232 and the wiring region 24 can be reduced. Thus, separation of elements caused by catching can be restrained from occurring. Furthermore, discomfort when a user wears an electronic device provided with the wiring board 10 can be reduced.

The characteristics of the stretching control parts 31 and 32 may also be represented by the bending rigidity instead of the elastic modulus. The second moment of area of the stretching control parts 31 and 32 is calculated on the basis of the cross-section when the stretching control parts 31 and 32 are cut according to a plane orthogonal to the stretching direction of the wiring board 10. The bending rigidity of the stretching control parts 31 and 32 may be a 1.1 multiple or more of the bending rigidity of the substrate 20 and is more preferably two times or more or, still more preferably, ten times or more the bending rigidity of the substrate 20.

Alternatively, the bending rigidity of the stretching control parts 31 and 32 may be equal to or smaller than the bending rigidity of the substrate 20. For example, the bending rigidity of the stretching control parts 31 and 32 may be a multiple of 1 or less of the bending rigidity of the substrate 20, or a multiple of 0.8 or less of the bending rigidity of the substrate 20.

The method for forming the stretching control parts 31 and 32 is suitably selected according to the material or the like. For example, a method in which a metal layer is formed by means of vapor deposition or sputtering, or the like, on the substrate 20 or on the support substrate 40 described subsequently, and the metal layer is then patterned by means of photolithography may be used. Furthermore, a method in which a resin layer such as an organic layer is formed by means of spin coating or another printing method over the whole surface of the substrate 20 or the support substrate 40, and the resin layer is then patterned by means of photolithography may be used. Further, a method in which the material of the stretching control parts 31 and 32 is printed in the form of a pattern on the substrate 20 or on the support substrate 40 by means of a general printing method, for example, may also be used. Among such methods, a printing method that enables low-cost manufacturing with favorable material efficiency is preferably used.

[Electronic Component]

The electronic component 51 has at least an electrode 511 that is connected to the wiring 52. In the example illustrated in FIG. 3, the electrode 511 is positioned on a side surface of the electronic component 51. The electronic component 51 may be an active component, may be a passive component, or may be a mechanical component.

Possible examples of the electronic component 51 include transistors, LSI (Large Scale Integration), MEMS (Micro Electro Mechanical Systems), relays, light-emitting devices such as LEDs, OLEDs, and LCDs, sensors, sound-emitting components such as buzzers, vibrating components that emit vibration, cooling/heating components such as Peltier devices or heating wires that control cooling/heat generation, resistors, capacitors, inductors, piezoelectric elements, switches, connectors, and the like. Among the foregoing examples of the electronic component 51, a sensor is preferably used. Possible examples of the sensors include, for example, temperature sensors, pressure sensors, light sensors, photoelectric sensors, proximity sensors, shear force sensors, biometric sensors, laser sensors, microwave sensors, humidity sensors, distortion sensors, gyro sensors, acceleration sensors, displacement sensors, magnetic sensors, gas sensors, GPS sensors, ultrasonic sensors, odor sensors, brain wave sensors, current sensors, oscillation sensors, pulse wave sensors, electrocardiogram sensors, and luminosity sensors. Among these sensors, a biometric sensor is particularly preferable. A biometric sensor is capable of measuring biological information such as heart rate, pulse, electrocardiogram, blood pressure, body temperature, blood oxygen concentration, and so forth.

[Wiring]

The wiring 52 is an electrically conductive member that is connected to the electrodes of the electronic component 51. For example, as illustrated in FIG. 1, one end and the other end of the wiring 52 are connected to the electrodes of two electronic components 51, respectively. As illustrated in FIG. 1, a plurality of wirings 52 may be provided between the two electronic components 51.

As will be described subsequently, the wiring 52 is provided on the substrate 20 which is in an extended state due to tensile stress. In this case, when the tensile stress is removed from the substrate 20 and the substrate 20 contracts, the wiring 52 is deformed in a meandering shape so as to have a meandering shape section 57, as illustrated in FIG. 3.

The meandering shape section 57 includes peaks and valleys in the normal direction of the first surface 21 of the substrate 20. In FIG. 3, a reference sign 53 denotes a peak that appears in a front face of the wiring 52, and a reference sign 54 denotes a peak that appears in a back face of the wiring 52. Furthermore, a reference sign 55 denotes a valley that appears in the front face of the wiring 52, and a reference sign 56 denotes a valley that appears in the back face of the wiring 52. The front face is one surface of the wiring 52 far from the substrate 20, while the back face is the other surface of the wiring 52 close to the substrate 20. Furthermore, in FIG. 3, reference signs 26 and 27 denote peak and valley that appear in the first surface 21 of the substrate 20 in the wiring region 24. As a result of the deformation of the substrate 20 such that peaks 26 and valleys 27 appear in the first surface 21, the wiring 52 is deformed in a meandering shape so as to have the meandering shape section 57. The peaks 26 of the first surface 21 of the substrate 20 correspond to the peaks 53 and 54 of the meandering shape section 57 of the wiring 52, and the valleys 27 of the first surface 21 of the substrate 20 correspond to the valleys 55 and 56 of the meandering shape section 57 of the wiring 52.

In the description hereinbelow, the direction in which the peaks and valleys of the meandering shape section 57 repeatedly appear will also be referred as the first direction D1. In the example illustrated in FIG. 3, the wiring 52 extends parallel to the first direction D1. The substrate 20 also has a rectangular shape that includes long sides parallel to the first direction D1. Although not illustrated, the wiring board 10 may include wiring 52 that extends in a direction different from the first direction D1. Furthermore, although not illustrated, in a case where the substrate 20 has a rectangular shape, the direction of extension of the long sides may differ from the first direction D1. Although an example in which the pluralities of peaks and valleys of the meandering shape section 57 are aligned with a constant periodicity is illustrated in FIG. 3, the present embodiment is not limited to or by such an example. Although not illustrated, the pluralities of peaks and valleys of the meandering shape section 57 may also be aligned irregularly along the first direction D1. For example, the interval between two peaks that are adjacent in the first direction D1 need not be constant.

In FIG. 3, a reference sign S1 denotes the amplitude, in the normal direction of the substrate 20, of the meandering shape section 57 in the front face of the wiring 52. The amplitude S1 is, for example, 1 μm or more and, more preferably, 10 μm or more. By setting the amplitude S1 at 10 μm or more, the wiring 52 readily deforms so as to accommodate the extension of the substrate 20. The amplitude S1 may also be 500 μm or less, for example.

The amplitude S1 is calculated by measuring the distances, in the normal direction of the first surface 21, between adjacent peaks 53 and valleys 55 across a certain range in the longitudinal direction of the wiring 52 and finding the average of such distances, for example. The "certain range in the longitudinal direction of the wiring 52" is 10 mm, for example. As the measuring instrument for measuring the distances between the adjacent peaks 53 and valleys 55, a non-contact-type measuring instrument that uses a laser microscope or the like, or a contact-type measuring instrument may be used. Furthermore, the distances between adjacent peaks 53 and valleys 55 may also be measured on the basis of images such as cross-section photographs. The method for calculating the amplitudes S2, S3, and S4, described subsequently, is also the same.

In FIG. 3, a reference sign S2 denotes the amplitude of the meandering shape section 57 at the back face of the wiring 52. Like amplitude S1, amplitude S2 is, for example, 1 μm or more and, more preferably, 10 μm or more. The amplitude S2 may also be 500 μm or less, for example. Furthermore, in FIG. 3, a reference sign S3 denotes the amplitude of peaks 26 and valleys 27 that appear in the first surface 21 of the substrate 20 in a section, overlapping the meandering shape section 57, of the wiring region 24. As illustrated in FIG. 3, in a case where the back face of the wiring 52 is positioned on the first surface 21 of the substrate 20, the amplitude S3 of the peaks 26 and valleys 27 of the first surface 21 of the substrate 20 is equal to the amplitude S2 of the meandering shape section 57 at the back face of the wiring 52.

Figure 4A:
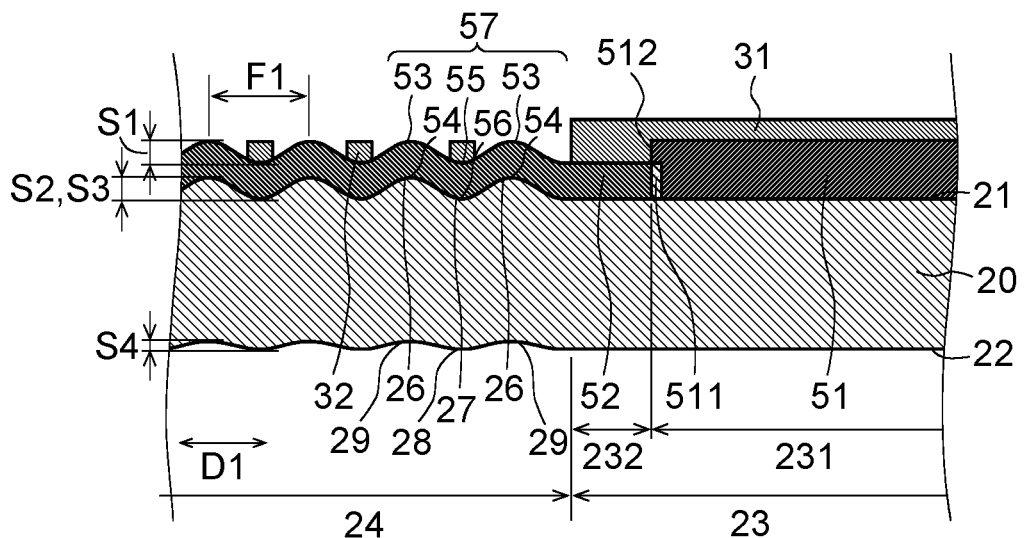
FIG. 4A is a cross-sectional view illustrating an example of a meandering shape section that appears in a substrate.

Although an example in which the meandering shape section does not appear in the second surface 22 of the substrate 20 is illustrated in FIG. 3, the present embodiment is not limited to or by such an example. As illustrated in FIG. 4A, the meandering shape section may also appear in the second surface 22 of the substrate 20. In FIG. 4A, reference signs 28 and 29 denote peaks and valleys that appear in the second surface 22 of the substrate 20 in the wiring region 24. In the example illustrated in FIG. 4A, the peak 28 of the second surface 22 appears in a position overlapping the valley 27 of the first surface 21, and the valleys 29 of the second surface 22 appear in positions overlapping the peaks 26 of the first surface 21. Although not illustrated, the positions in which the peaks 28 and the valleys 29 of the second surface 22 of the substrate 20 need not overlap the valleys 27 and the peaks 26 of the first surface 21. Furthermore, the quantity or periodicity of the peaks 28 and the valleys 29 of the second surface 22 of the substrate 20 may be the same as or different from the quantity or periodicity of the peaks 26 and valleys 27 of the first surface 21. For example, the periodicity of the peaks 28 and valleys 29 of the second surface 22 of the substrate 20 may be greater than the periodicity of the peaks 26 and valleys 27 of the first surface 21. In this case, the periodicity of the peaks 28 and valleys 29 of the second surface 22 of the substrate 20 may be a 1.1 multiple or more of the periodicity of the peaks 26 and valleys 27 of the first surface 21 or may be a 1.2 multiple or more thereof, a 1.5 multiple or more thereof, or a 2.0 multiple or more thereof. Note that "the periodicity of the peaks 28 and valleys 29 of the second surface 22 of the substrate 20 may be greater than the periodicity of the peaks 26 and valleys 27 of the first surface 21" is a concept that includes cases where peaks and valleys do not appear in the second surface 22 of the substrate 20.

In FIG. 4A, a reference sign S4 denotes the amplitude of the peak 28 and valleys 29 that appear in the second surface 22 of the substrate 20 in a section, overlapping the meandering shape section 57, of the wiring region 24. The amplitude S4 of the second surface 22 may be the same as or different from the amplitude S3 of the first surface 21. For example, the amplitude S4 of the second surface 22 may be smaller than the amplitude S3 of the first surface 21. For example, the amplitude S4 of the second surface 22 may be a 0.9 multiple or less of the amplitude S3 of the first surface 21, or may be a 0.8 multiple or less thereof, or a 0.6 multiple or less thereof. Furthermore, the amplitude S4 of the second surface 22 may be a 0.1 multiple or more of the amplitude S3 of the first surface 21, or may be a 0.2 multiple or more thereof. In cases where the thickness of the substrate 20 is small, the ratio of the amplitude S4 of the second surface 22 to the amplitude S3 of the first surface 21 easily becomes large. Note that "the amplitude of the peaks 28 and valleys 29 of the second surface 22 of the substrate 20 is smaller than the amplitude of the peaks 26 and valleys 27 of the first surface 21" is a concept that includes cases where the peaks and valleys do not appear in the second surface 22 of the substrate 20.

Figure 4B:
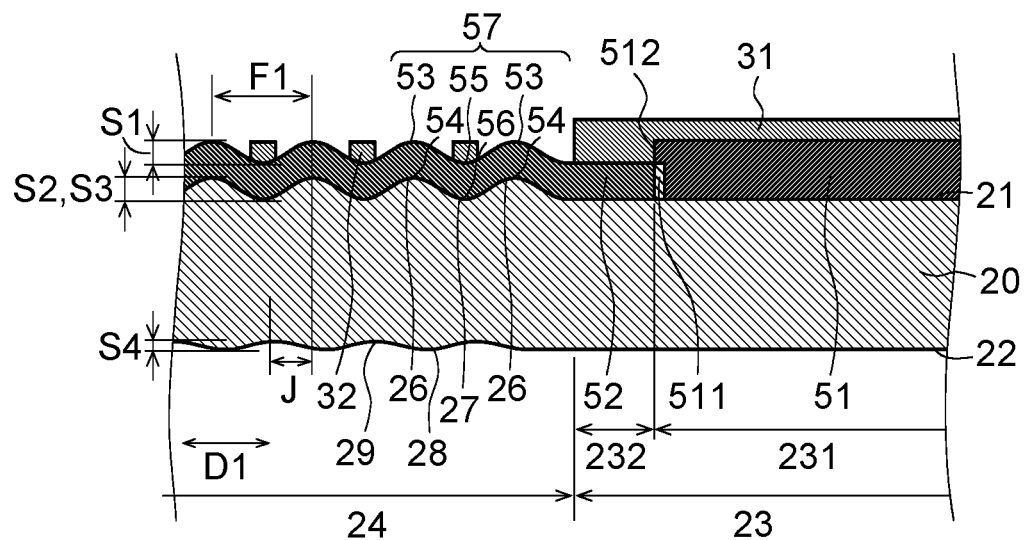
FIG. 4B is a cross-sectional view illustrating an example of the meandering shape section that appears in the substrate.

Furthermore, an example in which the positions of the peaks 28 and valleys 29 of the second surface 22 match the positions of the valleys 27 and peaks 26 of the first surface 21 is illustrated in FIG. 4A, but the present embodiment is not limited to or by such an example. As illustrated in FIG. 4B, the positions of the peaks 28 and valleys 29 of the second surface 22 may be displaced by J from the positions of the valleys 27 and peaks 26 of the first surface 21. The displacement amount J may, for example, be 0.1×F1 or more, or 0.2×F1 or more.

As the material of the wiring 52, a material that can accommodate the extension or the contraction of the substrate 20 by utilizing the elimination and generation of the meandering shape section 57 may be used. The material of the wiring 52 may be stretchable per se or may not be stretchable per se.

Possible materials which are not stretchable per se and may be used for the wiring 52 include, for example, metals such as gold, silver, copper, aluminum, platinum, or chromium and alloys containing such metals. When the material of the wiring 52 is not stretchable per se, a metal layer may be used as the wiring 52.

When the material used for the wiring 52 is stretchable, the stretchability of the material is the same as the stretchability of the substrate 20, for example. Possible materials which are stretchable per se and may be used for the wiring 52 include, for example, conductive compositions that contain conductive particles and elastomers. Conductive particles may be used as the wiring and possible examples include particles of gold, silver, copper, nickel, palladium, platinum, and carbon, and the like. Of these, silver particles are preferably used.

The wiring 52 is preferably provided with a structure that is durable to deformation. For example, the wiring 52 has a base raw material and a plurality of conductive particles dispersed within the base raw material. In this case, by using a deformable material such as a resin as the base raw material, the wiring 52 is also capable of deforming according to the extension and contraction of the substrate 20. Furthermore, by configuring the distribution and shape of the conductive particles such that contact between the plurality of conductive particles is maintained even when deformation occurs, the conductive properties of the wiring 52 can be maintained.

General thermoplastic elastomers and thermoset elastomers can be used as the material constituting the base raw material of the wiring 52, and examples that can be used include styrene-based elastomers, acrylic-based elastomers, olefin-based elastomers, urethane-based elastomers, silicone rubbers, urethane rubber, fluorine rubber, nitrile rubber, polybutadiene, and polychloroprene. Of these, resins and rubbers containing urethane-based and silicone-based structures are preferably used from the perspective of stretchability and durability, and so forth. In addition, particles of silver, copper, gold, nickel, palladium, platinum, and carbon, and the like, for example, can be used as the material constituting the conductive particles of the wiring 52. Of these, silver particles are preferably used.

The thickness of the wiring 52 may be a thickness enabling tolerance to the extension and contraction of the substrate 20 and is suitably selected according to the material of the wiring 52, or the like.

For example, when the material of the wiring 52 is not stretchable, the thickness of the wiring 52 can be set in a range of 25 nm or more and 50 μm or less, preferably in a range of 50 nm or more and 10 μm or less, and more preferably in a range of 100 nm or more and 5 μm or less.

Furthermore, when the material of the wiring 52 is stretchable, the thickness of the wiring 52 can be set in a range of 5 μm or more and 60 μm or less, preferably in a range of 10 μm or more and 50 μm or less, and more preferably in a range of 20 μm or more and 40 μm or less.

The width of the wiring 52 is 50 μm or more and 10 mm or less, for example.

The method for forming the wiring 52 is suitably selected according to the material or the like. For example, a method in which a metal layer is formed by means of vapor deposition or sputtering, or the like, on the substrate 20 or on the support substrate 40 described subsequently, and the metal layer is then patterned by means of photolithography may be used. Furthermore, when the material of the wiring 52 is stretchable per se, a method in which the foregoing conductive composition containing conductive particles and an elastomer is printed in the form of a pattern on the substrate 20 or on the support substrate 40 by means of a general printing method, for example, may be used. Among such methods, a printing method that enables low-cost manufacturing with favorable material efficiency is preferably used.

The benefit afforded by the meandering shape section 57 being formed on the wiring 52 will now be described. As mentioned earlier, the substrate 20 has an elastic modulus of 10 MPa or less. Hence, when tensile stress is applied to the wiring board 10, the substrate 20 can be extended through elastic deformation. Here, conversely, when the wiring 52 is also similarly extended through elastic deformation, because the overall length of the wiring 52 increases and the cross-sectional surface area of the wiring 52 is reduced, the resistance value of the wiring 52 increases. Damage such as cracks in the wiring 52 due to the elastic deformation of the wiring 52 are also conceivable.

On the other hand, in the present embodiment, the wiring 52 has the meandering shape section 57. Hence, when the substrate 20 extends, because the wiring 52 deforms such that the undulations in the meandering shape section 57 are reduced, that is, as a result of the meandering shape being eliminated, the wiring 52 is capable of accommodating the extension of the substrate 20. Therefore, an increase in the overall length of the wiring 52 as well as a reduction in the cross-sectional surface area of the wiring 52 as the substrate 20 extends can be suppressed. An increase in the resistance value of the wiring 52 due to the extension of the wiring board 10 can thus be suppressed. In addition, the occurrence of damage such as cracks in the wiring 52 can be suppressed.

There are sometimes inconsistencies in the height of the peaks 53 and 54 and the depth of the valleys 55 and 56 of the wiring 52 according to position, due to variation in the thickness of the substrate 20 or a difference in the distribution density of the wiring 52 provided on the substrate 20, and so forth. When the height of the peaks 53 and 54 and the depth of the valleys 55 and 56 varies according to position, the degree of curvature and bending generated in the wiring 52 is then locally significant, and damage to the wiring 52 is conceivable.

Here, according to the present embodiment, by providing the stretching control mechanism 30 to the substrate 20, the periodicity, amplitude, and the like, of the meandering shape section 57 can be controlled. Hence, the occurrence of significant localized curvature and bending in the wiring 52 can be suppressed. As a result, damage to the wiring 52 can be suppressed.

The stretching control parts 31 and 32 of the stretching control mechanism 30 will be described in detail hereinbelow with reference to FIGS. 3 to 7. First, the first stretching control part 31 positioned in the component region 23 will be described.

The first stretching control part 31 is positioned in at least the component-surrounding region 232. Furthermore, as illustrated in FIG. 3, the first stretching control part 31 at least spreads to the border between the component-surrounding region 232 and the component-fixing region 231. In the example illustrated in FIG. 3, the first stretching control part 31 spreads to the component-fixing region 231 so as to cross the border between the component-surrounding region 232 and component-fixing region 231. For example, the first stretching control part 31 may spread across the whole width of the component-fixing region 231.

Note that a member for suppressing deformation in the component-fixing region 231, which is separate from the first stretching control part 31, may be provided in the component-fixing region 231. For example, the wiring board 10 may be further provided with a reinforcing member that at least overlaps an electronic component 51. An example in which the wiring board 10 is provided with a reinforcing member will be described subsequently as a modification example.

Figure 5:
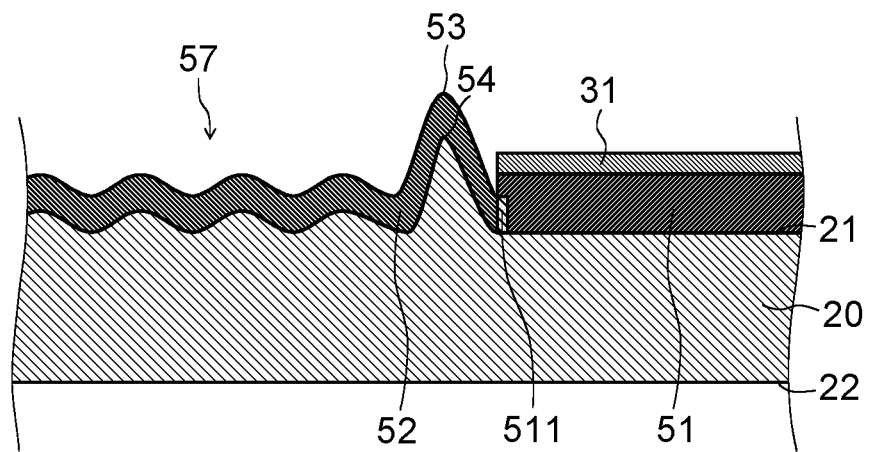
FIG. 5 is a cross-sectional view illustrating an enlargement of a wiring board according to a comparative embodiment.

The benefit of providing the first stretching control part 31 in the component-surrounding region 232 will be described on the basis of a comparison with the wiring 52 according to the comparative embodiment illustrated in FIG. 5. Although the first stretching control part 31 is provided in the component-fixing region 231 in the comparative embodiment illustrated in FIG. 5, a stretching control part is not provided in the component-surrounding region 232 or the wiring region 24. In this case, the height of the peaks 53 of the meandering shape section 57 is sometimes locally large due to inconsistencies in the thickness of the substrate 20 or a difference in the distribution density of the wiring 52 provided on the substrate 20, and so forth. For example, as illustrated in FIG. 5, there may be a large peak 53 generated in the wiring 52 in the vicinity of the electrode 511 of the electronic component 51. In this case, a large stress is applied to an electrical junction between the electrode 511 of the electronic component 51 and the wiring 52, and damage to the electrical junction is conceivable.

On the other hand, in the present embodiment, as mentioned earlier, the first stretching control part 31 is provided in the component-surrounding region 232, and the first stretching control part 31 spreads to the border between the component-surrounding region 232 and the component-fixing region 231. Hence, the occurrence of a large peak 53 in the wiring 52 in the vicinity of the electrode 511 of the electronic component 51 can be suppressed. Thus, damage to the electrical junction between the electrode 511 of the electronic component 51 and the wiring 52 can be suppressed.

Figure 6:
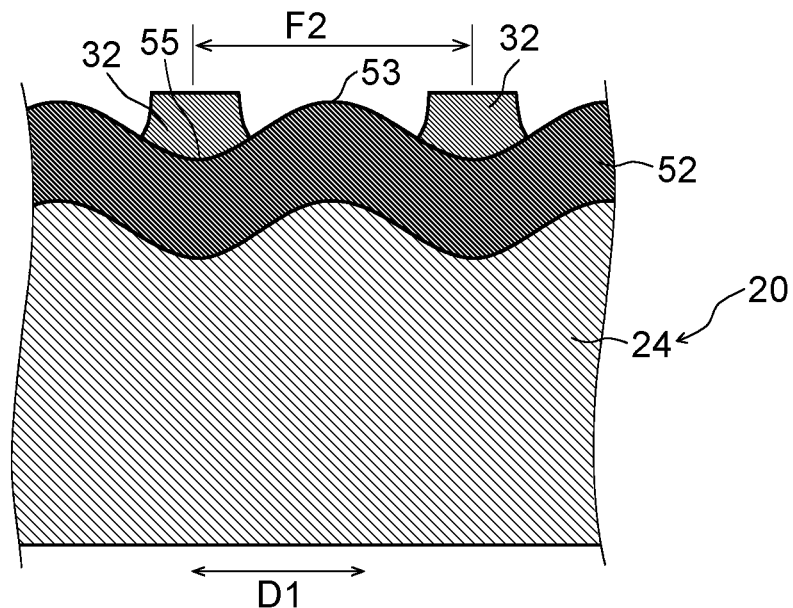
FIG. 6 is a cross-sectional view illustrating an example of a stretching control mechanism positioned in a wiring region.

The second stretching control part 32 positioned in the wiring region 24 will be described next. FIG. 6 is a cross-sectional view illustrating an enlargement of the second stretching control parts 32. As illustrated in FIGS. 1, 2, 3, and 6, in the wiring region 24, a plurality of second stretching control parts 32 are aligned with a periodicity F2 along the first direction D1 in which the peaks 53 and valleys 55 repeatedly appear in the planar direction of the first surface 21 of the substrate 20. Thus, a section in which extension and contraction occur readily and a section in which extension and contraction does not readily occur are repeated, with the periodicity F2 along the direction of extension of the wiring 52, in the substrate 20. In this case, when the substrate 20 is relaxed, the meandering shape section 57, which has a periodicity F1 that corresponds to the periodicity F2 of the second stretching control parts 32, readily occurs in the wiring 52. That is, the periodicity F1 of the meandering shape section 57 can be controlled by means of the second stretching control parts 32.

Figure 7:
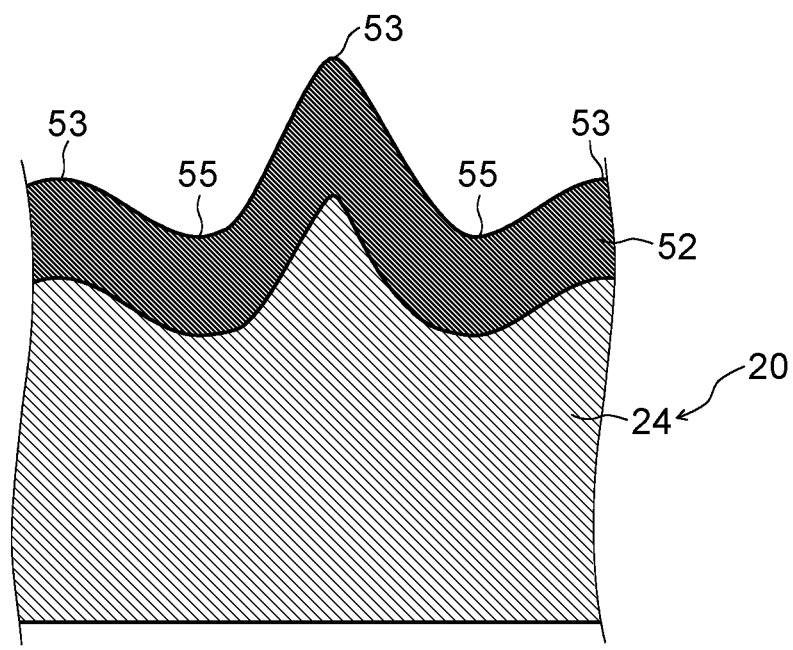
FIG. 7 is a cross-sectional view illustrating an enlargement of the wiring board according to the comparative embodiment.

The benefit of controlling the periodicity F1 of the meandering shape section 57 will be described hereinbelow on the basis of a comparison with the wiring 52 according to the comparative embodiment illustrated in FIG. 7. In the comparative embodiment illustrated in FIG. 7, the second stretching control parts 32 are not provided in the wiring region 24. In this case, the periodicity of the meandering shape section 57 is locally large and, consequently, the height of the peaks 53 of the meandering shape section 57 is then sometimes locally large. As a result, significant stress acts on the wiring 52 in the peaks 53 or the valleys 55 adjacent to the peaks 53, and damage to the wiring 52 is conceivable.

On the other hand, according to the present embodiment, the periodicity F1 of the meandering shape section 57 that appears in the wiring 52 can be controlled by aligning the plurality of second stretching control parts 32 with the periodicity F2 along the first direction D1 in which the meandering shape section 57 appears. It is thus possible to restrain the periodicity F1 of the meandering shape section 57 from being disturbed and the height of the peaks 53 of the meandering shape section 57 from then being locally large. It is accordingly possible to restrain significant stress from acting on the wiring 52 and damage to the wiring 52.

Note that the periodicity F1 of the meandering shape section 57 is the average value of the intervals between the plurality of peaks 53 of the meandering shape section 57 in the first direction D1. Furthermore, the periodicity F2 of the second stretching control parts 32 is the average value of the intervals between the plurality of second stretching control parts 32 positioned in the wiring region 24, in the first direction D1. In the description hereinbelow, the periodicity F1 of the meandering shape section 57 will also be referred to as the first periodicity F1 and the periodicity F2 of the second stretching control parts 32 will also be referred to as the second periodicity F2.

In a case where control of the first periodicity F1 of the meandering shape section 57 by the second stretching control parts 32 is suitably achieved, the second stretching control parts 32 are aligned with the second periodicity F2 that corresponds to the first periodicity F1 of the meandering shape section 57. In the example illustrated in FIG. 6, the second periodicity F2 of the second stretching control parts 32 is the same as the first periodicity F1 of the meandering shape section 57. In this case, the second stretching control parts 32 are positioned in a section of a specified phase of the meandering shape section 57 and are positioned in the valleys 55 of the meandering shape section 57, for example.

Note that, depending on the first elastic modulus and the thickness of the substrate 20, the first periodicity F1 of the meandering shape section 57 that appears in the wiring 52 provided on the substrate 20 sometimes does not match the second periodicity F2 of the plurality of second stretching control parts 32 aligned in the wiring region 24. For example, the second periodicity F2 of the second stretching control parts 32 is sometimes greater than the first periodicity F1 of the meandering shape section 57 and sometimes less than the first periodicity F1 of the meandering shape section 57. In either case, in the present embodiment, a section of the wiring region 24 in which the second stretching control part 32 is provided easily becomes a section of a specified phase of the meandering shape section 57. For example, a section of the substrate 20 in which the second stretching control part 32 is provided may be the peak 53 or the valley 55 of the meandering shape section 57. Hence, because disturbance of the first periodicity F1 of the meandering shape section 57 can be suppressed, it is possible to restrain the height of the peaks 53 of the meandering shape section 57 from being locally large.

The plurality of second stretching control parts 32 positioned in the wiring region 24 are able to fulfill the role of controlling the first periodicity F1 of the meandering shape section 57 that occurs in the wiring 52. The second periodicity F2 of the second stretching control parts 32 is, for example, an m multiple or 1/n of the first periodicity F1 of the meandering shape section 57. Here, m and n is a positive integer. m is preferably 3 or less, and is 3, 2, or 1, for example. Furthermore, n is preferably 4 or less, and is 4, 3, 2, or 1, for example. The second periodicity F2 of the second stretching control parts 32 is 5 µm or more and 10 mm or less, for example. Note that the relationship between the second periodicity F2 of the second stretching control parts 32 and the first periodicity F1 of the meandering shape section 57 need not be strictly an integer multiple relationship or a relationship corresponding to a fraction of an integer. For example, F2 may be a multiple of 0.95 or more and 1.05 or less of F1. A numerical value range such as a multiple of 0.95 or more and 1.05 or less means that, in a large section of the meandering shape section 57, one second stretching control part 32 exists per period of the meandering shape section 57, but that, in one section of the meandering shape section 57, two or more second stretching control parts 32 exist per period of the meandering shape section 57 or a second stretching control part 32 does not exist therein.

Although not illustrated, the wiring board 10 may further include an adhesive layer positioned on the surface, on the opposite side from the substrate 20, of the stretching control parts 31 and 32. The adhesive layer is provided in order to stick the wiring board 10 to an object such as a person's body. The adhesive layer may be positioned on the surface, on the opposite side from the substrate 20, of the wiring 52 or on the surface, on the opposite side from the substrate 20, of the electronic component 51, and so forth.

As the material constituting the adhesive layer, a general adhesive can be used and is suitably selected according to the application of the wiring board 10, and so forth. Possible examples include an acrylic-based adhesive, a silicone-based adhesive, a urethane-based adhesive, or a rubber bonded adhesive.

The thickness of the adhesive layer is suitably selected according to the application of the stretchable circuit substrate, and so forth, to enable the adhesive layer to stretch and enable the wiring board 10 to be stuck to an object. The thickness of the adhesive layer is in a range of 10 µm or more and 100 µm or less, for example.

(Method for Manufacturing Wiring Board)

A method for manufacturing the wiring board 10 will be described hereinbelow with reference to FIGS. 8A to 8D.

Figure 8A:
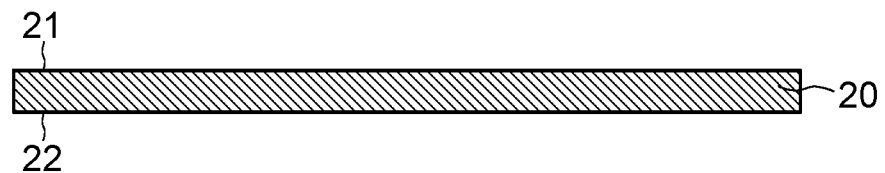
FIG. 8A is a diagram to illustrate a method for manufacturing the wiring board illustrated in FIG. 2.
Figure 8B:
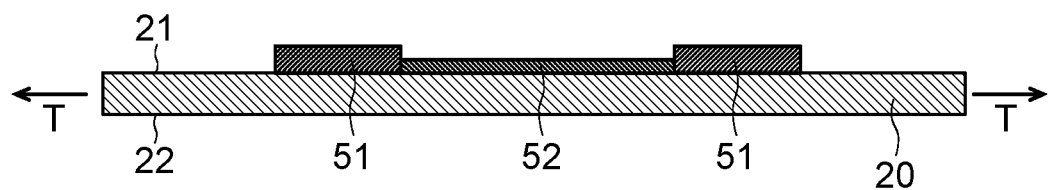
FIG. 8B is a diagram to illustrate a method for manufacturing the wiring board illustrated in FIG. 2.
Figure 8C:
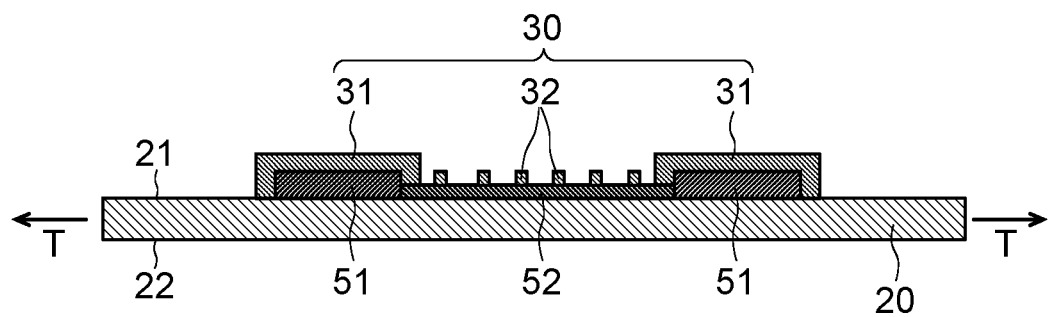
FIG. 8C is a diagram to illustrate a method for manufacturing the wiring board illustrated in FIG. 2.
Figure 8D:
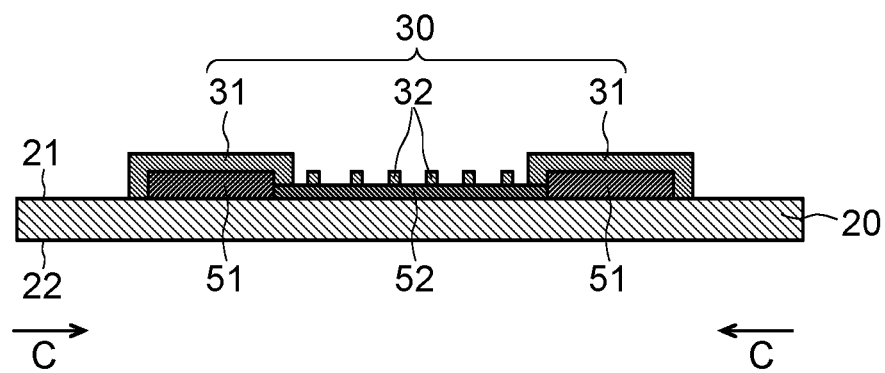
FIG. 8D is a diagram to illustrate a method for manufacturing the wiring board illustrated in FIG. 2.

First, as illustrated in FIG. 8A, a substrate preparation step in which a stretchable substrate 20 is prepared is carried out. Next, as illustrated in FIG. 8B, a first step of extending the substrate 20 by applying a tensile stress T to the substrate 20 is implemented. Thereafter, as illustrated in FIG. 8C, a second step of providing an electronic component 51 and wiring 52 to a first surface 21 of the substrate 20, which is in the state of being extended by the tensile stress T, is carried out. Further, a stretching control mechanism 30 having a first stretching control part 31 and a second stretching control part 32 is provided on the first surface 21 side of the substrate 20, which is in the state of being extended by the tensile stress T.

Thereafter, a third step in which the tensile stress T is removed from the substrate 20 is carried out. Thus, as indicated by the arrows C in FIG. 8D, the substrate 20 contracts and deformation also occurs in the wiring 52 provided to the substrate 20.

Here, in the present embodiment, the first stretching control part 31, which at least spreads to the border between a component-surrounding region 232 and a component-fixing region 231 is provided in the component-surrounding region 232 of a component region 23 of the substrate 20. Hence, the occurrence of a large peak 53 in the wiring 52 in the vicinity of the electrode 511 of the electronic component 51 can be suppressed. Thus, damage to the electrical junction between the electrode 511 of the electronic component 51 and the wiring 52 can be suppressed.

Furthermore, in the present embodiment, a plurality of second stretching control parts 32 aligned along the direction of extension of the wiring 52 are provided in the wiring region 24 of the substrate 20. It is thus possible to restrain the periodicity of the meandering shape section 57 from being disturbed and the height of the peaks 53 of the meandering shape section 57 from then being locally large. It is accordingly possible to restrain significant stress from acting on the wiring 52 and damage to the wiring 52.

Possible applications of the wiring board 10 include the healthcare field, the medical care field, the nursing field, the electronics field, the sports or fitness field, the beauty field, the mobility field, the animal or pets field, the amusement field, the fashion or apparel field, the security field, the military field, the distribution field, the education field, the building materials, furniture, decorating field, the environmental energy field, the forestry or fisheries field, and the robotics field, and so forth. For example, a product that is attached to a body part such as a person's arm is constituted by using the wiring board 10 according to the present embodiment. Because the wiring board 10 is capable of extending, by attaching the wiring board 10 to the body in an extended state, for example, the wiring board 10 may be placed in closer contact with a body part. Hence, a favorable wearing sensation can be achieved. In addition, because it is possible to suppress an increase of the resistance value of the wiring 52 when the wiring board 10 is extended, favorable electrical characteristics for the wiring board 10 can be achieved. Additionally, because the wiring board 10 is capable of extending, the wiring board 10 is not limited to being fitted to a living body such as a person's body and can be installed and incorporated by fitting to a curved surface or a three-dimensional shape. Possible examples of such products include a vitals sensor, a mask, a hearing aid, a toothbrush, an adhesive plaster, a compress, a contact lens, a prosthetic arm, prosthetic leg, a glass eye, a catheter, a gauze, a medicine pack, a bandage, a disposable bioelectrode, a diaper, consumer electronics, sportswear, a wristband, a headband, a glove, a swimsuit, a jockstrap, a ball, a racket, an osmotic medicinal beauty mask, an electrostimulation diet product, a heating pack, automobile upholstery, a seat, an instrument panel, a stroller, a drone, a wheelchair, a tire, a collar, a lead, a haptic device, a luncheon mat, a hat, clothes, glasses, shoes, insoles, socks, stockings, innerwear, a muffler, earmuffs, a bag, an accessory, a ring, artificial nails, a watch, a personal ID recognition device, a helmet, a package, an IC tag, a PET bottle, stationery, a book, a carpet, a sofa, bedding, lighting, a door knob, a vase, a bed, a mattress, a cushion, a wireless power antenna, a battery, a plastic greenhouse, a robotic hand, and robotic armor.

Note that a variety of modifications may be applied to the foregoing embodiment. Modification examples will be described hereinbelow with reference to the drawings where necessary. In the description hereinbelow and the drawings used in the description hereinbelow, it is assumed that the same reference signs as the reference signs used for corresponding parts in the foregoing embodiment are used for those parts that may be configured in the same way as the foregoing embodiment, and repetitious descriptions are omitted. Furthermore, in cases where it is obvious that the action and effect obtained in the foregoing embodiment is also obtained in the modification example, a description thereof is also omitted.

(Modification Example of the First Stretching Control Part Positioned in the Component-Surrounding Region)

Several modification examples of the first stretching control part 31 positioned in the component-surrounding region 232 will be described hereinbelow. First, the modification examples of the cross-section structure of the first stretching control part 31 will each be described with reference to FIGS. 9 to 15.

First Modification Example of Cross-Section Structure

Figure 9:
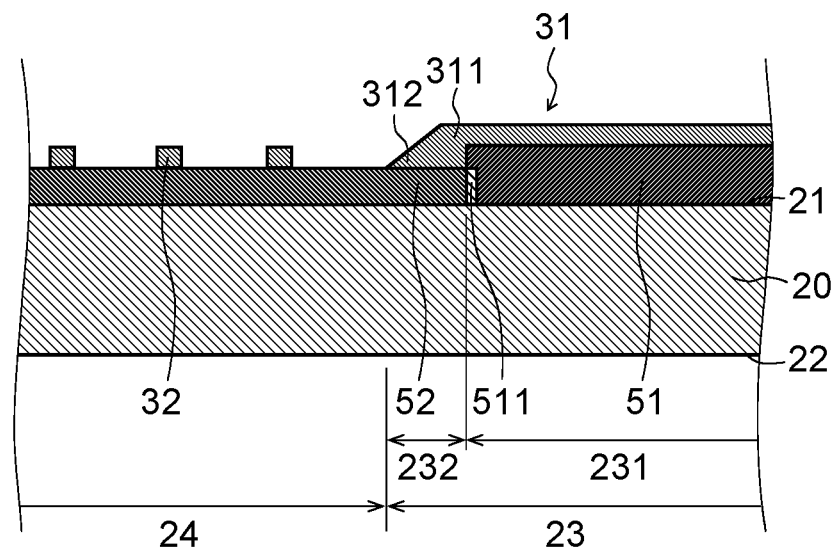
FIG. 9 is a cross-sectional view illustrating a modification example of the stretching control mechanism positioned in a component region.
Figure 10:
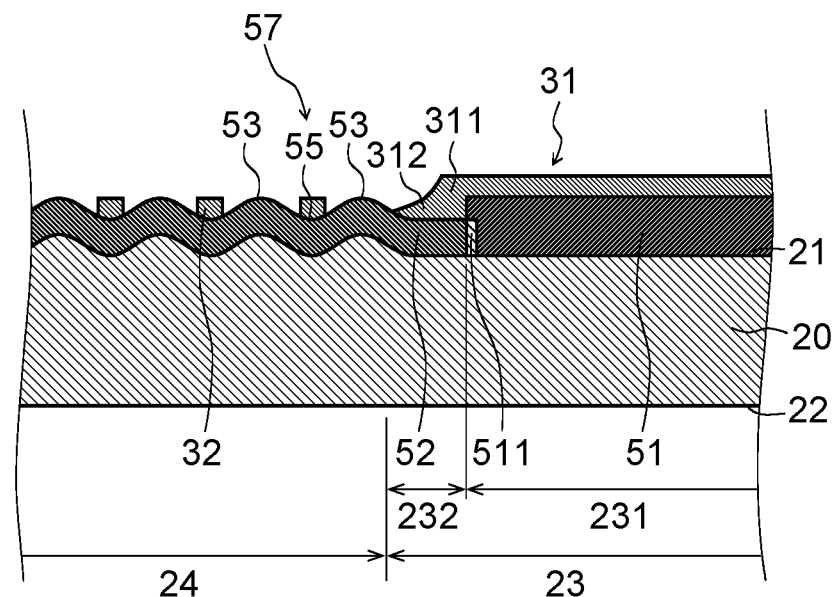
FIG. 10 is a cross-sectional view illustrating an aspect in which the wiring board illustrated in FIG. 9 is relaxed.

FIG. 9 is a diagram illustrating an enlargement of the wiring board 10 according to the modification example in a state where tensile stress is being applied to the substrate 20. Further, FIG. 10 is a cross-sectional view illustrating an aspect in which the wiring board 10 illustrated in FIG. 9 is relaxed. In the foregoing embodiment, the example in which the first stretching control part 31 positioned in the component-surrounding region 232 has uniform deformability is illustrated. For example, the example in which the first stretching control part 31 has a uniform thickness is illustrated. However, the present disclosure is not limited to or by this example, rather, the first stretching control part 31 may be configured to exhibit different deformability according to position. For example, the first stretching control part 31 may include a first section 311, and a second section 312 with a higher deformability than the first section 311. As illustrated in FIG. 9, the second section 312 is positioned closer to the wiring region 24 than the first section 311.

The thickness of the second section 312 of the first stretching control part 31 is smaller than the thickness of the first section 311. Furthermore, the thickness of the second section 312 may be at least partially reduced toward the wiring region 24. In the example illustrated in FIG. 9, the thickness of the second section 312 is monotonically reduced as it goes from the first section 311 toward the wiring region 24. In this case, the deformability of the component-surrounding region 232 of the substrate 20 increases toward the wiring region 24. Therefore, an abrupt change in the deformability of the substrate 20 at or in the vicinity of the border between the component region 23 and the wiring region 24 can be suppressed. Hence, when the wiring board 10 is relaxed, deformation conforming to the meandering shape section 57 that appears in the wiring region 24 can be made to occur in the substrate 20 and wiring 52 positioned in the component-surrounding region 232, as illustrated in FIG. 10. Thus, damage to the wiring 52 at or in the vicinity of the border between the component region 23 and the wiring region 24 can be suppressed.

Second Modification Example of Cross-Section Structure

Figure 11:
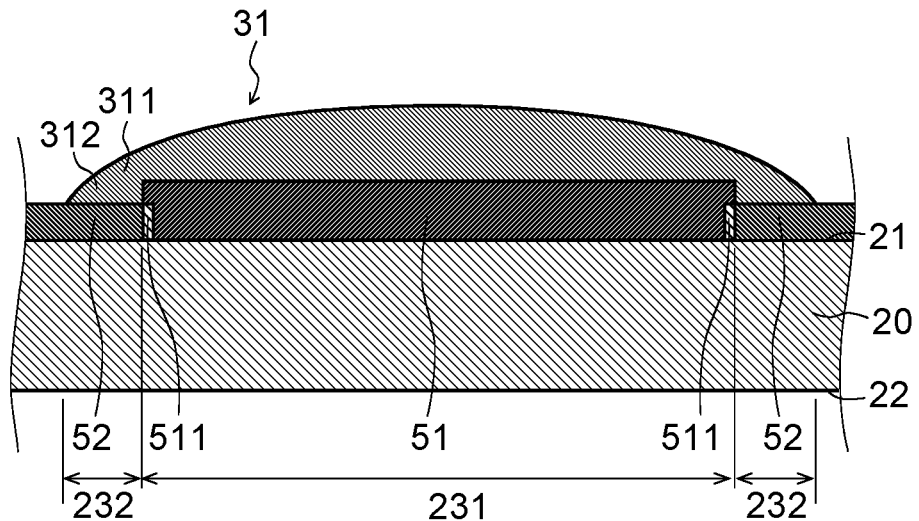
FIG. 11 is a cross-sectional view illustrating a modification example of the stretching control mechanism positioned in the component region.

As illustrated in FIG. 11, the first stretching control part 31 may have a hemispherical shape that covers the whole width of the electronic component 51 positioned in the component-fixing region 231. In this case, the thickness of the second section 312 positioned closer to the wiring region 24 than the first section 311, of the first stretching control part 31, is reduced toward the wiring region 24. Hence, the deformability of the component-surrounding region 232 of the substrate 20 also increases toward the wiring region 24 in this modification example. Therefore, an abrupt change in the deformability of the substrate 20 at or in the vicinity of the border between the component region 23 and the wiring region 24 can be suppressed. Thus, damage to the wiring 52 at or in the vicinity of the border between the component region 23 and the wiring region 24 can be suppressed.

Third Modification Example of Cross Section Structure

Figure 12:
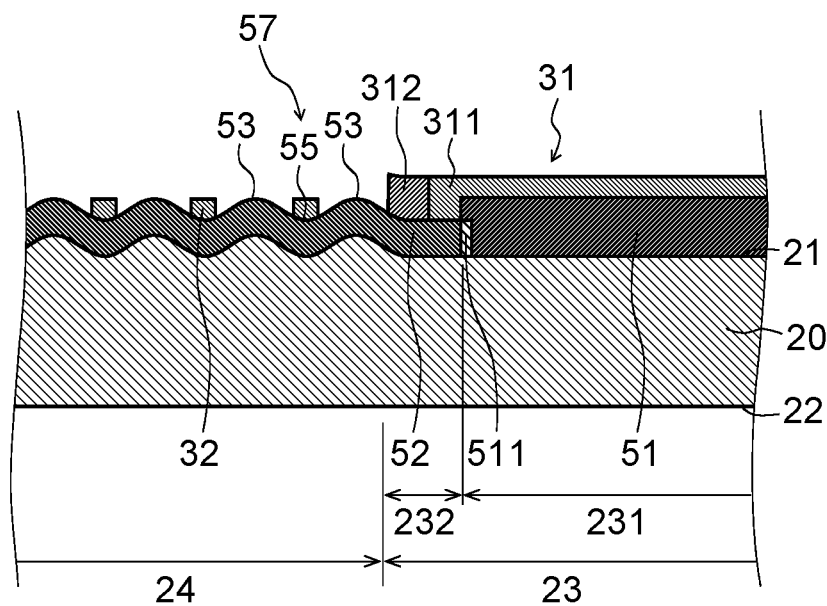
FIG. 12 is a cross-sectional view illustrating a modification example of the stretching control mechanism positioned in the component region.

In the example illustrated in FIG. 12, the elastic modulus of the second section 312 of the first stretching control part 31 may be smaller than the elastic modulus of the first section 311 of the first stretching control part 31. Hence, the deformability of the component-surrounding region 232 of the substrate 20 also increases toward the wiring region 24 in this modification example. Therefore, an abrupt change in the deformability of the substrate 20 at or in the vicinity of the border between the component region 23 and the wiring region 24 can be suppressed. Thus, damage to the wiring 52 at or in the vicinity of the border between the component region 23 and the wiring region 24 can be suppressed.

Fourth Modification Example of Cross Section Structure

Figure 13:
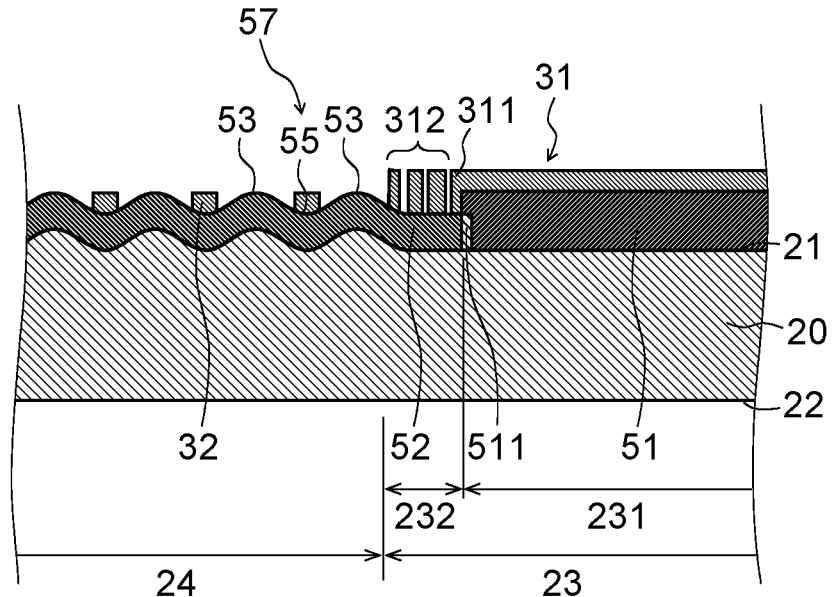
FIG. 13 is a cross-sectional view illustrating a modification example of the stretching control mechanism positioned in the component region.

As illustrated in FIG. 13, the density distribution of the second section 312 of the first stretching control part 31 may be smaller than the density distribution of the first section 311 of the first stretching control part 31. The second section 312 includes a plurality of members which are arranged with spaces therebetween as illustrated in FIG. 13, for example. The density distribution of the second section 312 may become low toward the wiring region 24. For example, the width of the members may become small toward the wiring region 24. Alternatively, the spaces between the members may become large toward the wiring region 24. The respective members of the second section 312 are configured from the same material as the first section 311, for example.

Figure 14:
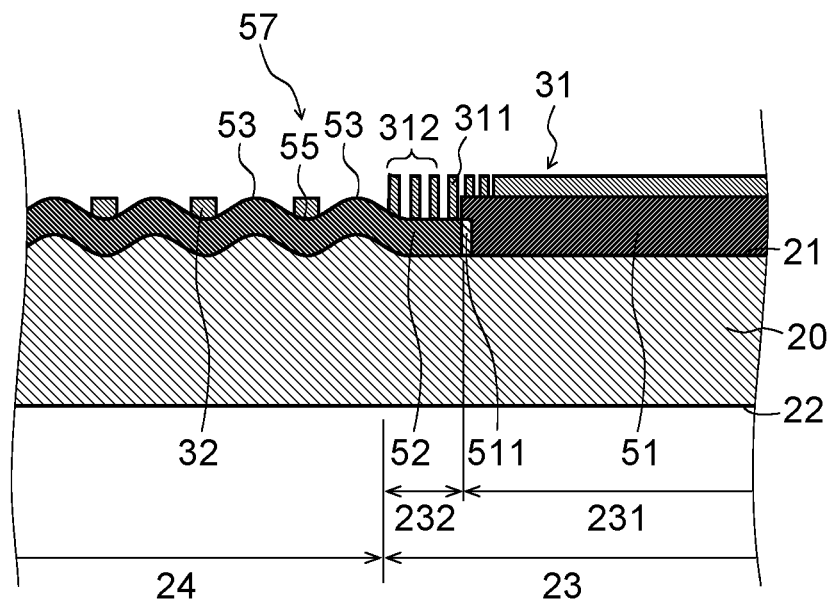
FIG. 14 is a cross-sectional view illustrating a modification example of the stretching control mechanism positioned in the component region.

According to the modification example, the distribution density of the second section 312 of the first stretching control part 31 is smaller than the distribution density of the first section 311. Hence, the deformability of the component-surrounding region 232 of the substrate 20 increases toward the wiring region 24. Therefore, an abrupt change in the deformability of the substrate 20 at or in the vicinity of the border between the component region 23 and the wiring region 24 can be suppressed. Thus, damage to the wiring 52 at or in the vicinity of the border between the component region 23 and the wiring region 24 can be suppressed. Note that, in this modification example, the first section 311 of the first stretching control part 31 may also include a plurality of members which are arranged with spaces therebetween, as illustrated in FIG. 14.

Fifth Modification Example of Cross Section Structure

Figure 15:
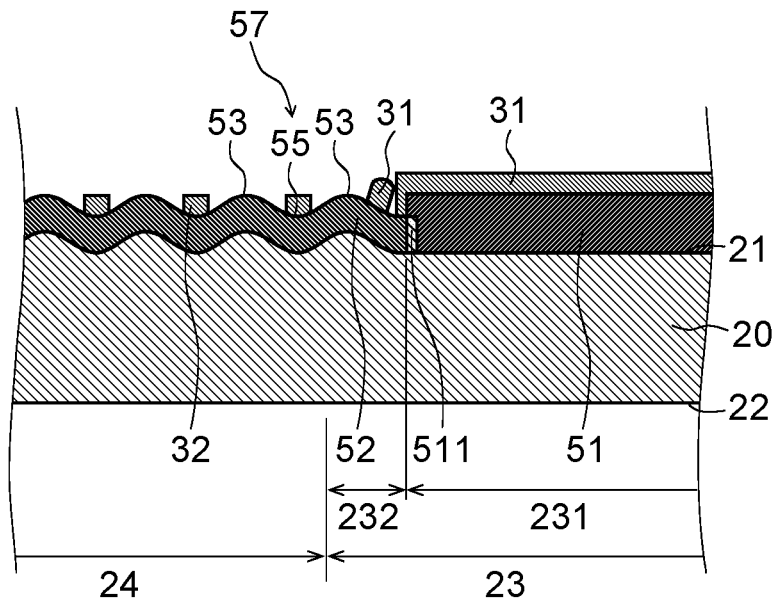
FIG. 15 is a cross-sectional view illustrating a modification example of the stretching control mechanism positioned in the component region.

As illustrated in FIG. 15, the first stretching control part 31 positioned in the component-surrounding region 232 may made to rest on the electronic component 51. In other words, the first stretching control part 31 may include a lower section that is not in contact with the electronic component 51 and an upper section that is in contact with the electronic component 51. In the example illustrated in FIG. 15, the lower section of the first stretching control part 31 is in contact with the wiring 52. In a case where the upper section of the first stretching control part 31 is in contact with the electronic component 51 and applies a force to the electronic component 51, when the peak 53 of the meandering shape section 57 where the first stretching control part 31 is provided is about to be displaced further toward the component-fixing region 231, the first stretching control part 31 the upper section of which is in contact with the electronic component 51 is compressed, thereby generating a repulsive force. It is thus possible to suppress an increase in the height of the peaks 53 of the meandering shape section 57 where the first stretching control part 31 is provided. Thus, damage to the electrical junction between the electrode 511 of the electronic component 51 and the wiring 52 can be suppressed. Note that the upper section of the first stretching control part 31 positioned in the component-surrounding region 232 may, as illustrated in FIG. 15, apply a force to the electronic component 51 indirectly via another first stretching control part 31 or the like, or, although not illustrated, may apply a force directly to the electronic component 51.

Next, modification examples of placement, in the normal direction of the first surface 21 of the substrate 20, of the first stretching control part 31 positioned in the component-surrounding region 232 will each be described with reference to FIGS. 16 to 23.

First Modification Example of Placement

Figure 16:
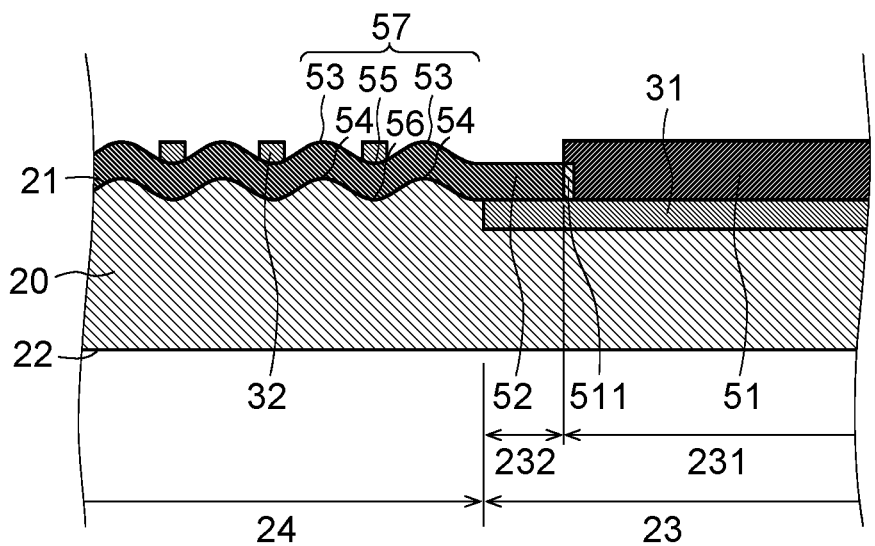
FIG. 16 is a cross-sectional view illustrating a modification example of the stretching control mechanism positioned in the component region.
Figure 17:
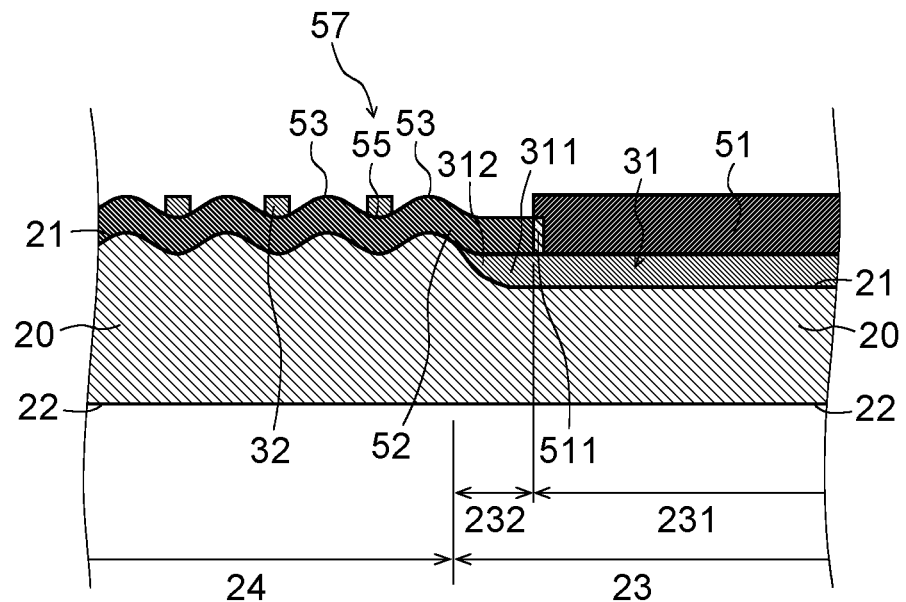
FIG. 17 is a cross-sectional view illustrating a modification example of the stretching control mechanism positioned in the component region.
Figure 18:
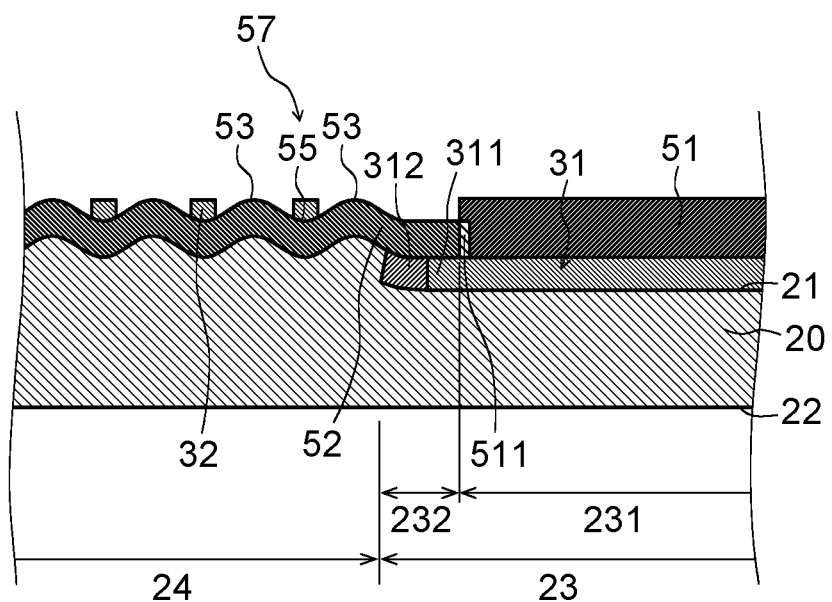
FIG. 18 is a cross-sectional view illustrating a modification example of the stretching control mechanism positioned in the component region.

As illustrated in FIG. 16, the first stretching control part 31 positioned in the component-surrounding region 232 may be positioned between the wiring 52 and the substrate 20. In this case, the first stretching control part 31 may be positioned on the first surface 21 of the substrate 20 or may be positioned in a recess provided in the first surface 21 of the substrate 20. Also in this modification, the first stretching control part 31 may include a first section 311, and a second section 312 with a higher deformability than the first section 311. As illustrated in FIG. 17, the thickness of the second section 312 may decrease toward the wiring region 24. Furthermore, as illustrated in FIG. 18, the second section 312 may be configured to have an elastic modulus that is smaller than the first section 311.

Second Modification Example of Placement

Figure 19:
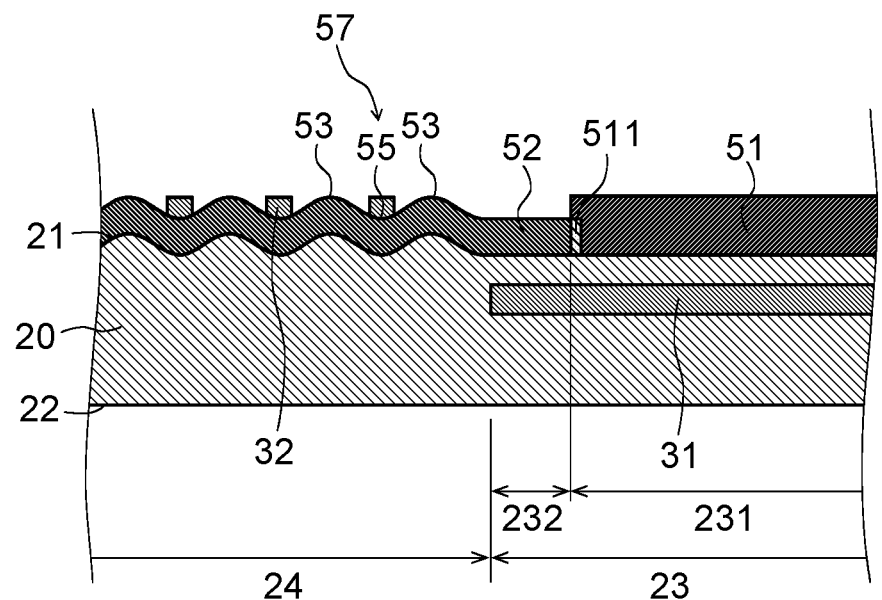
FIG. 19 is a cross-sectional view illustrating a modification example of the stretching control mechanism positioned in the component region.

As illustrated in FIG. 19, the first stretching control part 31 positioned in the component-surrounding region 232 may be embedded inside the substrate 20. This substrate 20 and first stretching control part 31 are obtained, for example, when a resin is cast in a mold and the mold resin is hardened to produce the substrate 20, by throwing the first stretching control part 31 into the mold with the appropriate timing.

Also in this modification, although not illustrated, the first stretching control part 31 may include a first section 311, and a second section 312 with a higher deformability than the first section 311.

Third Modification Example of Placement

Figure 20:
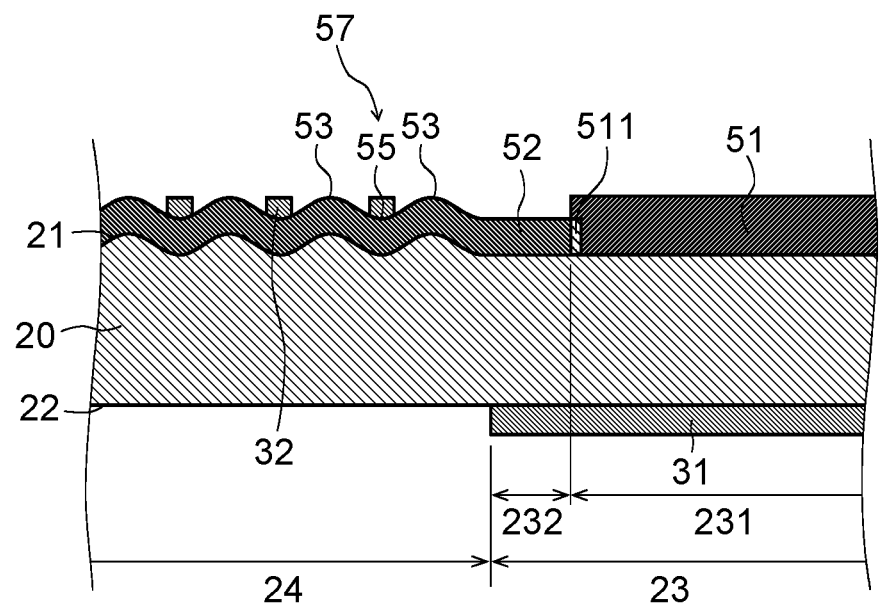
FIG. 20 is a cross-sectional view illustrating a modification example of the stretching control mechanism positioned in the component region.

As illustrated in FIG. 20, the first stretching control part 31 positioned in the component-surrounding region 232 may be positioned on the second surface 22 side of the substrate 20. Also in this modification, although not illustrated, the first stretching control part 31 may include a first section 311, and a second section 312 with a higher deformability than the first section 311.

Fourth Modification Example of Placement

Figure 21:
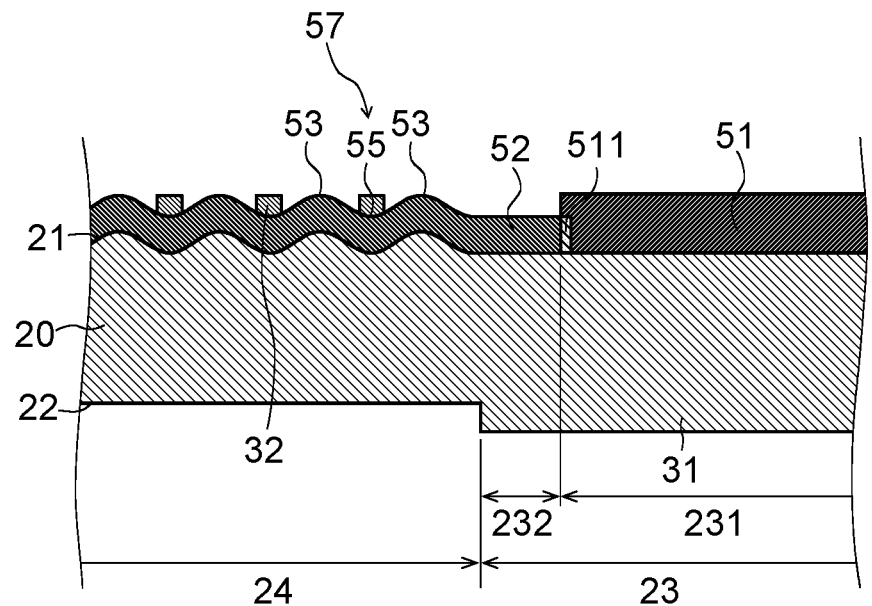
FIG. 21 is a cross-sectional view illustrating a modification example of the stretching control mechanism positioned in the component region.
Figure 22:
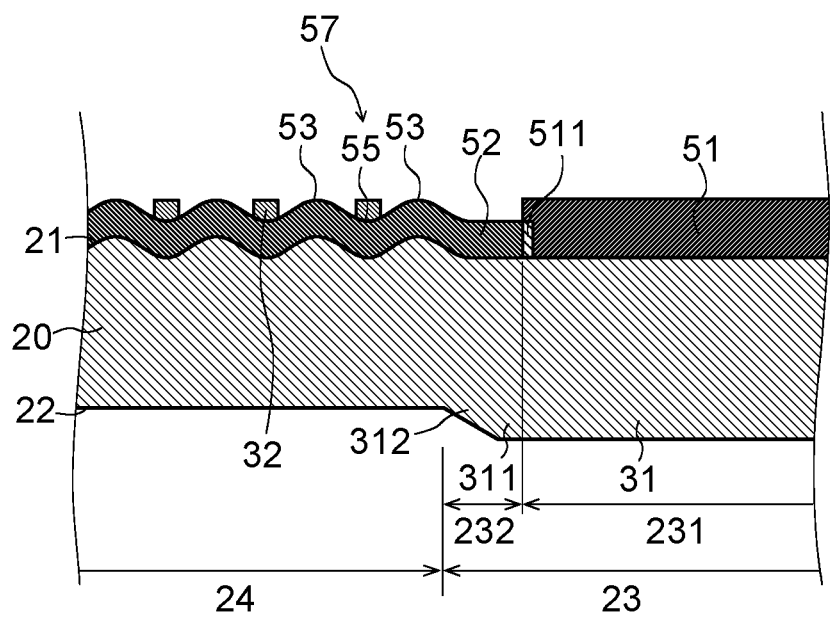
FIG. 22 is a cross-sectional view illustrating a modification example of the stretching control mechanism positioned in the component region.

The first stretching control part 31 positioned in the component-surrounding region 232 may also be configured to be integral with the substrate 20. For example, the first stretching control part 31 may be a protrusion that protrudes from the second surface 22 of the substrate 20, as illustrated in FIG. 21. As illustrated by the protrusion and in FIG. 22, the first stretching control part 31 appears in the component-surrounding region 232 as a result of a recess being formed in the wiring region 24 around the component-surrounding region 232. Furthermore, the first stretching control part 31, which is configured to be integral with the substrate 20, may include a first section 311, and a second section 312 with a higher deformability than the first section 311. Note that "integrally" means that there is no interface between the substrate 20 and the first stretching control part 31.

Figure 23:
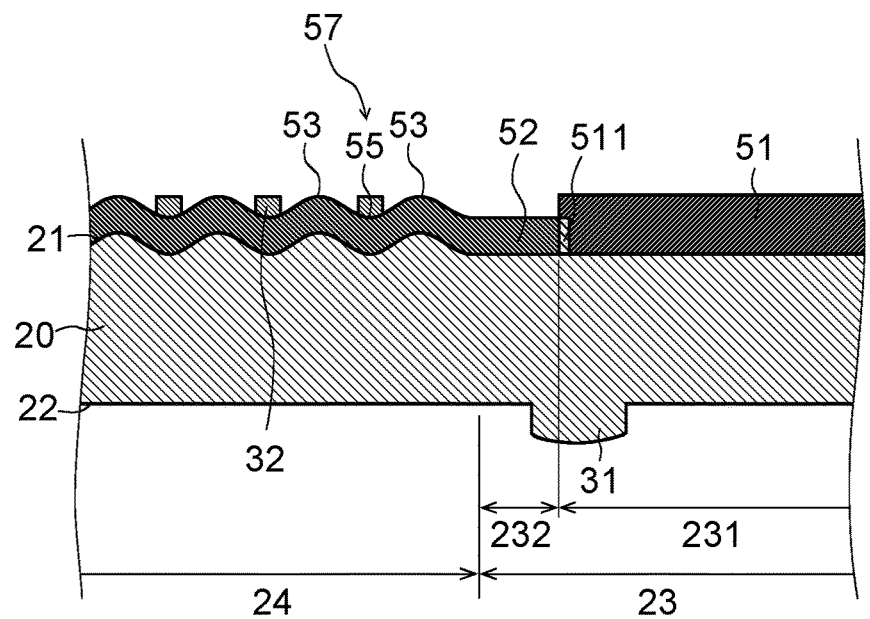
FIG. 23 is a cross-sectional view illustrating a modification example of the stretching control mechanism positioned in the component region.

Furthermore, as illustrated in FIG. 23, the first stretching control part 31, which is configured to be integral with the substrate 20 and which is positioned in the component-surrounding region 232, need not spread across the whole area of the component-fixing region 231.

Although an example in which the second stretching control part 32 positioned in the wiring region 24 is provided on the first surface 21 of the substrate 20 or on the wiring 52 is illustrated in FIGS. 16 to 23, the present disclosure is not limited to or by this example. Although not illustrated, the second stretching control part 32 positioned in the wiring region 24 may be provided in the same position as the first stretching control part 31 in the normal direction of the first surface 21 of the substrate 20.

Next, a modification example of the pattern of the first stretching control part 31 positioned in the component-surrounding region 232 will be described.

Pattern Modification Example

Figure 24:
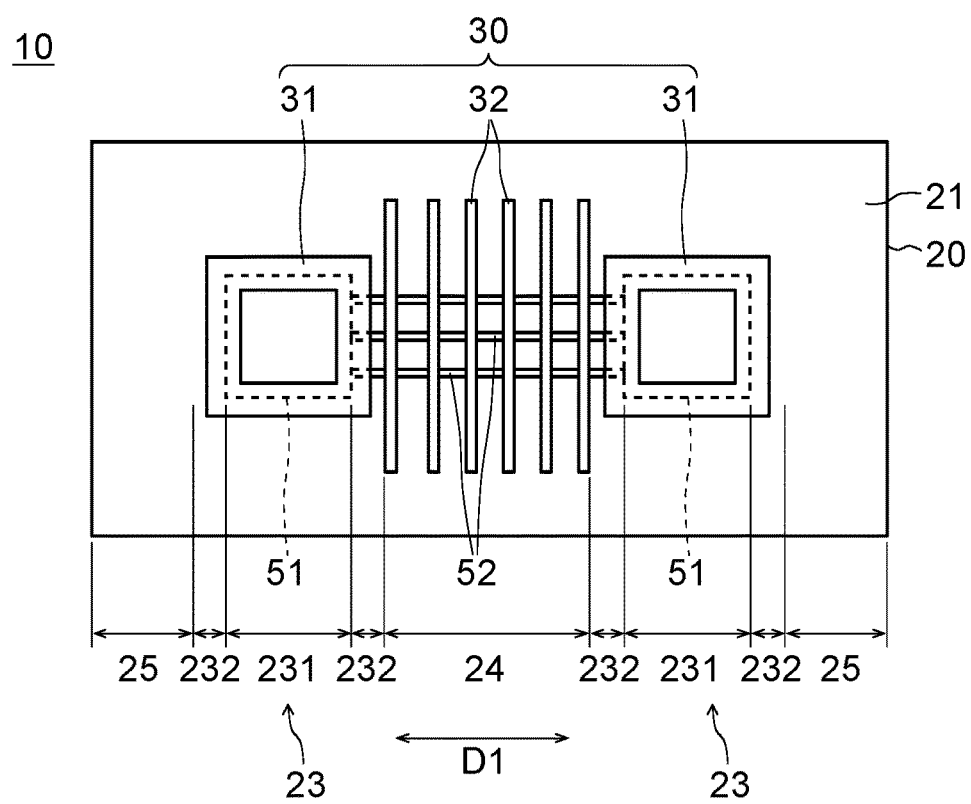
FIG. 24 is a plan view illustrating a modification example of the stretching control mechanism positioned in the component region.

In the foregoing embodiment, the example in which the first stretching control part 31 positioned in the component-surrounding region 232 spreads across the whole area of the component-fixing region 231 in a plan view is illustrated. However, the present disclosure is not limited to or by this example, rather, the first stretching control part 31 positioned in the component-surrounding region 232 may at least spread to the border between the component-surrounding region 232 and the component-fixing region 231. For example, as illustrated in FIG. 24, the first stretching control part 31 may have a frame-like pattern that extends along the border between the component-surrounding region 232 and the component-fixing region 231.

Figure 53:
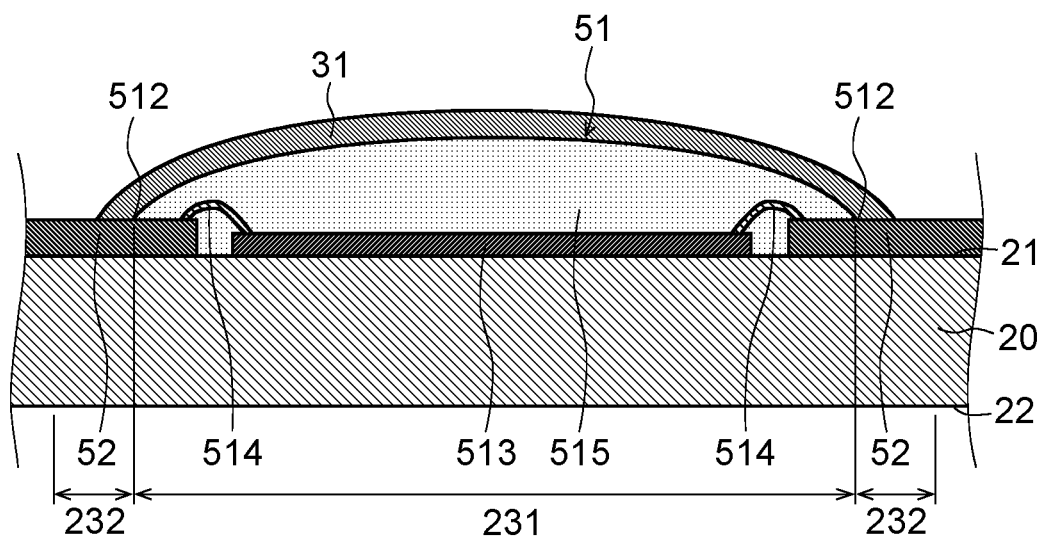
FIG. 53 is a cross-sectional view illustrating a modification example of an electronic component.

Next, modification examples of the end portion 512 of the electronic component 51 will each be described with reference to FIGS. 25, 26 and 53. As mentioned earlier, the end portion 512 of the electronic component 51 demarcates the border between the component-fixing region 231 and the component-surrounding region 232.

First Modification Example of Electronic Component End Portion

Figure 25:
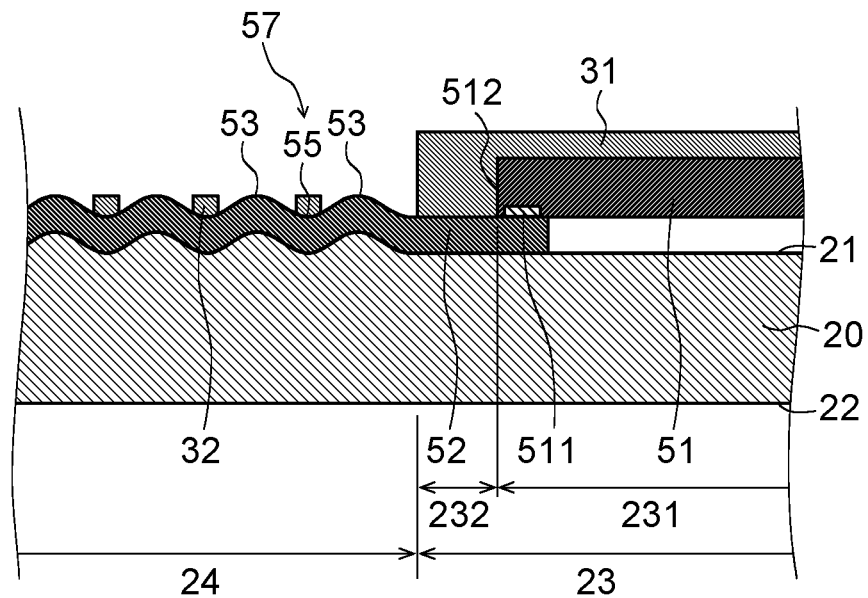
FIG. 25 is a cross-sectional view illustrating a modification example of an electronic component.

As illustrated in FIG. 25, the electrode 511 of the electronic component 51 may be provided on the back face of the electronic component 51. the back face of the electronic component 51 is a surface positioned on the substrate 20 side. In this case, the wiring 52 connected to the end portion 512 of the electronic component 51 is positioned below the electrode 511. In the example illustrated in FIG. 25, the side surface of the electronic component 51 is the end portion 512 of the electronic component 51.

Second Modification Example of Electronic Component End Portion

Figure 26:
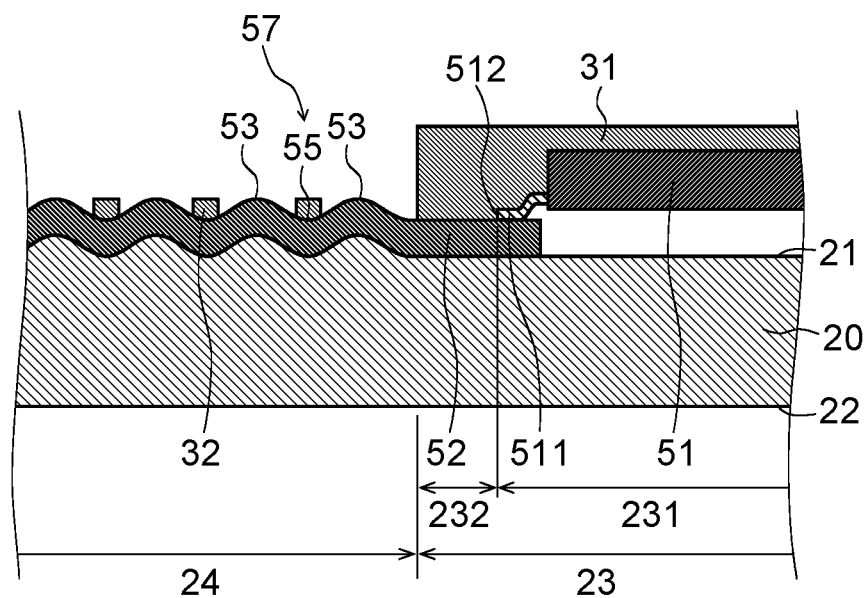
FIG. 26 is a cross-sectional view illustrating a modification example of an electronic component.

As illustrated in FIG. 26, the electrode 511 of the electronic component 51 may extend further outside than the side surface of the body section of the electronic component 51. In this case, the wiring 52 connected to the end portion 512 of the electronic component 51 is positioned below the electrode 511. In the example illustrated in FIG. 26, the tip of the electrode 511 constitutes the end portion 512 of the electronic component 51.

Third Modification Example of Electronic Component End Portion

In the foregoing embodiment and modification examples, the example in which the electronic component 51 is pre-packaged at a stage before being mounted on the wiring board 10 is illustrated. Nevertheless, the present disclosure is not limited to or by this example, rather, the electronic component 51 may also be configured by mounting some of the elements of the electronic component 51 on the wiring board 10 and then sealing a portion of the constituent elements. For example, as illustrated in FIG. 53, the electronic component 51 may include a chip 513, a wire 514 that connects the chip 513 to the wiring 52, and a resin 515 that covers the chip 513 and the wire 514. The wire 514 functions as an electrode that is connected to the wiring 52. In the production process to provide this electronic component 51, the chip 513 is first placed on the substrate 20, for example, of the wiring board 10. In so doing, the chip 513 may be fixed to the wiring board 10 by using an adhesive or the like. The wire 514 is then connected to the chip 513 and the wiring 52. The wire 514 contains gold, aluminum or copper, or the like. Thereafter, liquid resin is dripped onto the chip 513 and the wire 514 to form the resin 515 that covers the chip 513 and wire 514. This process is also referred to as potting. A urethane resin or an epoxide resin, or the like, may also be employed as the resin 515. In cases where the electronic component 51 contains the resin 515 as illustrated in FIG. 53, the end portion of the resin 515 is then the end portion 512 of the electronic component 51. Thus, the region, overlapping the resin 515, of the substrate 20 is then the component-fixing region 231.

The section of the substrate 20 which overlaps the resin 515 does not readily deform in comparison with the section of the substrate 20 which does not overlap the resin 515. In this case, when extension or contraction occur in the substrate 20, there is a concentration of stress in a section of the wiring board 10 which overlaps the resin 515. That is, there is a concentration of stress in a border section between the component-fixing region 231 and the component-surrounding region 232. In view of the concentration of stress, as illustrated in FIG. 53, it is preferable that the first stretching control part 31 is provided in the component-surrounding region 232, and the first stretching control part 31 spreads to the border between the component-surrounding region 232 and the component-fixing region 231. Thus, damage to the wiring 52 or the resin 515 in the border section between the component-fixing region 231 and the component-surrounding region 232 can be suppressed.

Modification examples of the electronic component 51 will be described next. In the foregoing embodiment, the example in which the electronic component 51 is a component comprising a member different from the constituent elements of the wiring board 10 is illustrated. In the modification examples hereinbelow, an example in which the electronic component 51 includes a member that is integral to at least one constituent element among the plurality of constituent elements of the wiring board 10 will be described.

(First Modification Example of Electronic Component)

Figure 54:
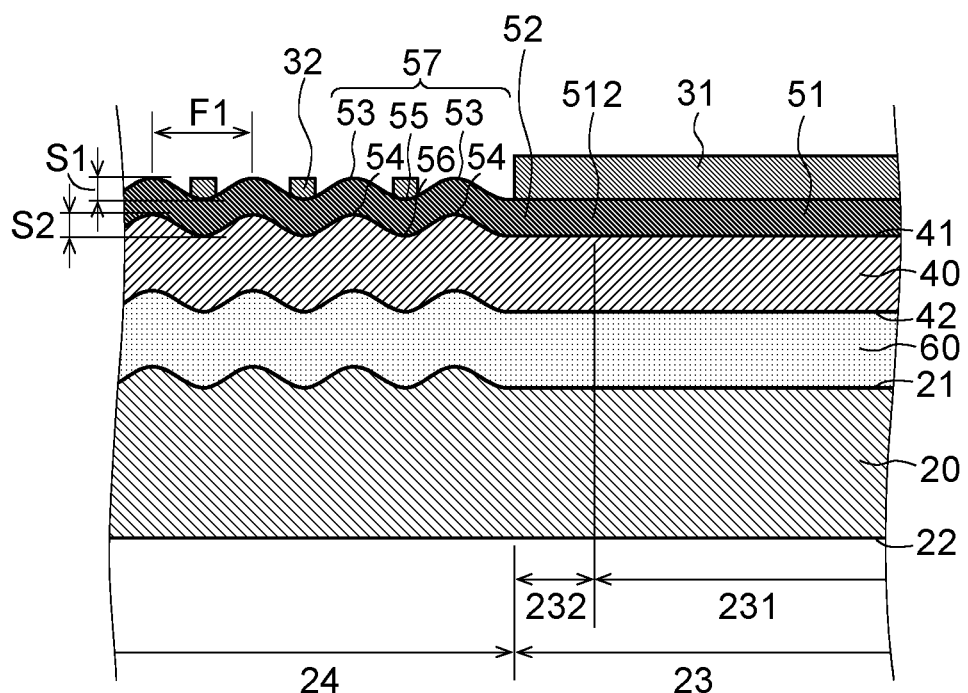
FIG. 54 is a cross-sectional view illustrating a modification example of an electronic component.

FIG. 54 is a cross-sectional view illustrating an enlargement of a wiring board 10 according to a modification example. As illustrated in FIG. 54, the electronic component 51 includes a conductive layer which is integral to the conductive layer constituting the wiring 52 of the wiring board 10. In the example illustrated in FIG. 54, the conductive layer constituting the wiring 52 and the conductive layer constituting the electronic component 51 are both positioned on the first surface 41 of the support substrate 40. The meandering shape section 57 appears in the conductive layer constituting the wiring 52. However, the first stretching control part 31 overlaps the conductive layer constituting the electronic component 51 and hence a meandering shape section does not appear in the conductive layer constituting the electronic component 51.

Figure 55:
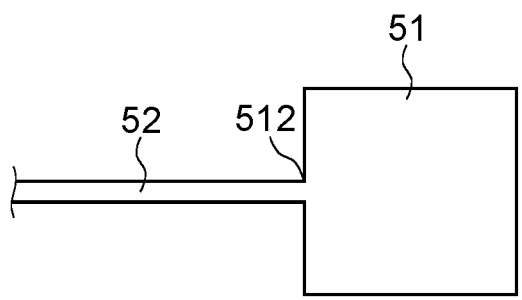
FIG. 55 is a plan view illustrating a modification example of an electronic component.

FIG. 55 is a plan view illustrating an example of the electronic component 51 illustrated in FIG. 54. In the example illustrated in FIG. 55, the conductive layer constituting the electronic component 51 has a wider width than the conductive layer constituting the wiring 52. The section in which the width of the conductive layer changes is the end portion 512 of the electronic component 51. The electronic component 51 illustrated in FIG. 55 is capable of functioning as a pad, for example. In this case, the electronic component 51 has a section that does not overlap the first stretching control part 31. A testing probe or a terminal for software rewrites, or the like, is connected to the pad.

Figure 56:
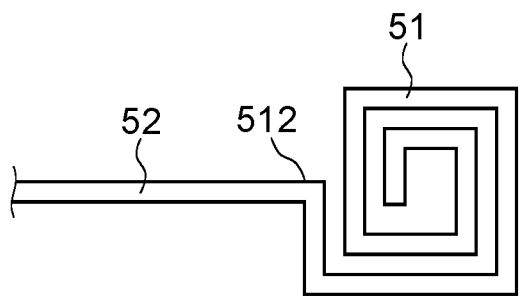
FIG. 56 is a plan view illustrating a modification example of an electronic component.

FIG. 56 is a plan view illustrating another example of the electronic component 51 illustrated in FIG. 54. In the example illustrated in FIG. 56, the conductive layer constituting the electronic component 51 has a shape that extends in a helical shape. The section of the conductive layer that starts to extend in a helical shape is the end portion 512 of the electronic component 51. The electronic component 51 that includes a conductive layer having a predetermined pattern as illustrated in FIG. 56 is capable of functioning as an antenna or a pressure sensor.

Second Modification Example of Electronic Component

Figure 57:
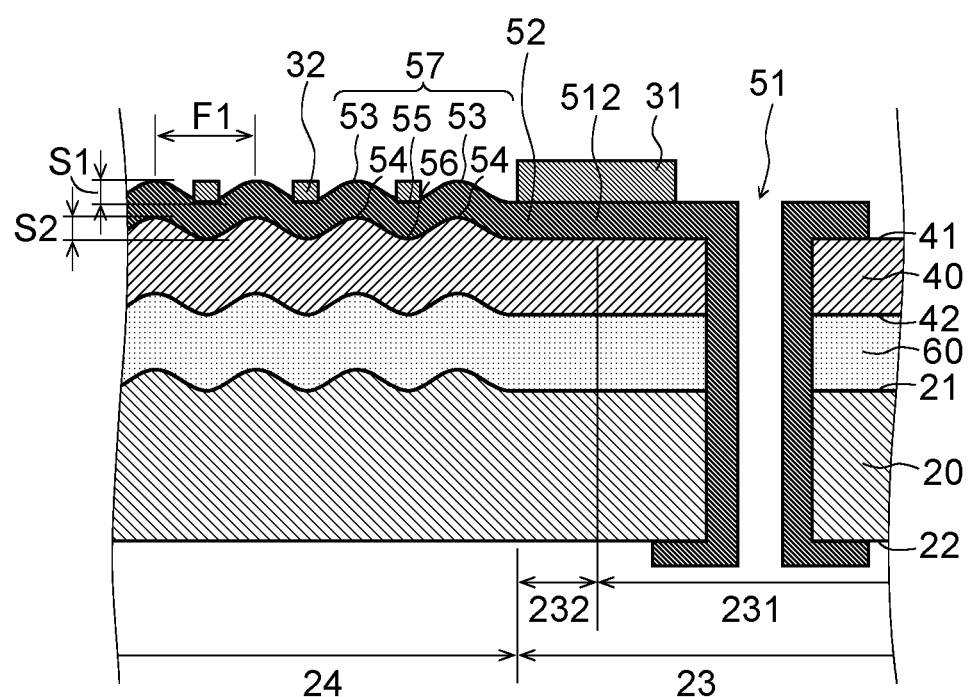
FIG. 57 is a plan view illustrating a modification example of an electronic component.

FIG. 57 is a cross-sectional view illustrating an enlargement of a wiring board 10 according to a modification example. As illustrated in FIG. 57, the electronic component 51 includes a through-hole provided in the wiring board 10 and a conductive layer provided on the wall surface of the through-hole. The conductive layer of the electronic component 51 is configured integral to the conductive layer constituting the wiring 52.

As illustrated in FIG. 57, the first stretching control part 31 is preferably provided so as to straddle the conductive layer constituting the wiring 52 and the conductive layer constituting the electronic component 51. It is thus possible to suppress damage to the conductive layer or the like at the border between the conductive layer constituting the wiring 52 and the conductive layer constituting the electronic component 51.

(Modification Example of Second Stretching Control Part Positioned in Wiring Region)

Several modification examples of the second stretching control part 32 positioned in the wiring region 24 will be described hereinbelow. First, the modification examples of the cross-section structure of the second stretching control part 32 will each be described with reference to FIGS. 27 to 32.

First Modification Example of Cross-Section Structure

Figure 27:
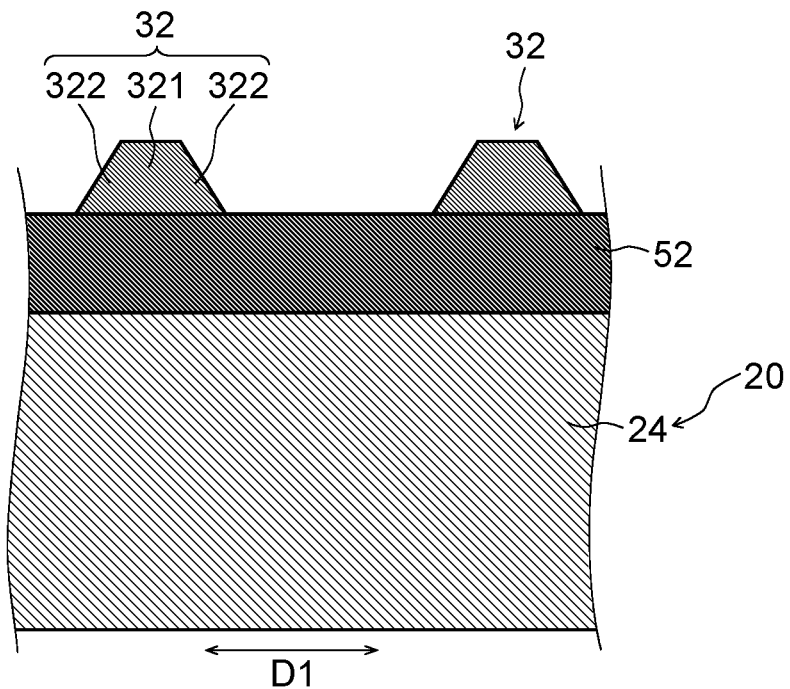
FIG. 27 is a cross-sectional view illustrating a modification example of the stretching control part positioned in the wiring region.
Figure 28:
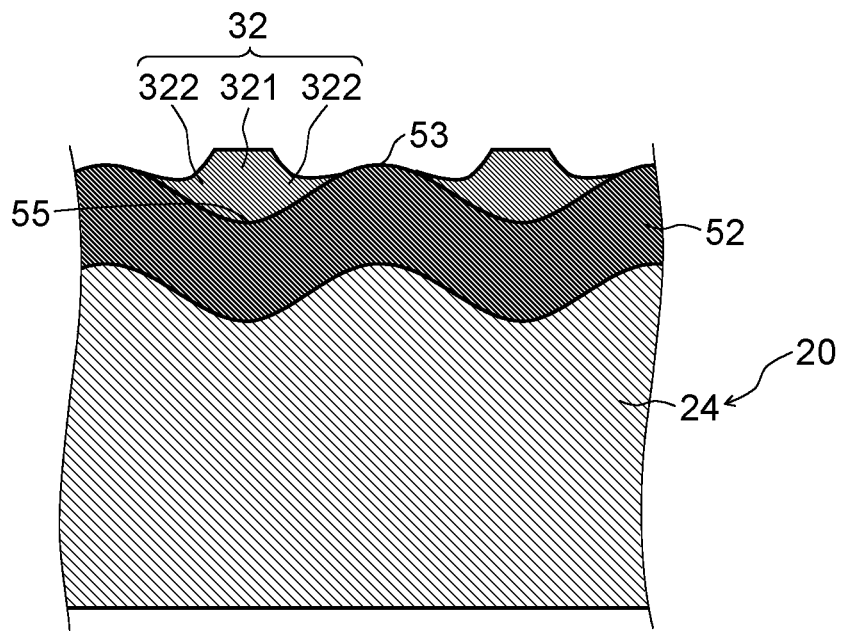
FIG. 28 is a cross-sectional view illustrating an aspect in which the wiring board illustrated in FIG. 27 is relaxed.

FIG. 27 is a diagram illustrating an enlargement of the wiring board 10 according to a modification example in a state where tensile stress is being applied to the substrate 20. Further, FIG. 28 is a cross-sectional view illustrating an aspect in which the wiring board 10 illustrated in FIG. 27 is relaxed. In the foregoing embodiment, the example in which the second stretching control part 32 positioned in the wiring region 24 has uniform deformability is illustrated. For example, an example in which the second stretching control part 32 has a uniform thickness is illustrated. However, the present disclosure is not limited to or by this example, rather, as illustrated in FIG. 27, the second stretching control part 32 may be configured to exhibit different deformability according to position. For example, the second stretching control part 32 may include a first section 321, and a second section 322 with a higher deformability than the first section 321.

As illustrated in FIG. 27, a first section 321 may constitute a center section of the second stretching control part 32 in the first direction D1, and a second section 322 may constitute both end portions of the second stretching control part 32 in the first direction D1. That is, the second stretching control part 32 may also include a first section 321 and a pair of second sections 322 that sandwich the first section 321. Alternatively, although not illustrated, the second section 322 may constitute the center section of the second stretching control part 32, and the first section 321 may constitute both end portions of the second stretching control part 32.

In this modification example, the thickness of the second section 322 of the second stretching control part 32 is smaller than the thickness of the first section 321. Hence, the deformability of the second section 322 is higher than the deformability of the first section 321. In addition, the thickness of the second section 322 may be at least partially reduced as distance from the first section 321 increases. In the example illustrated in FIG. 27, the thickness of the second section 322 is monotonically reduced as distance from the first section 321 increases. In this case, the deformability of the wiring region 24 of the substrate 20 increases toward the end portions of the second stretching control part 32. As a result, the center section of the second stretching control part 32, which is the first section 321 here, easily becomes a section of a specified phase of the meandering shape section 57, such as the valley 55, as illustrated in FIG. 28. Furthermore, as illustrated in FIG. 28, the first section 321 easily deforms according to the shape of the peaks 53 or valleys 55 of the meandering shape section 57. Hence, according to this modification example, the deformability and stretchability of the wiring region 24 of the substrate 20 can be maintained while ensuring the stability of the periodicity of the meandering shape section 57 by means of the center section of the second stretching control part 32. Note that the "thickness" signifies the dimension in the normal direction of the first surface 21 of the substrate 20.

Second Modification Example of Cross-Section Structure

Figure 29:
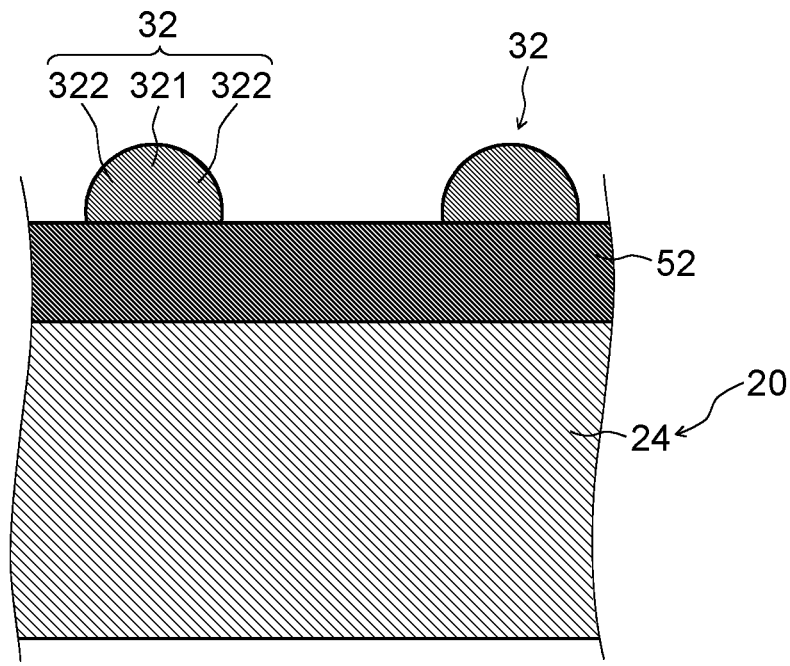
FIG. 29 is a cross-sectional view illustrating a modification example of the stretching control mechanism positioned in the wiring region.
Figure 30:
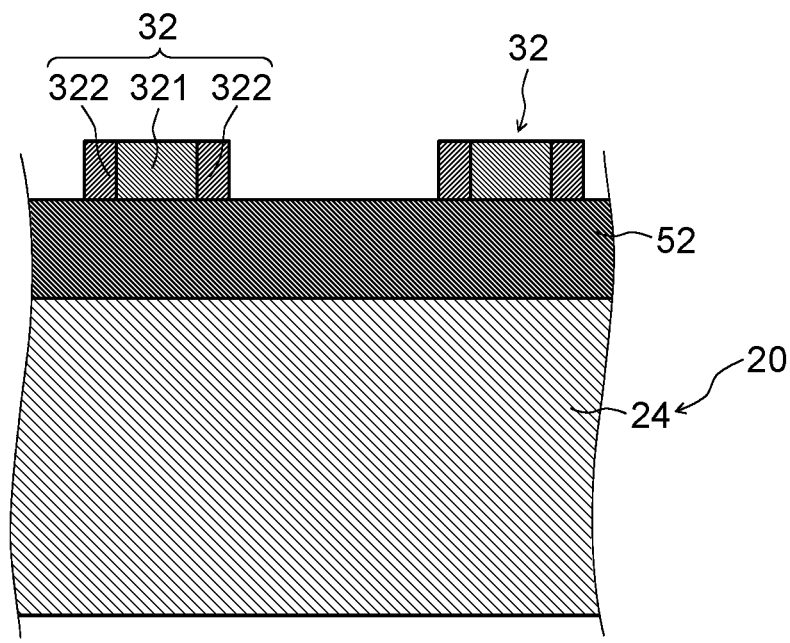
FIG. 30 is a cross-sectional view illustrating a modification example of the stretching control mechanism positioned in the wiring region.

Another example of the configuration of the second stretching control part 32 for affording the second section 322 higher deformability than the first section 321 will now be described. As illustrated in FIG. 29, the second stretching control part 32 positioned in the wiring region 24 may have a hemispherical shape. In this case, the thickness in the vicinity of the end portions of the second stretching control part 32 is reduced toward the end portions. Thus, the foregoing first section 321 and second section 322 can also constitute the second stretching control part 32 in this modification example.

Also in this modification example, the first section 321 of the second stretching control part 32 easily becomes a section of a specified phase of the meandering shape section 57. Furthermore, the second section 322 easily deforms to conform to the shape of the peaks 53 or valleys 55 of the meandering shape section 57. Hence, the deformability and stretchability of the wiring region 24 of the substrate 20 can be maintained while ensuring the stability of the periodicity of the meandering shape section 57.

Third Modification Example of Cross Section Structure

Another example of the configuration of the second stretching control part 32 for affording the second section 322 higher deformability than the first section 321 will now be described. In the example illustrated in FIG. 30, the elastic modulus of the second section 322 of the second stretching control part 32 may be smaller than the elastic modulus of the first section 321 of the second stretching control part 32. Hence, also in this modification example, the deformability of the wiring region 24 of the substrate 20 is high in the second section 322 in comparison with the first section 321 of the second stretching control part 32. Hence, the first section 321 easily becomes a section of a specified phase of the meandering shape section 57. Furthermore, the second section 322 easily deforms to conform to the shape of the peaks 53 or valleys 55 of the meandering shape section 57. Hence, the deformability and stretchability of the wiring region 24 of the substrate 20 can be maintained while ensuring the stability of the periodicity of the meandering shape section 57.

Fourth Modification Example of Cross Section Structure

Figure 31:
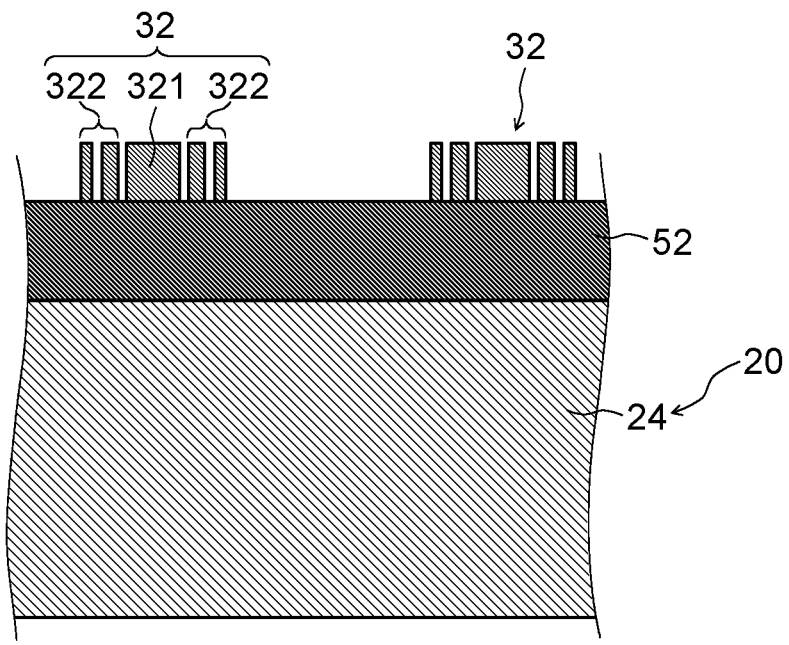
FIG. 31 is a cross-sectional view illustrating a modification example of the stretching control mechanism positioned in the wiring region.

Another example of the configuration of the second stretching control part 32 for affording the second section 322 higher deformability than the first section 321 will now be described. As illustrated in FIG. 31, the density distribution of the second section 322 of the second stretching control part 32 may be smaller than the density distribution of the first section 321 of the second stretching control part 32. The second section 322 includes a plurality of members which are arranged with spaces therebetween, as illustrated in FIG. 31, for example. The density distribution of the second section 322 may decrease as distance from the first section 321 increases. For example, the width of the members may be reduced as distance from the first section 321 increases. Alternatively, the spaces between the members may increase as distance from the first section 321 increases. The members of the second section 322 are each constituted by the same material as the first section 321, for example.

Also in this modification example, the deformability of the wiring region 24 of the substrate 20 is high in the second section 322 in comparison with the first section 321 of the second stretching control part 32. Hence, the first section 321 easily becomes a section of a specified phase of the meandering shape section 57. Furthermore, the second section 322 easily deforms to conform to the shape of the peaks 53 or valleys 55 of the meandering shape section 57. Hence, the deformability and stretchability of the wiring region 24 of the substrate 20 can be maintained while ensuring the stability of the periodicity of the meandering shape section 57.

Fifth Modification Example of Cross Section Structure

Figure 32:
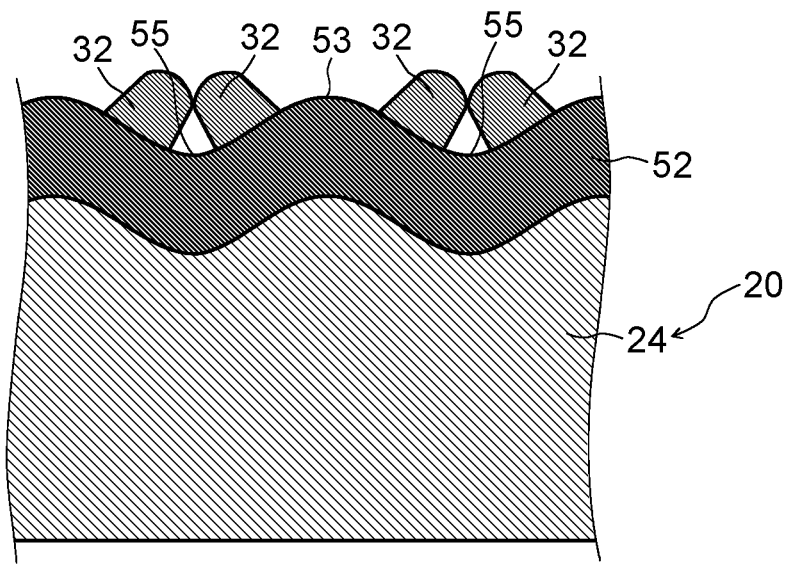
FIG. 32 is a cross-sectional view illustrating a modification example of the stretching control mechanism positioned in the wiring region.

As illustrated in FIG. 32, at least two second stretching control parts 32 positioned in the wiring region 24 may be positioned in a range of one period of the meandering shape section 57 and be in contact with each other. In this case, when the height of the peaks 53 of the meandering shape section 57 is about to increase, the second stretching control parts 32 in contact with each other are compressed, thereby generating a repulsive force. It is thus possible to suppress an increase in the height of the peaks 53 of the meandering shape section 57 where the second stretching control parts 32 in contact with each other are provided.

Sixth Modification Example of Cross Section Structure

Figure 58:
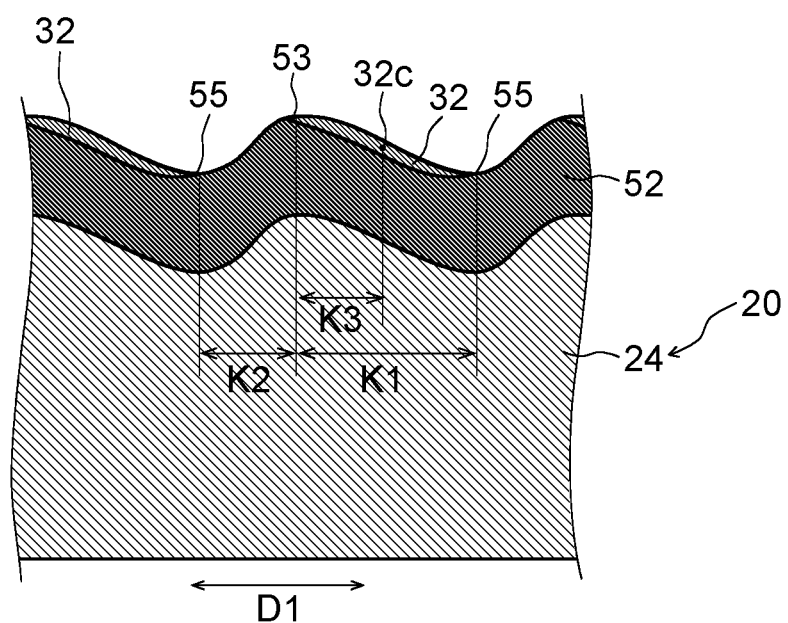
FIG. 58 is a cross-sectional view illustrating a modification example of the stretching control mechanism positioned in the wiring region.

When the quantity of the second stretching control parts 32 positioned in the range of one period of the meandering shape section 57 is no more than one, the second stretching control parts 32 may be positioned between the peaks 53 and valleys 55 of the meandering shape section 57, as illustrated in FIG. 58. In this case, the shape of the meandering shape section 57 may be asymmetrical in the first direction D1, as illustrated in FIG. 58.

In FIG. 58, a reference sign K1 denotes the dimension in the first direction D1 of an oblique plane spreading between the peak 53 and valley 55 of the meandering shape section 57. The second stretching control part 32 is provided on the oblique plane. In addition, a reference sign K2 denotes the dimension in the first direction D1 of the other oblique plane spreading between the peak 53 and valley 55 of the meandering shape section 57. The second stretching control part 32 is not provided on the other oblique plane. Dimension K1 is larger than dimension K2. For example, dimension K1 may be a 1.2 multiple or more of dimension K1 or a 1.5 multiple or more thereof.

In FIG. 58, a reference sign K3 denotes the distance in the first direction D1 from the peak 53 of the meandering shape section 57 to a center point 32c of the second stretching control part 32 in the first direction D1. The distance K3 may, for example, be a 0.3 multiple to a 0.7 multiple of dimension K1 or a 0.4 multiple to a 0.6 multiple thereof.

Next, modification examples of placement, in the normal direction of the first surface 21 of the substrate 20, of the second stretching control part 32 positioned in the wiring region 24, will each be described with reference to FIGS. 33 to 39.

First Modification Example of Placement

Figure 33:
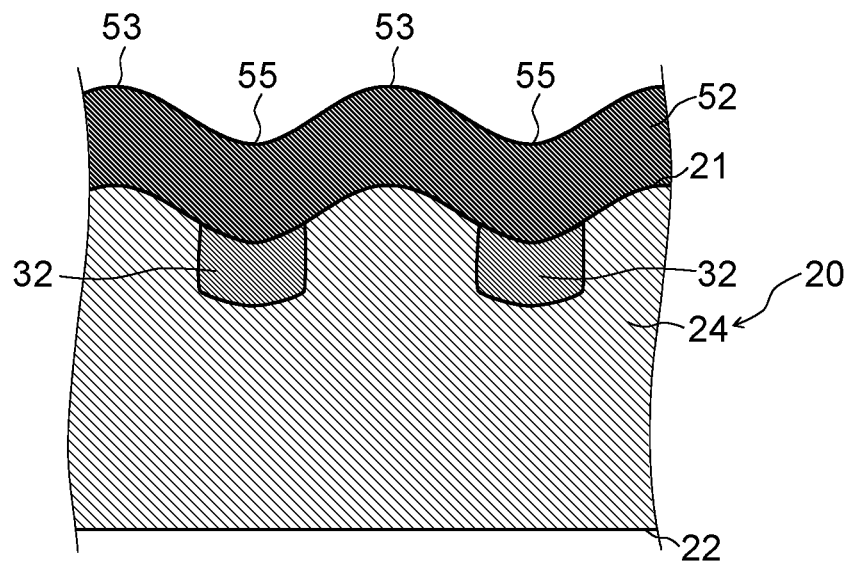
FIG. 33 is a cross-sectional view illustrating a modification example of the stretching control mechanism positioned in the wiring region.

As illustrated in FIG. 33, the second stretching control part 32 positioned in the wiring region 24 may be positioned between the wiring 52 and the substrate 20. In this case, the second stretching control part 32 may be positioned on the first surface 21 of the substrate 20 or may be positioned in a recess provided in the first surface 21 of the substrate 20. Also in this modification, the second stretching control part 32 may include a first section 321, and a second section 322 with a higher deformability than the first section 321.

Second Modification Example of Placement

Figure 34:
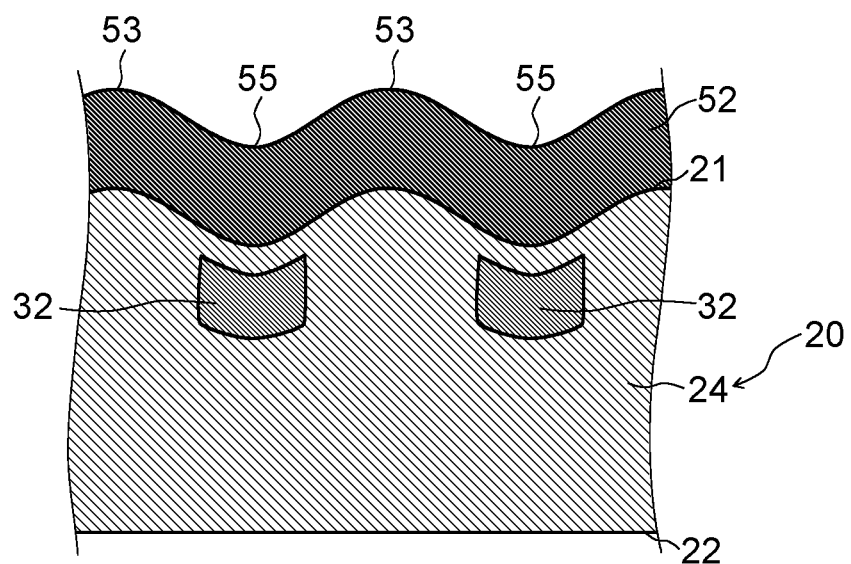
FIG. 34 is a cross-sectional view illustrating a modification example of the stretching control mechanism positioned in the wiring region.

As illustrated in FIG. 34, the second stretching control part 32 positioned in the wiring region 24 may be embedded inside the substrate 20. This substrate 20 and second stretching control part 32 are obtained, for example, when a resin is cast in a mold and the mold resin is hardened to produce the substrate 20, by throwing the second stretching control part 32 into the mold with the appropriate timing. Also in this modification, the second stretching control part 32 may include a first section 321, and a second section 322 with a higher deformability than the first section 321.

Third Modification Example of Placement

Figure 35:
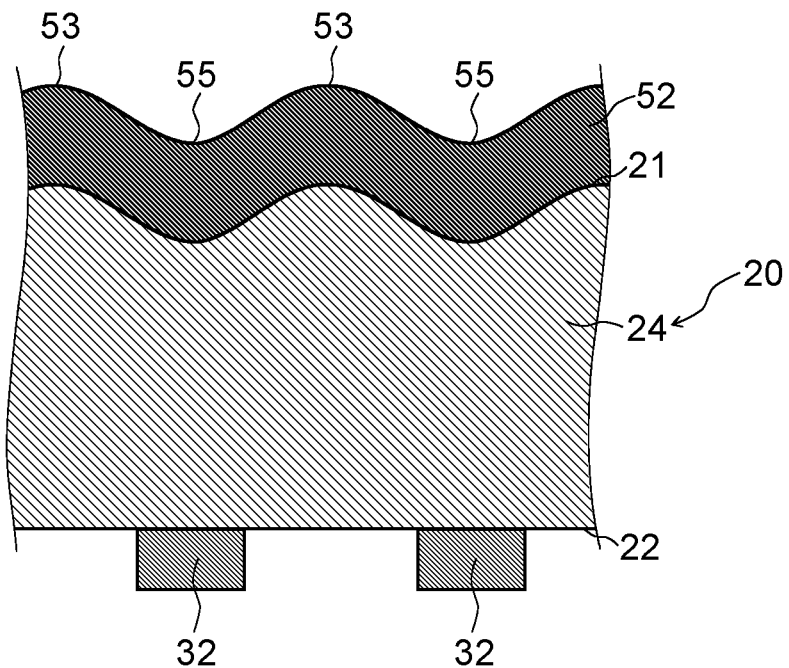
FIG. 35 is a cross-sectional view illustrating a modification example of the stretching control mechanism positioned in the wiring region.

As illustrated in FIG. 35, the second stretching control part 32 positioned in the wiring region 24 may be positioned on the second surface 22 side of the substrate 20. Also in this modification, the second stretching control part 32 may include a first section 321, and a second section 322 with a higher deformability than the first section 321.

Fourth Modification Example of Placement

Figure 36:
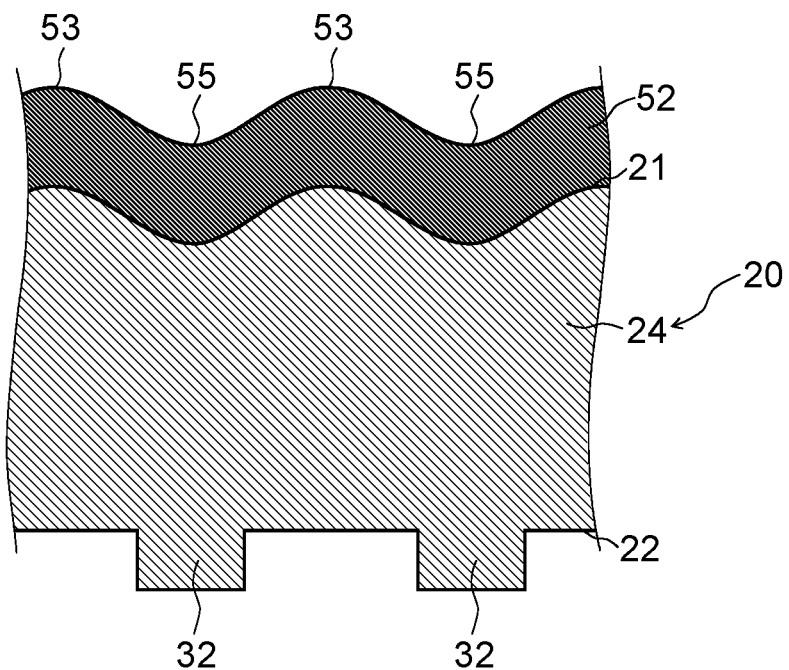
FIG. 36 is a cross-sectional view illustrating a modification example of the stretching control mechanism positioned in the wiring region.

As illustrated in FIG. 36, the second stretching control part 32 positioned in the wiring region 24 may be configured integral to the substrate 20. Also in this modification, the second stretching control part 32 may include a first section 321, and a second section 322 with a higher deformability than the first section 321.

Fifth Modification Example of Placement

Figure 37:
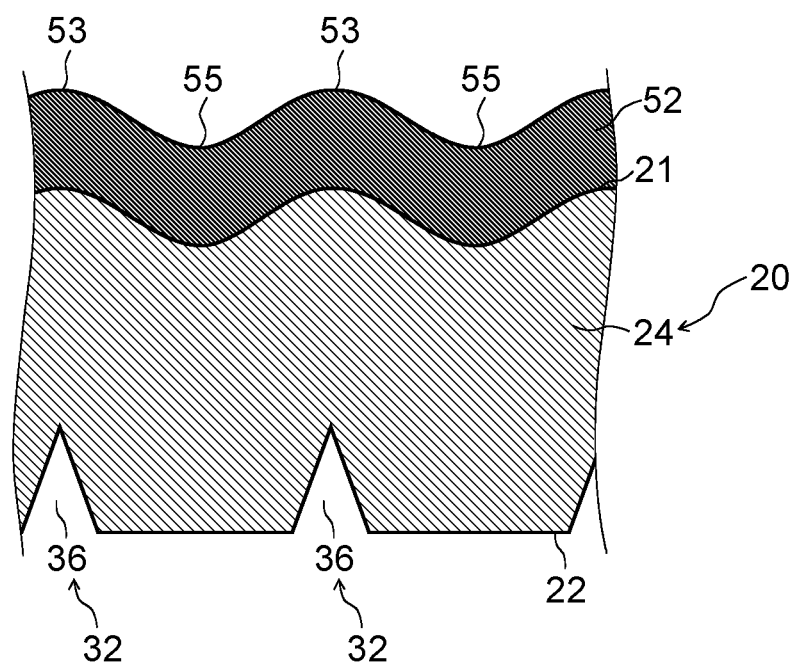
FIG. 37 is a cross-sectional view illustrating a modification example of the stretching control mechanism positioned in the wiring region.

The second stretching control part 32 positioned in the wiring region 24 may be a recess 36 provided in the substrate 20. As illustrated in FIG. 37, for example, the recess 36 may also be provided in the second surface 22 of the substrate 20. Also in this modification example, by providing the second stretching control part 32 configured from the recess 36 in the substrate 20, a section in which extension and contraction occur readily and a section in which extension and contraction does not readily occur are repeated, along the direction of extension of the wiring 52, in the wiring region 24 of the substrate 20. It is thus possible to restrain the periodicity of the meandering shape section 57 from being disturbed and the height of the peaks 53 of the meandering shape section 57 from then being locally large. It is accordingly possible to restrain significant stress from acting on the wiring 52 and damage to the wiring 52.

Sixth Modification Example of Placement

Figure 38:
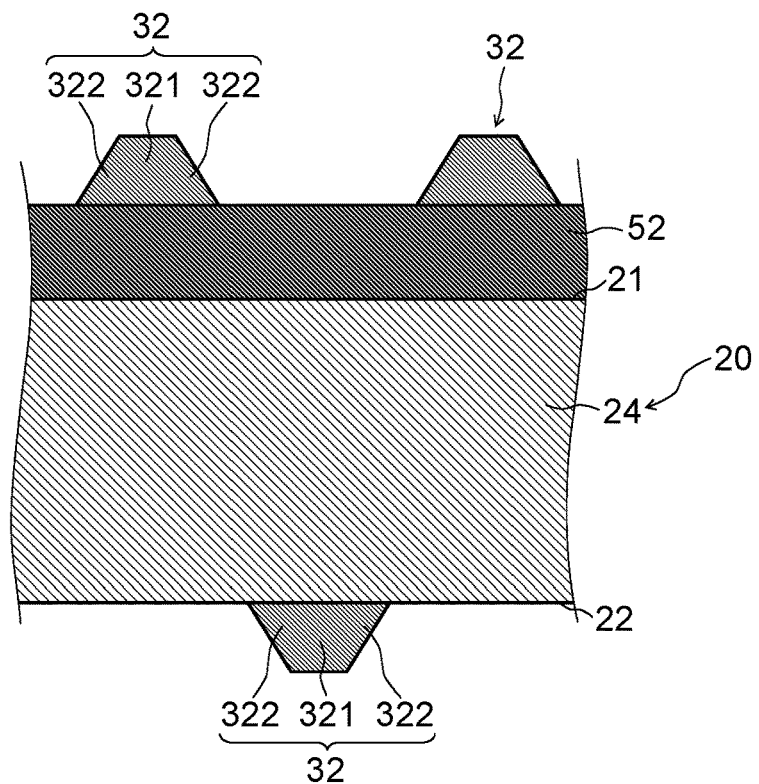
FIG. 38 is a cross-sectional view illustrating a modification example of the stretching control mechanism positioned in the wiring region.

As illustrated in FIG. 38, the second stretching control parts 32 positioned in the wiring region 24 may be provided on both the first surface 21 side and the second surface 22 side of the substrate 20. In this case, as illustrated in FIG. 38, the second stretching control parts 32 may also be arranged such that the first section 321 of the second stretching control part 32 positioned on the first surface 21 side and the first section 321 of the second stretching control part 32 positioned on the second surface 22 side do not overlap when viewed along the normal direction of the first surface 21 of the substrate 20.

Figure 39:
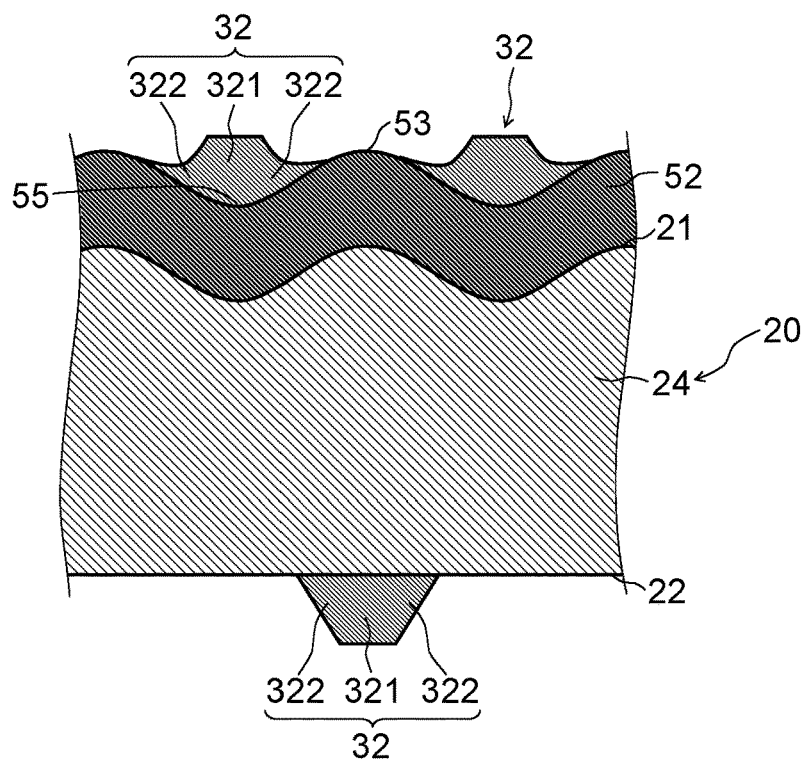
FIG. 39 is a cross-sectional view illustrating an aspect in which the wiring board illustrated in FIG. 38 is relaxed.

FIG. 39 is a cross-sectional view illustrating an aspect in which the wiring board 10 illustrated in FIG. 38 is relaxed. In the example illustrated in FIG. 38, the second stretching control parts 32 positioned on the first surface 21 side relates to the valleys 55 of the meandering shape section 57, and the second stretching control part 32 positioned on the second surface 22 side relates to the peak 53 of the meandering shape section 57.

Next, a modification example of placement, in the planar direction of the first surface 21 of the substrate 20, of the second stretching control part 32 positioned in the wiring region 24, will be described.

First Modification Example of Placement

Figure 59:
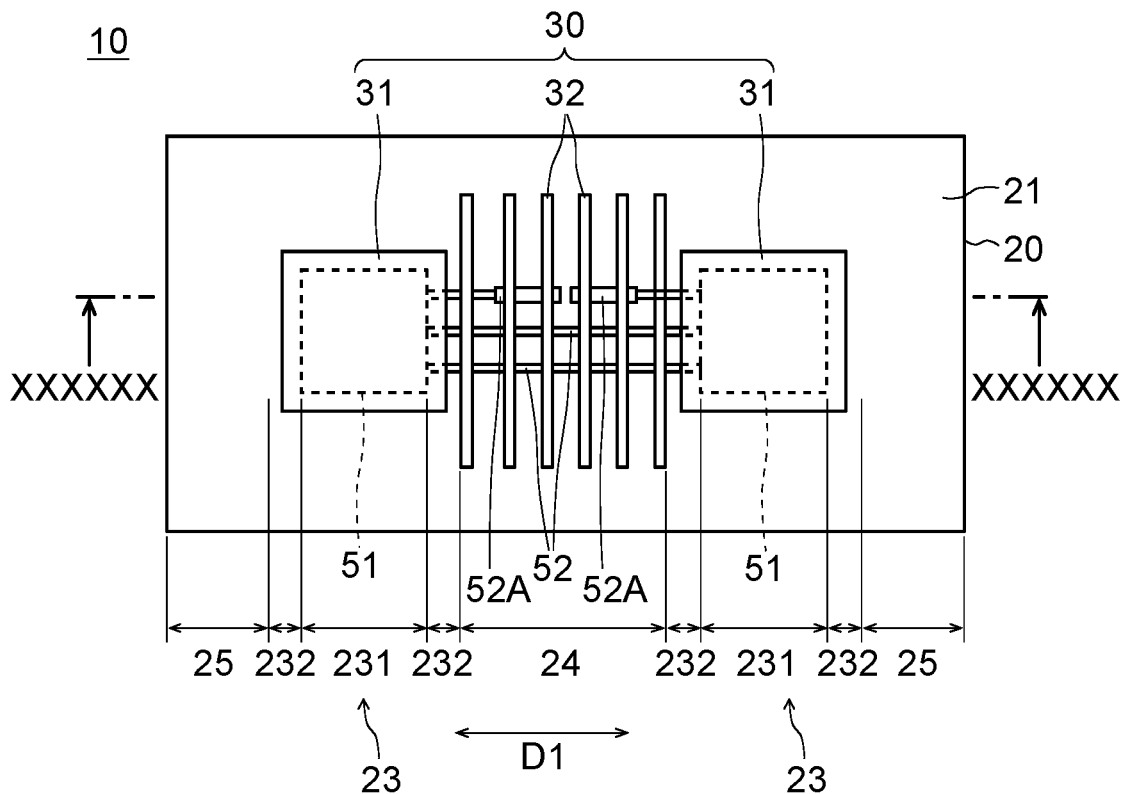
FIG. 59 is a plan view illustrating a modification example of the wiring board.

FIG. 59 is a plan view illustrating a modification example of the wiring board 10. Electrodes 52A are further provided, in addition to the wiring 52, in the wiring region 24 of the wiring board 10. The wiring 52 extends so as to electrically connect two elements. In the example illustrated in FIG. 59, the wiring extends so as to electrically connect two electronic components 51. The electrode 52A, on the other hand, is electrically connected to only one constituent element. In the example illustrated in FIG. 59, the electrodes 52A are electrically connected to one electronic component 51 via the wiring 52. As illustrated in FIG. 59, the electrode 52A may have a larger width than the wiring 52. Furthermore, the electrodes 52A may have a shape that extends in the first direction D1 like the wiring 52.

Figure 60:
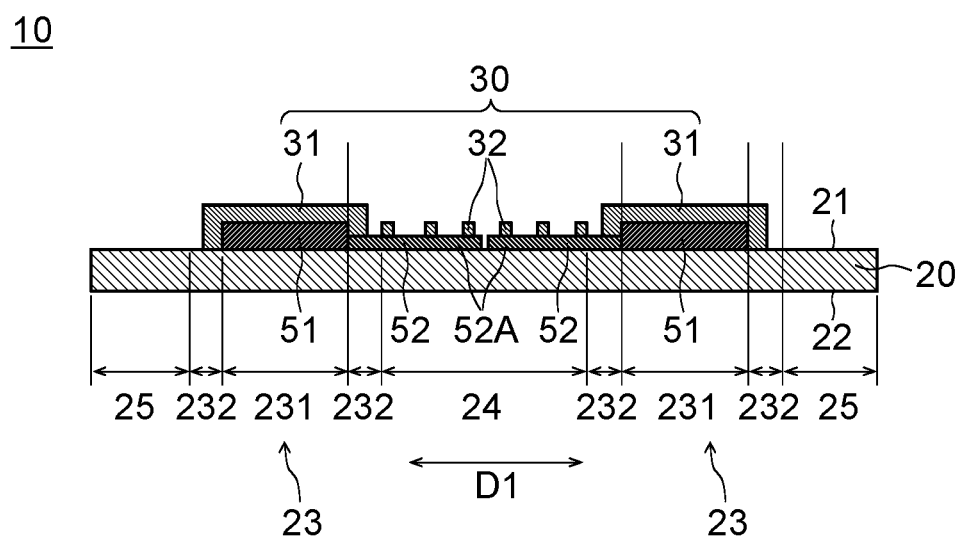
FIG. 60 is a cross-sectional view illustrating a case in which the wiring board of FIG. 59 is cut along a line XXXXXX-XXXXXX.

FIG. 60 is a cross-sectional view illustrating a case in which the wiring board of FIG. 59 is cut along a line XXXXXX-XXXXXX. As illustrated in FIG. 60, the electrode 52A may include a conductive layer integral to the conductive layer constituting the wiring 52.

Like the wiring 52, a meandering shape section may occur in the electrode 52A positioned in the wiring region 24 when the tensile stress is removed from the substrate 20 and the substrate 20 contracts. When the height of the plurality of the peaks and the depth of the valleys of the meandering shape section that occurs in the electrode 52A vary according to position, damage to the electrode 52A is conceivable.

In view of such a problem, as illustrated in FIG. 59, a plurality of second stretching control parts 32 for controlling the meandering shape section that occurs in the electrode 52A may be provided. The plurality of second stretching control parts 32 are arranged along the first direction D1 in which the pluralities of peaks and valleys of the meandering shape section of the electrode 52A are aligned. By providing the plurality of second stretching control parts 32, the occurrence of significant localized curvature and bending in the electrode 52A can be suppressed. As a result, damage to the electrode 52A can be suppressed.

As illustrated in FIG. 59, the second stretching control parts 32 may extend so as to intersect the electrode 52A and the wiring 52 in a plan view. Alternatively, although not illustrated, the second stretching control parts 32 need not overlap the electrode 52A in a plan view.

Next, a modification example of the pattern of the second stretching control part 32 positioned in the wiring region 24 will be described.

First Modification Example of Pattern

Figure 40:
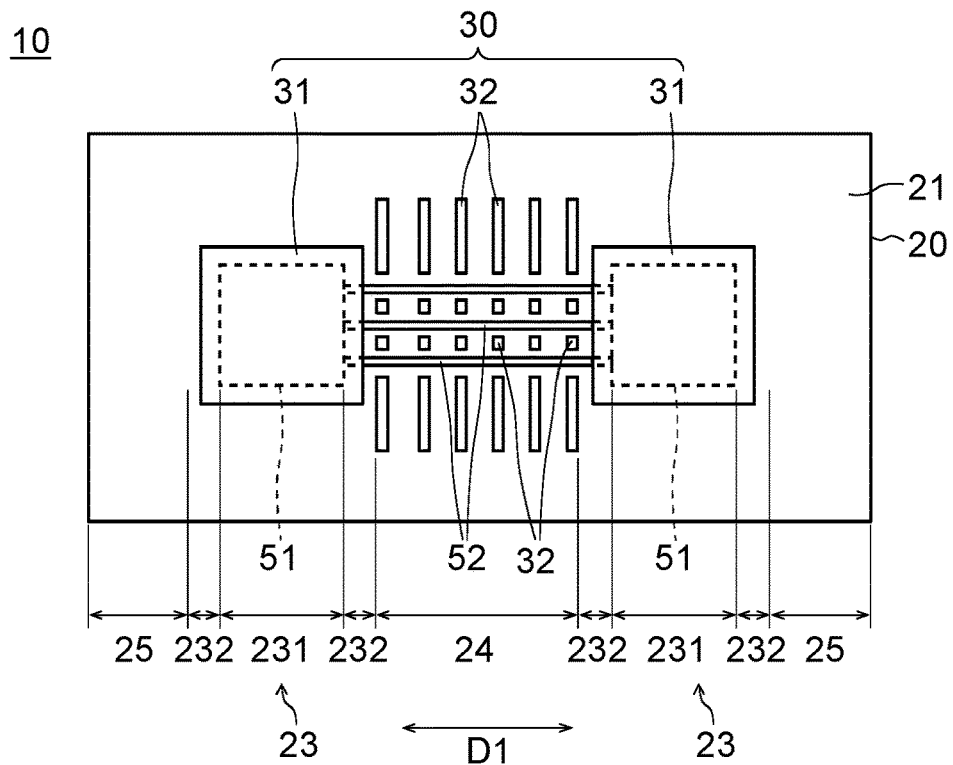
FIG. 40 is a plan view illustrating a modification example of the stretching control mechanism.

In the foregoing embodiment, the example in which the second stretching control parts 32 positioned in the wiring region 24 are provided so as to overlap the wiring 52 is illustrated. However, the present disclosure is not limited to or by this example, rather, as illustrated in FIG. 40, the second stretching control parts 32 need not overlap the wiring 52. For example, the second stretching control parts 32 and the wiring 52 may be positioned in the same plane. Even in this case, by arranging the plurality of second stretching control parts 32 along the first direction D1 in which the meandering shape section 57 appears, it is possible to restrain the periodicity of the meandering shape section 57 from being disturbed and the height of the peaks 53 of the meandering shape section 57 from being locally large. It is accordingly possible to restrain significant stress from acting on the wiring 52 and damage to the wiring 52. Note that, when the second stretching control parts 32 and the wiring 52 are in the same plane, both can be formed simultaneously in the same production process.

Second Modification Example of Pattern

Figure 41:
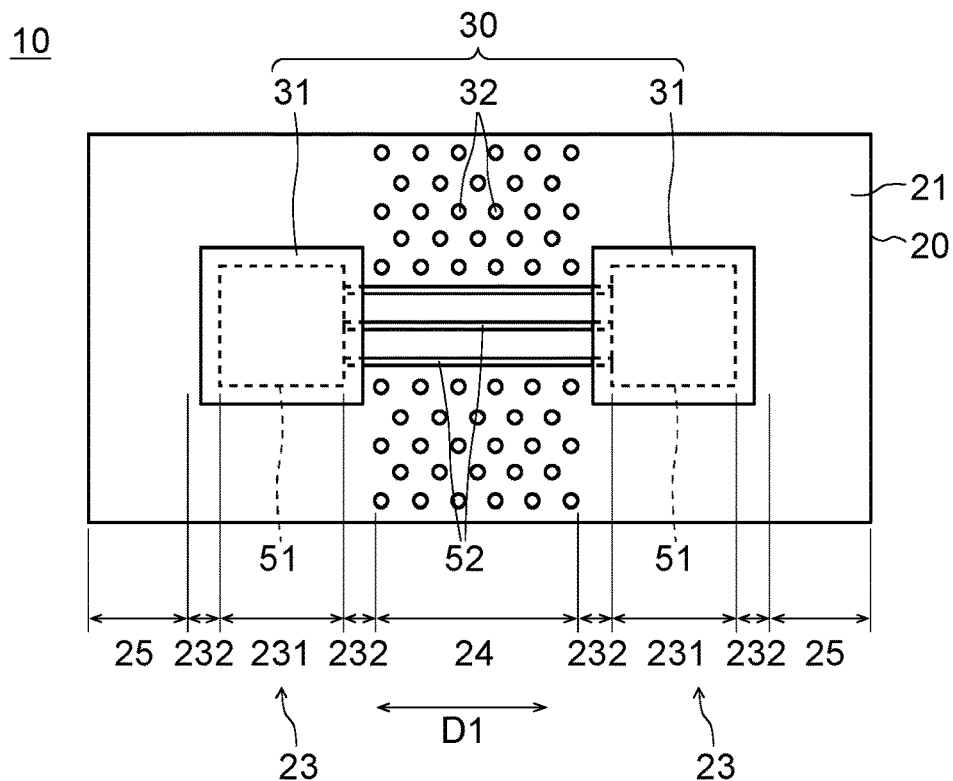
FIG. 41 is a plan view illustrating a modification example of the stretching control mechanism.

In the foregoing embodiment, the example in which the second stretching control parts 32 positioned in the wiring region 24 extend in a direction intersecting the first direction D1 in which the meandering shape section 57 appears, for example, in an orthogonal intersecting direction is illustrated. However, there are no particular limitations on the shape of the second stretching control parts 32 in a plan view. For example, as illustrated in FIG. 41, the second stretching control part 32 may have a circular shape. The circular shape may be a perfect circle shape or an elliptical shape.

Third Modification Example of Pattern

Figure 42:
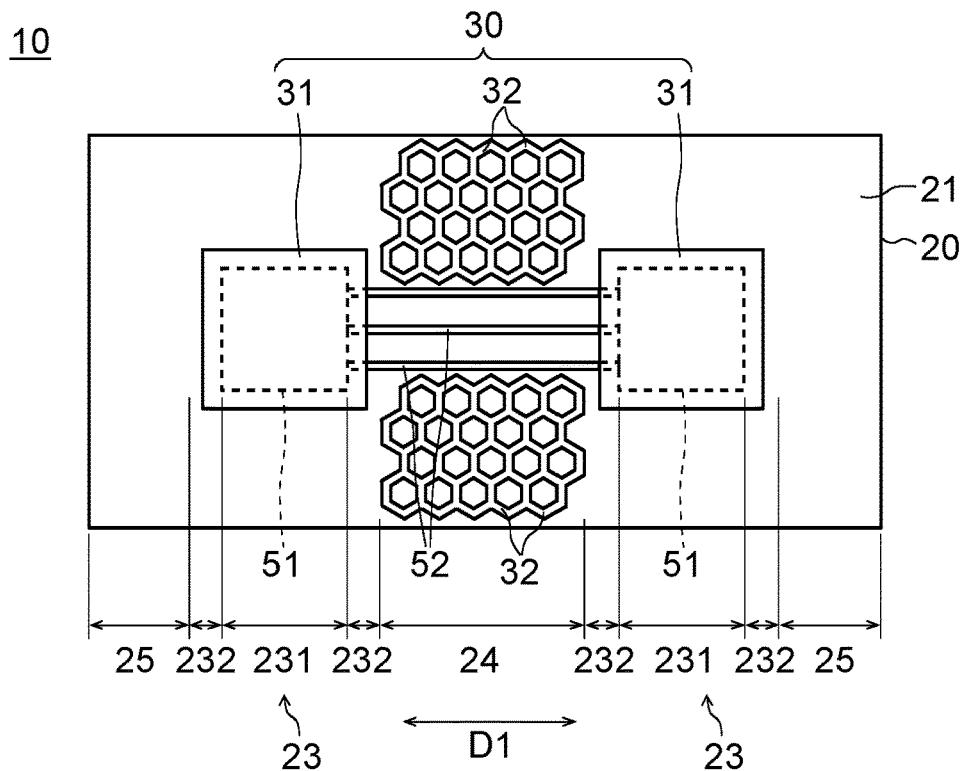
FIG. 42 is a plan view illustrating a modification example of the stretching control mechanism.

Furthermore, as illustrated in FIG. 42, the second stretching control part 32 positioned in the wiring region 24 may also have a hexagonal shape, or a so-called honeycomb shape.

The circular shape illustrated in FIG. 41 and the honeycomb shape illustrated in FIG. 42 are isotropic shapes in comparison with the rectangular shape. Hence, when a force such as tensile stress is applied to the substrate 20, an isotropic extension can be made to occur in the section, overlapping the second stretching control part 32, of the substrate 20 or in the vicinity thereof.

Fourth Modification Example of Pattern

Figure 43:
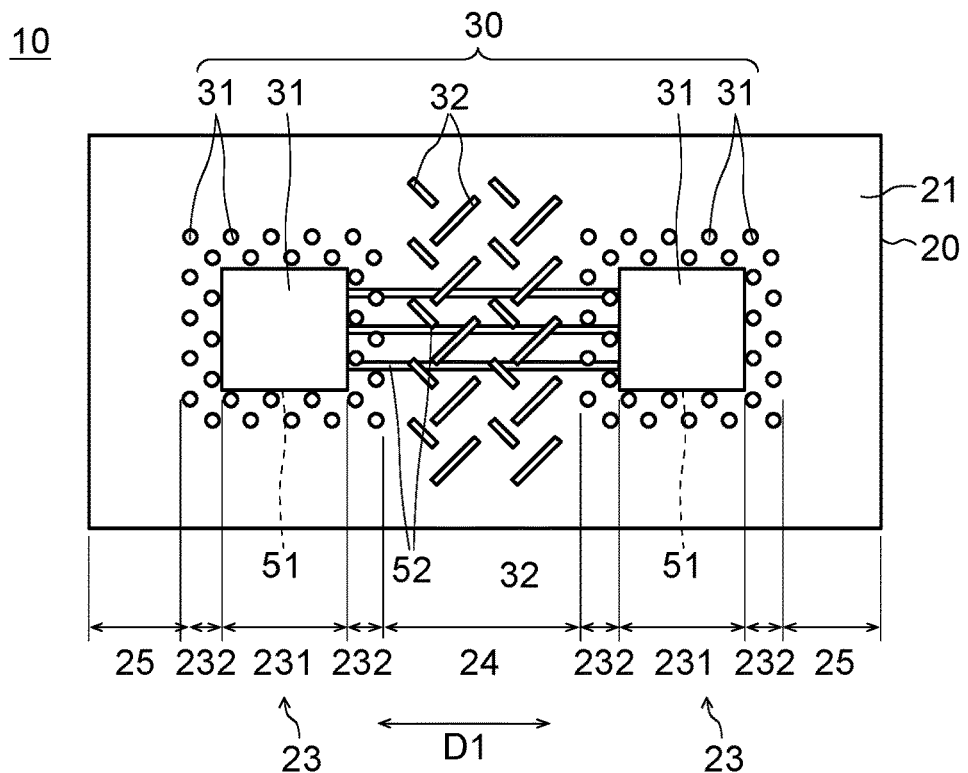
FIG. 43 is a plan view illustrating a modification example of the stretching control mechanism.

The stretching control parts 31 and 32 may have a different pattern according to position. For example, as illustrated in FIG. 43, the first stretching control part 31 positioned in the component-fixing region 231 may have a square shape, the first stretching control part 31 positioned in the component-surrounding region 232 may have a circular shape, and the second stretching control part 32 positioned in the wiring region 24 may have a rectangular shape.

(Modification Example of Wiring Board Layer Configuration)

Although an example in which the electronic component 51 and the wiring 52 are provided on the first surface 21 of the substrate 20 is illustrated in the foregoing embodiment, the present disclosure is not limited to or by this example. An example in which the electronic component 51 and the wiring 52 are supported by a support substrate is illustrated in this modification example.

Figure 44:
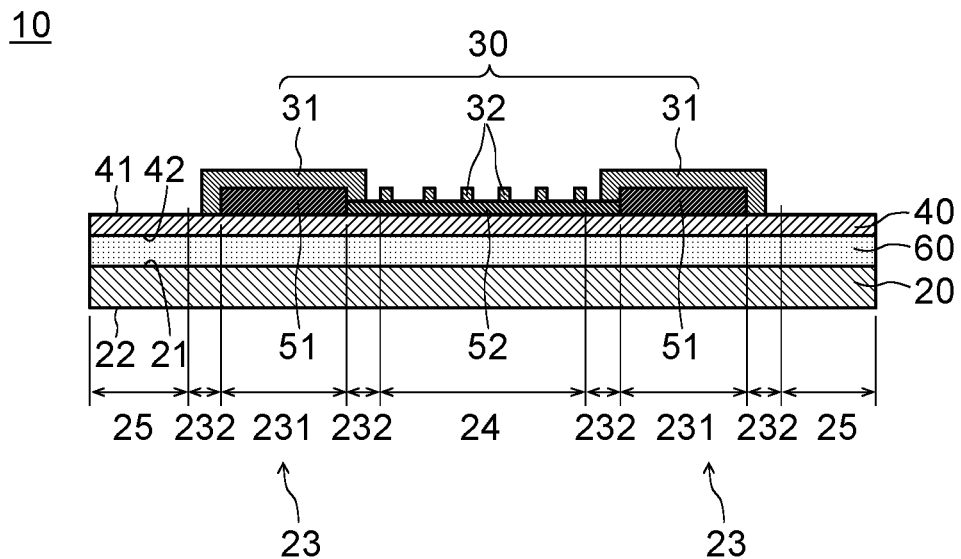
FIG. 44 is a cross-sectional view illustrating a modification example of the wiring board.

FIG. 44 is a cross-sectional view illustrating a wiring board 10 according to this modification example. The wiring board 10 illustrated in FIG. 44 is provided with a substrate 20, a stretching control mechanism 30, a support substrate 40, an electronic component 51, and wiring 52.

[Support Substrate]

The support substrate 40 is a plate-like member that is configured to have a lower stretchability than the substrate 20. The support substrate 40 includes a second surface 42 positioned on the substrate 20 side and a first surface 41 positioned on the opposite side of the second surface 42. In the example illustrated in FIG. 44, the support substrate 40 supports the electronic component 51 and the wiring 52 on the first surface 41 side. The support substrate 40 is bonded to the first surface of the substrate 20 on the second surface 42 side. For example, an adhesive layer 60 that contains an adhesive may be provided between the substrate 20 and support substrate 40. An acrylic-based adhesive or silicone-based adhesive, or the like, for example, can be used as the material constituting the adhesive layer 60. The thickness of the adhesive layer 60 is, for example, 5 μm or more and 200 μm or less. Furthermore, although not illustrated, the second surface 42 of the support substrate 40 may be bonded to the first surface 21 of the substrate 20 by means of a method in which a non-adhesive front face may be subjected to molecular modification to establish a molecular adhesive bond. In this case, an adhesive layer need not be provided between the substrate 20 and the support substrate 40.

In this modification example, the stretching control mechanism 30, which has a first stretching control part 31 and a second stretching control part 32, is provided on the first surface 41 of the support substrate 40. The first stretching control part 31 is positioned in a region, of the support substrate 40, that overlaps the component-surrounding region 232 of the substrate 20. Furthermore, the second stretching control part 32 is positioned in a region, of the support substrate 40, that overlaps the wiring region 24 of the substrate 20.

Figure 45A:
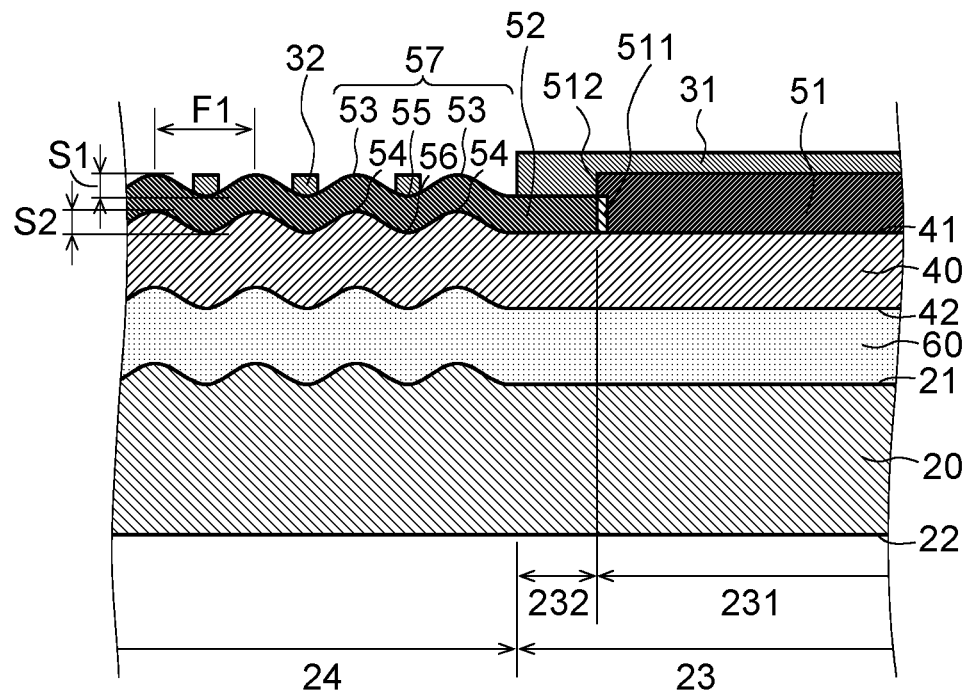
FIG. 45A is a cross-sectional view illustrating an enlargement of the wiring board illustrated in FIG. 44.

FIG. 45A is a cross-sectional view illustrating an enlargement of the wiring board 10 of FIG. 44. In this modification example, when the tensile stress is removed from the substrate 20 bonded to the support substrate 40 and the substrate 20 contracts, the meandering shape section 57 is formed in the support substrate 40 and the wiring 52, as illustrated in FIG. 45A. The characteristics and dimensions of the support substrate 40 are configured such that this meandering shape section 57 is easily formed. For example, the support substrate 40 has an elastic modulus greater than the first elastic modulus of the substrate 20. In the description hereinbelow, the elastic modulus of the support substrate 40 is sometimes also referred to as the third elastic modulus.

Figure 45B:
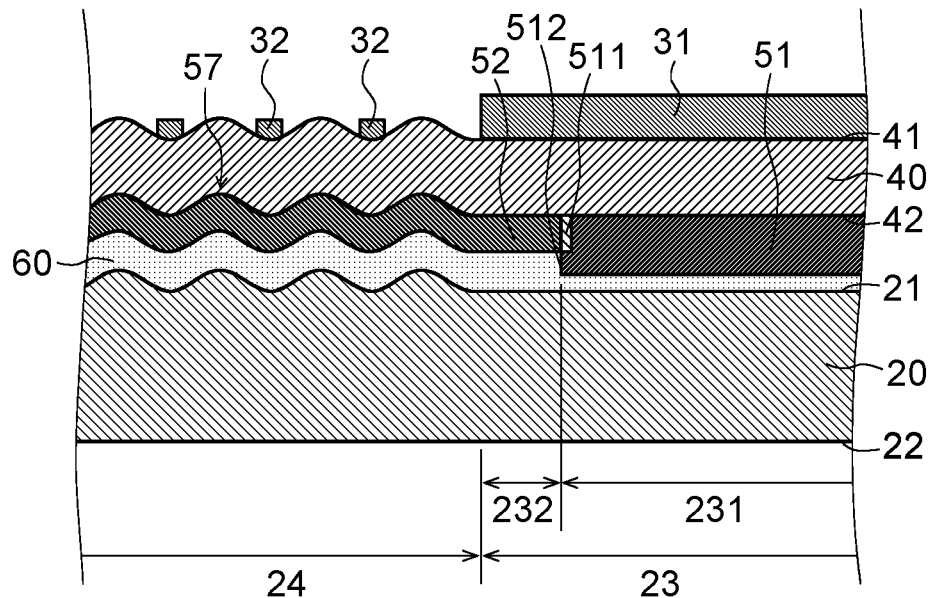
FIG. 45B is a cross-sectional view illustrating a modification example of the wiring board.
Figure 45C:
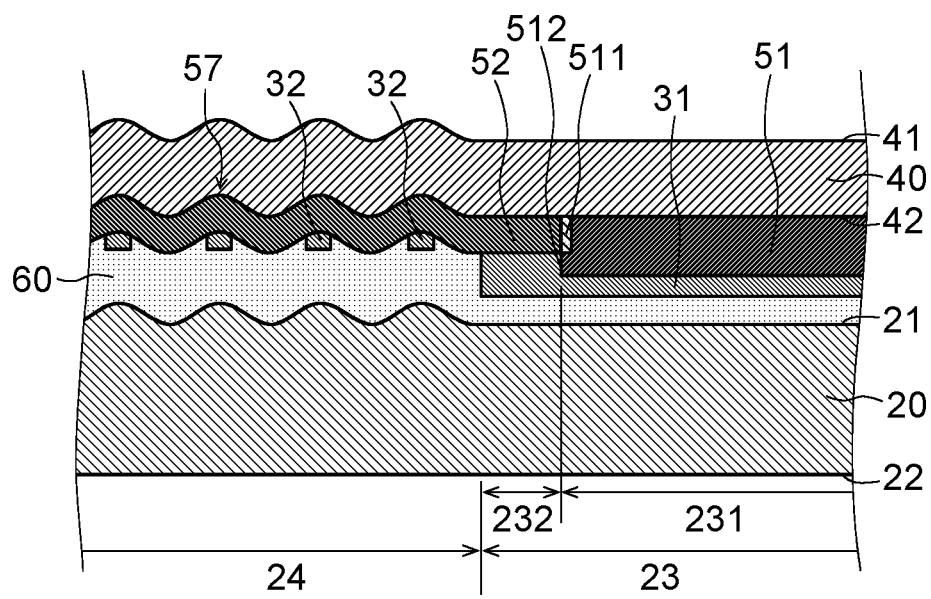
FIG. 45C is a cross-sectional view illustrating a modification example of the wiring board.

Note that, as illustrated in FIG. 45B or 45C, the support substrate 40 may support the electronic component 51 and the wiring 52 on the second surface 42 side. In this case, the first stretching control part 31 and the second stretching control part 32 may be provided on the first surface 41 side of the support substrate 40 as illustrated in FIG. 45B or may be provided on the second surface 42 side of the support substrate 40 as illustrated in FIG. 45C.

The third elastic modulus of the support substrate 40 is, for example, 100 MPa or more and more preferably 1 GPa or more. In addition, the third elastic modulus of the support substrate 40 may be 100 times or more and 50000 times or less the first elastic modulus of the substrate 20, and more preferably 1000 times or more and 10000 times or less the first elastic modulus of the substrate 20. It is possible to suppress an excessively small periodicity of the meandering shape section 57 by thus configuring the third elastic modulus of the support substrate 40. In addition, the occurrence of localized breaks and bending in the meandering shape section 57 can be suppressed.

Note that, when the elastic modulus of the support substrate 40 is too low, the support substrate 40 readily deforms during the process of forming the stretching control parts 31 and 32 and, as a result, alignment of the stretching control parts 31 and 32 with respect to the electronic component 51 and the wiring 52 becomes difficult. Furthermore, when the elastic modulus of the support substrate 40 is too high, restoration of the substrate 20 when same is relaxed is difficult, or cracks and breaks in the substrate 20 then easily occur.

Further, the thickness of the support substrate 40 is, for example 500 nm or more and 10 μm or less, more preferably 1 μm or more and 5 μm or less. When the thickness of the support substrate 40 is too small, it is difficult to handle the support substrate 40 in the manufacturing process of the support substrate 40 or in the process of forming a member on the support substrate 40. When the thickness of the support substrate 40 is too large, restoration of the substrate 20 when same is relaxed is difficult, and the intended extension and contraction of the substrate 20 is not obtained.

Polyethylene naphthalate, polyimides, polyethylene terephthalate, polycarbonates, or acrylic resins, or the like, for example, can be used as the material constituting the support substrate 40. Of these, polyethylene naphthalate or a polyimide of favorable durability and thermal resistance may preferably be used.

The third elastic modulus of the support substrate 40 may be 100 times or less the first elastic modulus of the substrate 20. The method for calculating the third elastic modulus of the support substrate 40 is the same as the case of the substrate 20.

(Method for Manufacturing Wiring Board)

A method for manufacturing the wiring board 10 according to this modification example will be described hereinbelow with reference to FIGS. 46A to 46D.

Figure 46A:
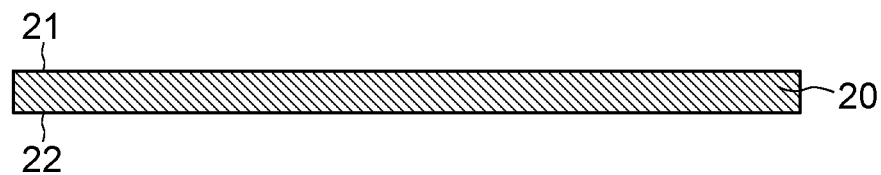
FIG. 46A is a diagram to illustrate a method for manufacturing the wiring board illustrated in FIG. 44.
Figure 46B:
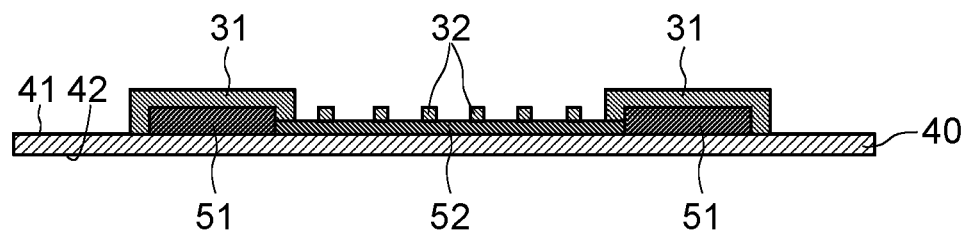
FIG. 46B is a diagram to illustrate a method for manufacturing the wiring board illustrated in FIG. 44.

First, as illustrated in FIG. 46A, a substrate preparation step in which a stretchable substrate 20 is prepared is carried out. Furthermore, a support substrate preparation step of preparing the support substrate 40 is carried out. In the support substrate preparation process, as illustrated in FIG. 46B, the electronic component 51 and wiring 52 are provided on the first surface 41 of the support substrate 40. Further, the stretching control mechanism 30, which has the first stretching control part 31 and the second stretching control part 32, is provided on the first surface 41 side of the support substrate 40.

Next, a first step of extending the substrate 20 by applying a tensile stress T to the substrate 20 is implemented. The rate of extension of the substrate 20 is 10% or more and 200% or less, for example. The first step may be carried out in a state where the substrate 20 is heated or may be carried out at a normal temperature. When the substrate 20 is heated, the temperature of the substrate 20 is 50° C. or higher and 100° C. or lower, for example.

Figure 46C:
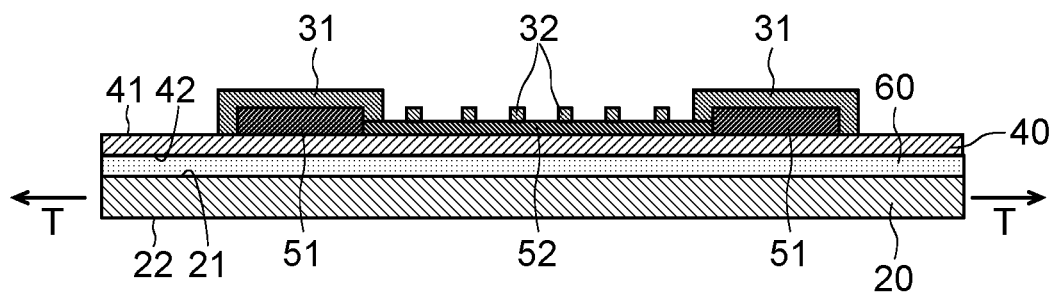
FIG. 46C is a diagram to illustrate a method for manufacturing the wiring board illustrated in FIG. 44.
Figure 46D:
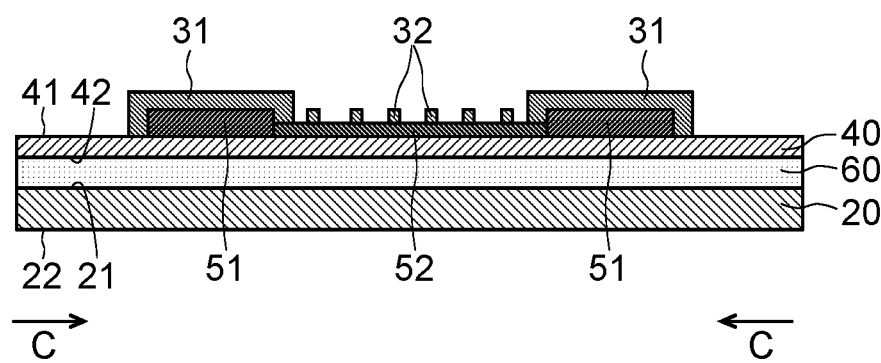
FIG. 46D is a diagram to illustrate a method for manufacturing the wiring board illustrated in FIG. 44.

Thereafter, a second step of providing the electronic component 51 and wiring 52 on the first surface 21 side of the substrate 20, which is in the state of being extended by the tensile stress T, is carried out. Further, in the second step of this modification example, as illustrated in FIG. 46C, the support substrate 40, where the stretching control mechanism 30 is provided together with the electronic component 51 and wiring 52, is bonded from the second surface 42 side of the support substrate 40 to the first surface 21 of the substrate 20. At such time, the adhesive layer 60 may be provided between the substrate 20 and the support substrate 40.

Thereafter, a third step in which the tensile stress T is removed from the substrate 20 is carried out. Thus, as indicated by the arrows C in FIG. 46D, the substrate 20 contracts and deformation also occurs in the support substrate 40 and the wiring 52 which are bonded to the substrate 20. The third elastic modulus of the support substrate 40 is greater than the first elastic modulus of the substrate 20. Hence, deformation of the support substrate 40 and the wiring 52 can be made to occur as the generation of the meandering shape section.

In this modification example, the first stretching control part 31 is provided in the region, of the support substrate 40, that overlaps the component-surrounding region 232 of the substrate 20. Hence, the occurrence of a large peak 53 in the wiring 52 in the vicinity of the electrode 511 of the electronic component 51 can be suppressed. Thus, damage to the electrical junction between the electrode 511 of the electronic component 51 and the wiring 52 can be suppressed.

In this modification example, the second stretching control parts 32 are provided in the region, of the support substrate 40, that overlaps the wiring region 24 of the substrate 20. It is thus possible to restrain the periodicity of the meandering shape section 57 that appears in the support substrate 40 and the wiring 52 from being disturbed and the height of the peaks 53 of the meandering shape section 57 from being locally large. It is accordingly possible to restrain significant stress from acting on the wiring 52 and damage to the wiring 52.

Figure 47:
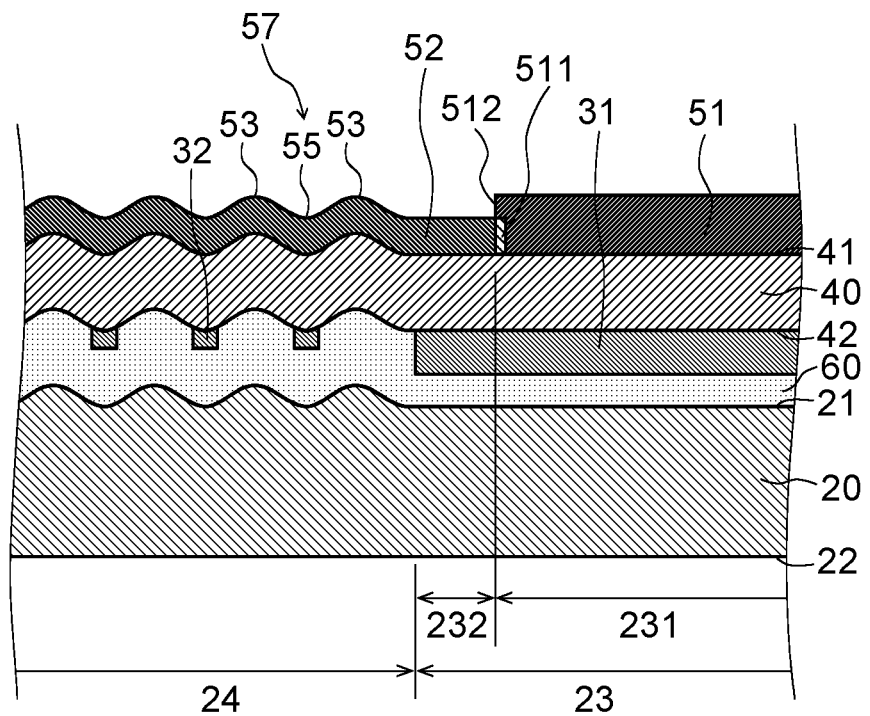
FIG. 47 is a cross-sectional view illustrating a modification example of the stretching control mechanism.
Figure 48A:
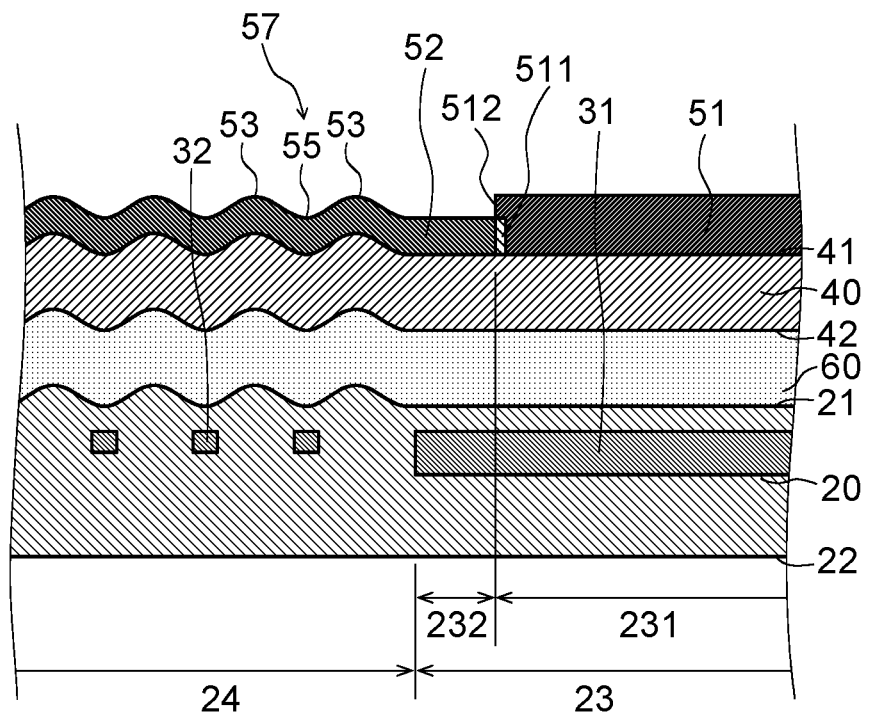
FIG. 48A is a cross-sectional view illustrating a modification example of the stretching control mechanism.
Figure 48B:
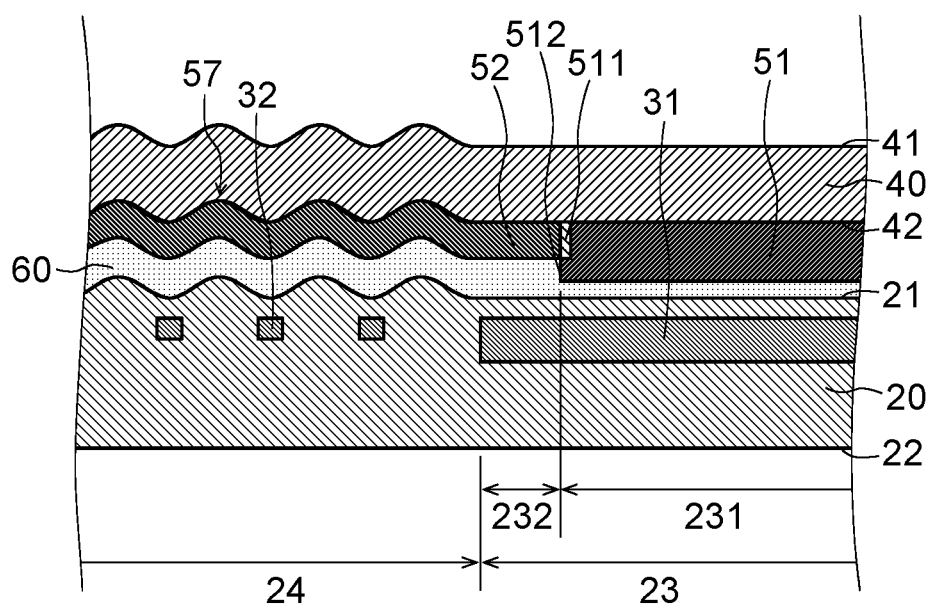
FIG. 48B is a cross-sectional view illustrating a modification example of the stretching control mechanism.
Figure 49:
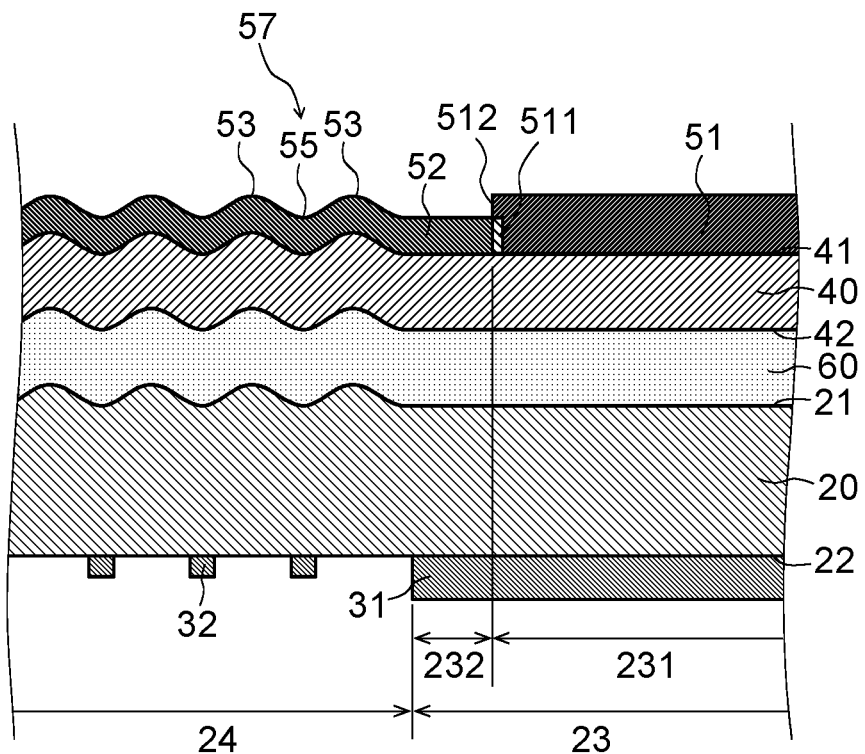
FIG. 49 is a cross-sectional view illustrating a modification example of the stretching control mechanism.

Although an example in which the first stretching control parts 31 and the second stretching control parts 32 are positioned on the first surface 41 side of the support substrate 40 is illustrated in FIG. 44, the present disclosure is not limited to or by this example. For example, as illustrated in FIG. 47, the first stretching control parts 31 and second stretching control parts 32 may be positioned between the support substrate 40 and the substrate 20. Furthermore, as illustrated in FIG. 48A or FIG. 48B, the first stretching control parts 31 and second stretching control parts 32 may also be embedded inside the substrate 20. In addition, as illustrated in FIG. 49, the first stretching control parts 31 and second stretching control parts 32 may be positioned on the second surface 22 side of the substrate 20. As illustrated in FIG. 48A, the support substrate 40 may support the electronic component 51 and the wiring 52 on the first surface 41 side. As illustrated in FIG. 48B, the support substrate 40 may support the electronic component 51 and the wiring 52 via on the second surface 42 side. As per the example illustrated in FIG. 49, although not illustrated, the support substrate 40 may support the electronic component 51 and the wiring 52 via its second surface 42 side.

Although not illustrated, also in this modification, the first stretching control part 31 may include a first section 311, and a second section 312 with a higher deformability than the first section 311. In addition, the second stretching control part 32 may include a first section 321, and a second section 322 with a higher deformability than the first section 321.

Figure 50:
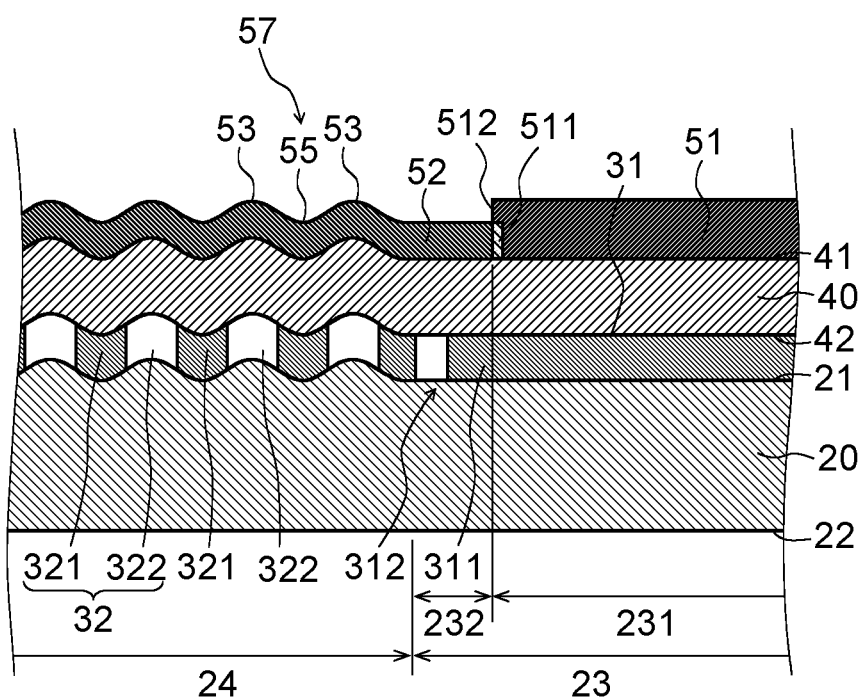
FIG. 50 is a cross-sectional view illustrating a modification example of the stretching control mechanism.

As illustrated in FIG. 50, an air gap section 37 between the support substrate 40 and the substrate 20 may function as the second section 322 of the second stretching control part 32. In this case, the first section 321 of the second stretching control part 32 is configured by a member capable of functioning as an adhesive that bonds the support substrate 40 to the substrate 20. In the example illustrated in FIG. 50, because no such member is present in the second section 322, the deformability of the second section 322 is higher than the deformability of the first section 321. Hence, a specified phase of the meandering shape section 57 easily occur at positions of the first sections 321. Further, the second section 322 does not impede the generation or deformation of the meandering shape section 57. Hence, the deformability and stretchability of the wiring region 24 of the substrate 20 can be maintained while ensuring the stability of the periodicity of the meandering shape section 57.

As illustrated in FIG. 50, the air gap section 37 between the support substrate 40 and the substrate 20 may also be partially present in the component-surrounding region 232.

Figure 51:
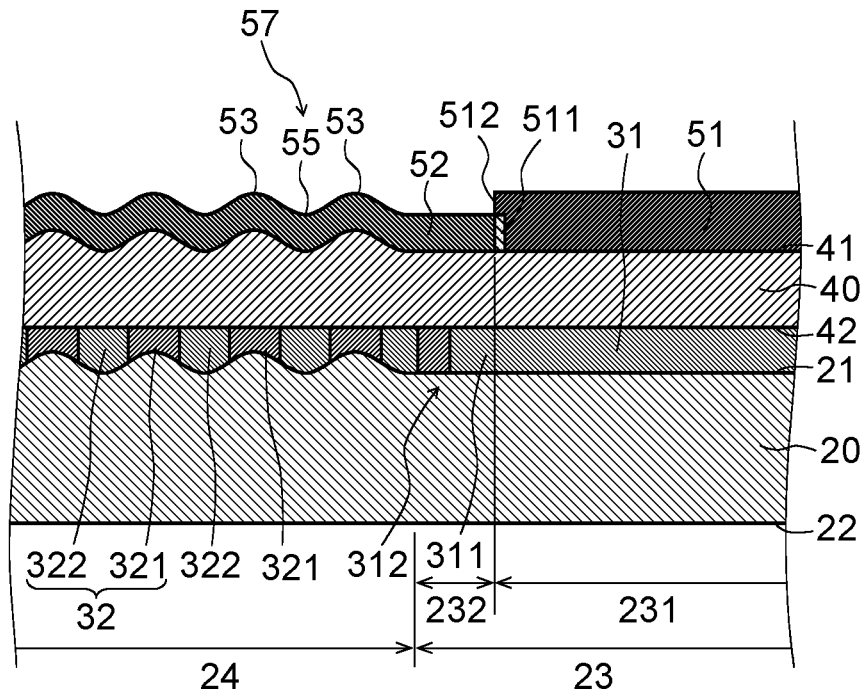
FIG. 51 is a cross-sectional view illustrating a modification example of the stretching control mechanism.

When the second stretching control parts 32 are positioned between the support substrate 40 and the substrate 20 as illustrated in FIG. 51, the second stretching control parts 32 may be configured such that the elastic modulus of the second section 322 of the second stretching control parts 32 is smaller than the elastic modulus of the first section 321. Likewise also for the first stretching control parts 31, the first stretching control parts 31 may be configured such that the elastic modulus of the second section 312 of the first stretching control parts 31 is smaller than the elastic modulus of the first section 311. In the example illustrated in FIG. 51, the first stretching control parts 31 and second stretching control parts 32 are both configured by a member capable of functioning as an adhesive that bonds the support substrate 40 to the substrate 20.

(Elastic Modulus Modification Example)

When the elastic modulus of the substrate 20 is E1, the elastic modulus of the first stretching control part 31 is E21, and the elastic modulus of the second stretching control part 32 is E22, examples in which same are combined as below are conceivable.

Example 1: $E1<E21=E22$
Example 2: $E1<E22<E21$
Example 3: $E22 \leq E1<E21$
Example 4: $E21=E22 \leq E1$ (Modification Example of Stretching Control Mechanism)

Figure 52:
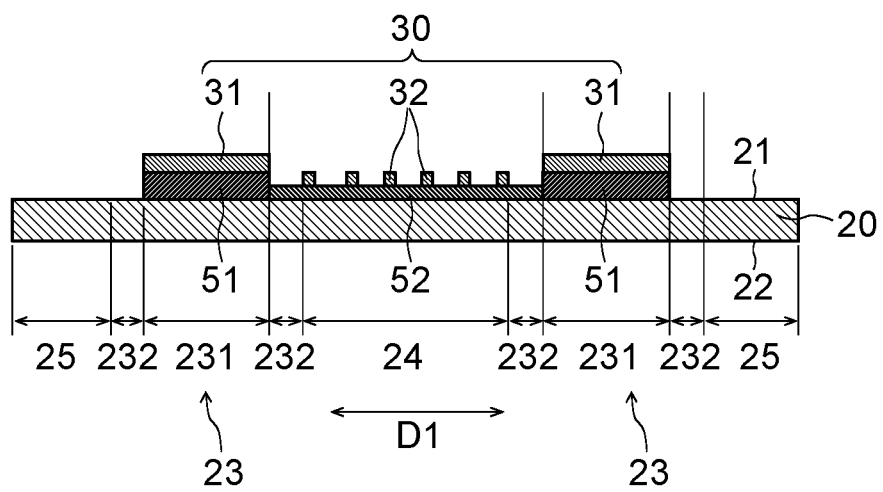
FIG. 52 is a cross-sectional view illustrating a modification example of the stretching control mechanism.

In the foregoing embodiment and modification examples, the example in which the stretching control mechanism 30 has both the first stretching control part 31 positioned in the component-surrounding region 232 and the second stretching control part 32 positioned in the wiring region 24 is illustrated. However, the present disclosure is not limited to or by this example, rather, as illustrated in FIG. 52, the stretching control mechanism 30 has the second stretching control part 32 positioned in the wiring region 24 but does not have the first stretching control part 31 positioned in the component-surrounding region 232. In this case, the first stretching control part 31 may be provided in the component-fixing region 231, or may not be provided in the component-fixing region 231.

Although not illustrated, the stretching control mechanism 30 may further include a stretching control part that is positioned in the surrounding region 25.

(Wiring Board Modification Example)

In the foregoing embodiment and modification examples, the example in which the wiring board 10 is provided with the electronic component 51, which is installed in the component region 23 of the substrate 20, is illustrated. However, the present disclosure is not limited to or by this example. The wiring board 10 need not be provided with the electronic component 51. For example, the meandering shape section 57 may also be produced in the substrate 20 in a state where the electronic component 51 is not installed. In addition, the support substrate 40 may be bonded to the substrate 20 with the electronic component 51 not being installed. Furthermore, the wiring board 10 may also be shipped in a state where the electronic component 51 is not installed.

In the foregoing embodiment and modification examples, the example in which the electronic component 51 is mounted on the wiring board 10 is illustrated. For example, the example in which the substrate 20 of the wiring board 10 includes the component region 23 for the electronic component 51 is illustrated. However, the present disclosure is not limited to or by this example, provided that the wiring board 10 at least the wiring region 24 for the wiring 52. Even if the electronic component 51 is not mounted on the wiring board 10, the second stretching control parts 32 positioned in the wiring region 24 brings benefits to the wiring board 10 that the periodicity F1 of the meandering shape section 57 of the wiring 52 can be controlled.

(Example of Wiring Board Provided with Reinforcing Member)

Figure 61:
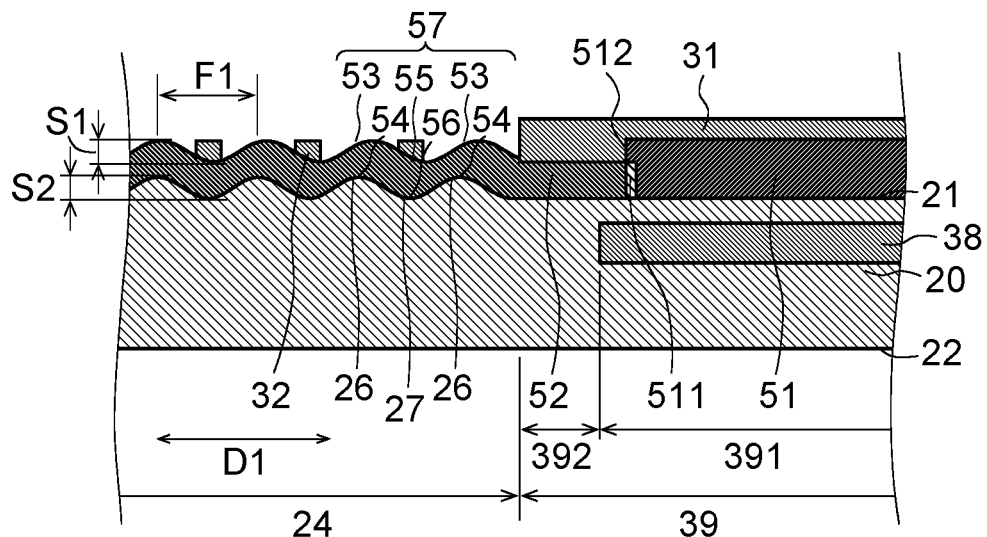
FIG. 61 is a cross-sectional view illustrating a modification example of the wiring board.

Next, an example in which the wiring board 10 is provided with a reinforcing member 38 that at least overlaps the electronic component 51, in addition to the first stretching control part 31, will be described with reference to FIG. 61. FIG. 61 is a cross-sectional view illustrating a modification example of the wiring board 10.

In this modification example, the wiring board 10 is further provided with the reinforcing member 38 that at least overlaps the electronic component 51. The reinforcing member 38 has an elastic modulus greater than the first elastic modulus of the substrate 20. The elastic modulus of the reinforcing member 38 is, for example, 1 GPa or more, and more preferably 10 GPa or more. The elastic modulus of the reinforcing member 38 may be 100 times or more the first elastic modulus of the substrate 20 or may be 1000 times or more the first elastic modulus of the substrate 20. By providing this reinforcing member 38 on the substrate 20, extension and contraction of the section of the substrate 20 which overlaps the reinforcing member 38 can be suppressed. The elastic modulus of the reinforcing member 38 may also be 500 GPa or less. Furthermore, the elastic modulus of the reinforcing member 38 may be 500000 times or less the first elastic modulus of the substrate 20. The method for calculating the elastic modulus of the reinforcing member 38 is the same as the case of the substrate 20.

The reinforcing member 38 has a bending rigidity greater than the bending rigidity of the substrate 20. The bending rigidity of the reinforcing member 38 may be 100 times or more the bending rigidity of the substrate 20 or may be 1000 times or more the bending rigidity of the substrate 20.

Examples of the material constituting the reinforcing member 38 include metal layers containing metallic material, general thermoplastic elastomers, acrylic-based, urethane-based, epoxy-based, polyester-based, vinyl ether-based, polyene thiol-based, and silicone-based oligomers and polymers, and the like. Possible examples of the metallic material include copper, aluminum, and stainless steel, and the like. The thickness of the reinforcing member 38 is 10 μm or more, for example.

In the example illustrated in FIG. 61, the reinforcing member 38 is embedded inside the substrate 20. However, as long as extension and contraction of the section of the substrate 20 which overlaps the reinforcing member 38 can be suppressed, the position of the reinforcing member 38 is optional. For example, the reinforcing member 38 may be positioned on the second surface 22 side of the substrate 20 or may be positioned on the first surface 21 side of the substrate 20. When the wiring board 10 is provided with the support substrate 40, the reinforcing member 38 may be positioned on the first surface 41 of the support substrate 40 or may be positioned on the second surface 42 of the support substrate 40.

In the example illustrated in FIG. 61, the reinforcing member 38 extends from a position overlapping the electronic component 51 to a position further on the wiring 52 side than the end portion 512 of the electronic component 51, in the planar direction of the first surface 21 of the substrate 20. In the description hereinbelow, the region which overlaps the reinforcing member 38 when viewed along the normal direction of the first surface 21 of the substrate 20 is also referred to as a reinforcing member region 391. Furthermore, the region positioned around the reinforcing member region 391 is also referred to as a reinforcing surrounding region 392. In addition, the region that includes the reinforcing member region 391 and the reinforcing surrounding region 392 is also referred to as a reinforcing region 39.

In cases where the wiring board 10 is provided with the reinforcing member 38, when extension and contraction occur in the substrate 20, there is a concentration of stress in the border section between the section of the wiring board 10 that overlaps the reinforcing member 38, that is, the reinforcing member region 391, and the reinforcing surrounding region 392. In view of the foregoing, as illustrated in FIG. 61, it is preferable that the first stretching control part 31 is provided in the reinforcing surrounding region 392, and the first stretching control part 31 spreads to the border between the reinforcing surrounding region 392 and the reinforcing member region 391. Thus, damage to the wiring 52 and the like in the border section between the reinforcing member region 391 and the reinforcing surrounding region 392 can be suppressed.

The dimensions of the reinforcing surrounding region 392 are defined so as to enable suppression of a concentration of stress in the border section between the reinforcing member region 391 and the reinforcing surrounding region 392. For example, the surface area of the reinforcing surrounding region 392 may be one quarter or more of the surface area of the reinforcing member region 391 or may be one half or more of the surface area of the reinforcing member region 391. In addition, the surface area of the reinforcing surrounding region 392 may be equal to or smaller than the surface area of the reinforcing member region 391 or may be three-quarters or less of the surface area of the reinforcing member region 391, for example.

The reinforcing surrounding region 392 may also be defined as a region within a fixed distance from the end portion of the reinforcing member region 391. For example, the reinforcing surrounding region 392 may be a region having a distance of 5 mm or less from the end portion of the reinforcing member region 391 or may be a region having a distance of 2 mm or less from the end portion of the reinforcing member region 391.

Figure 62:
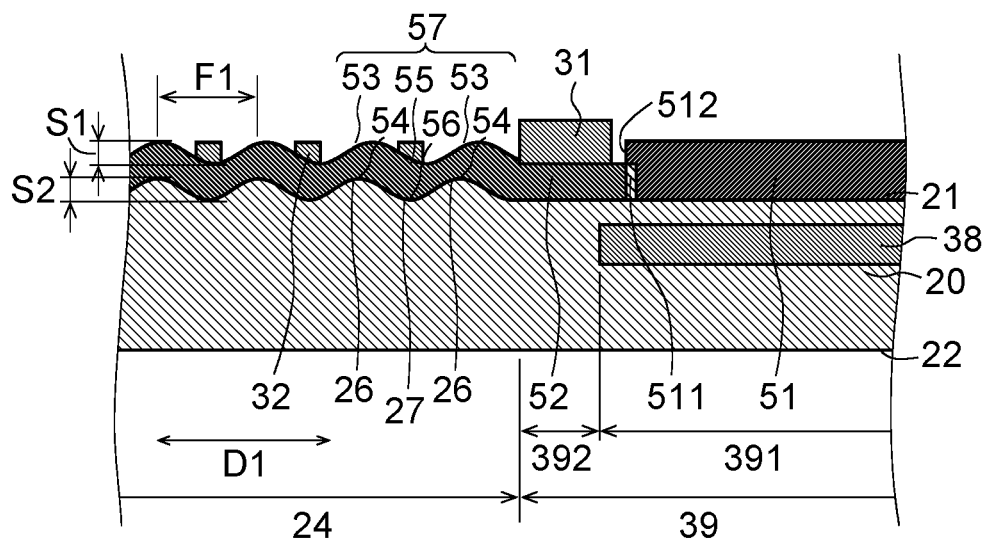
FIG. 62 is a cross-sectional view illustrating a modification example of the wiring board.

Although an example in which the first stretching control part 31 overlaps the whole area of the reinforcing member region 391 is illustrated in FIG. 61, the present disclosure is not limited to or by this example. As long as the first stretching control part 31 provided in the reinforcing surrounding region 392 spreads to the border between the reinforcing surrounding region 392 and the reinforcing member region 391, the placement of the first stretching control part 31 is optional. For example, as illustrated in FIG. 62, the first stretching control part 31 provided in the reinforcing surrounding region 392 need not overlap the whole area of the reinforcing member region 391. In this case, the first stretching control part 31 may partially overlap at least the reinforcing member 38. For example, as illustrated in FIG. 62, the first stretching control part 31 may not overlap the electronic component 51 and may partially overlap the reinforcing member 38. Alternatively, although not illustrated, the first stretching control part 31 may partially overlap the electronic component 51 and the reinforcing member 38.

Although several modification examples have been described for the foregoing embodiment, it goes without saying that a plurality of modification examples may also be suitably combined and applied.

EMBODIMENT EXAMPLES

Next, the present invention will be explained more specifically by means of embodiment examples, but as long as not departing from the spirit of the present invention, the present invention is not limited to or by the following embodiment examples.

Embodiment Example 1

A substrate provided with the support substrate 40, the adhesive layer 60, and the substrate 20, which is illustrated in FIG. 44, was produced as the wiring board 10. A method for manufacturing the wiring board 10 will be described hereinbelow.

<<Preparation of Substrate and Adhesive Layer>>

As the adhesive layer 60, an adhesive sheet 8146 (manufactured by 3M) was used and polydimethylsiloxane (PDMS) for two-liquid adduct condensation was coated on the adhesive sheet in a thickness of 900 μm, and the PDMS was cured, thereby preparing a stacked body of the adhesive layer 60 and substrate 20. Thereafter, a portion of the stacked body was removed as a sample and the elastic modulus of the substrate 20 was measured by means of tensile testing in conformance with JIS K6251. The elastic modulus of the substrate 20 was 0.05 MPa.

<<Support Substrate Preparation>>

As the support substrate 40, a polyethylene naphthalate (PEN) film of thickness 2.5 μm was used and an Ag paste was screen-printed on the PEN film, thereby providing an electrode pair with a width of 500 μm and wiring connected to the electrode pair. An LED was mounted on the electrode pair. Furthermore, a portion of the support substrate 40 was removed as a sample, and the elastic modulus of the support substrate 40 was measured by means of tensile testing in conformance with JIS K6251. The elastic modulus of the support substrate 40 was 5.2 GPa.

<<Preparation of Stretching Control Mechanism>>

Next, a stripe-like urethane resin structure, which functions as the foregoing second stretching control part 32, was formed on the wiring by means of screen printing to have a width of 300 μm, an interval of 300 μm, and a height of 20 μm. Thereafter, a portion of the second stretching control part 32 was removed as a sample and the elastic modulus of the second stretching control part 32 was measured by means of tensile testing in conformance with JIS K6251. The elastic modulus of the second stretching control part 32 was 35 MPa.

<<Manufacture of Wiring Board>>

In a state where the stacked body of the adhesive layer 60 and the substrate 20 prepared as described earlier was uniaxially extended by 50%, the support substrate 40 prepared as described earlier was bonded to the adhesive layer 60. Then, by releasing the extension, the stacked body of the adhesive layer 60 and the substrate 20 was made to contract. Thus, regions other than the region where the LED is mounted contracted such that an uneven shape was produced in the front face of the support substrate 40. The average of five periods' worth of periodicity was 470 μm, the standard deviation of the periodicity was 23 μm, and the minimum radius of curvature was 70 μm.

Embodiment Example 2

The stacked body of the substrate 20 and the adhesive layer 60, and the support substrate 40 were prepared as per the case of embodiment example 1 except for the followings. In this example, photolithography was adopted as the method for forming the stripe-like acrylic resin structures that function as the second stretching control parts 32, and the height of the structures was 4 μm. Then, as per the case of embodiment example 1, in a state where the stacked body of the adhesive layer 60 and the substrate 20 was uniaxially extended by 50%, the support substrate 40 was bonded to the adhesive layer 60. Then, by releasing the extension, the stacked body of the adhesive layer 60 and the substrate 20 was made to contract. Thus, regions other than the region where the LED is mounted contracted such that an uneven shape was produced in the front face of the support substrate 40. The average of five periods' worth of periodicity was 430 μm, the standard deviation of the periodicity was 14 μm, and the minimum radius of curvature was 23 μm.

Comparative Example 1

The stacked body of the substrate 20 and the adhesive layer 60, and the support substrate 40 were prepared as per the case of embodiment example 1 except for the followings. In this example, the urethane resin structures were not formed on the support substrate 40. Then, as per the case of embodiment example 1, in a state where the stacked body of the adhesive layer 60 and the substrate 20 was uniaxially extended by 50%, the support substrate 40 was bonded to the adhesive layer 60. Then, by releasing the extension, the stacked body of the adhesive layer 60 and the substrate 20 was made to contract. Thus, regions other than the region where the LED is mounted contracted such that an uneven shape was produced in the front face of the support substrate 40. The average of five periods' worth of periodicity was 420 μm, and the standard deviation of the periodicity was 67 μm. Non-uniform creases and wiring breaks were confirmed in the irregularly shaped section.

REFERENCE SIGNS LIST 10 wiring board
20 Substrate
21 First surface
22 Second surface
23 Component region
231 Component-fixing region
232 Component-surrounding region
24 Wiring region
25 Surrounding region
30 Stretching control mechanism
31 First stretching control part
311 First section
312 Second section
32 Second stretching control part
321 First section
322 Second section
36 Recess
37 Air gap section
38 Reinforcing member
39 Reinforcing region
391 Reinforcing member region
392 Reinforcing surrounding region
40 Support substrate
41 First surface
42 Second surface
51 Electronic component
511 Electrode
512 End portion
52 Wiring
53, 54 Peaks
55, 56 Valleys
57 Meandering shape section
60 Adhesive layer

What is claimed is:

1. A wiring board, comprising:
a substrate having a first surface and that is stretchable, the substrate including a wiring region and a component region that is adjacent to the wiring region, and in which an electronic component having an electrode is mounted on the wiring board,
wherein the component region of the substrate includes a component-fixing region overlapping the electronic component mounted on the wiring board when viewed along the normal direction of the first surface of the substrate and a component-surrounding region positioned around the component-fixing region;
a wiring that is at least positioned in the wiring region on a first surface side of the substrate, the wiring having a meandering shape section that includes peaks and valleys aligned along a first direction that is one of planar directions of the first surface of the substrate;
a support substrate that includes: a second surface facing the first surface of the substrate; and a first surface positioned on an opposite side of the second surface of the support substrate, that has an elastic modulus greater than the elastic modulus of the substrate, and that supports the wiring; and a stretching control mechanism that controls extension and contraction of the substrate, wherein the stretching control mechanism includes a first stretching control part and second stretching control parts, the first stretching control part being positioned in the component-surrounding region and spreading to a border between the component-surrounding region and the component-fixing region, and the second stretching control parts being positioned in the wiring region of the substrate and being aligned along the first direction, and wherein the first stretching control part includes a first section and a second section, the second section of the first stretching control part having a higher deformability than the first section of the first stretching control part and being positioned closer to the wiring region than the first section of the first stretching control part.

2. The wiring board according to claim 1, wherein the second stretching control parts positioned in the wiring region each have a bending rigidity greater than the bending rigidity of the substrate.

3. The wiring board according to claim 2, wherein the bending rigidity of the second stretching control parts is more than ten times the bending rigidity of the substrate.

4. The wiring board according to claim 1, wherein the second stretching control parts positioned in the wiring region each have an elastic modulus greater than the elastic modulus of the substrate.

5. The wiring board according to claim 4, wherein the elastic modulus of the second stretching control parts is more than ten times the elastic modulus of the substrate.

6. The wiring board according to claim 1, wherein the second stretching control parts have a thickness of 1 μm or more and 100 μm or less.

7. The wiring board according to claim 1, wherein the second stretching control parts positioned in the wiring region each have a bending rigidity that is equal to or smaller than the bending rigidity of the substrate.

8. The wiring board according to claim 1, wherein the second stretching control parts positioned in the wiring region each have an elastic modulus that is equal to or smaller than the elastic modulus of the substrate.

9. The wiring board according to claim 1, wherein the amplitude of the meandering shape section of the wiring is 1 μm or more.

10. The wiring board according to claim 1, wherein the second stretching control parts positioned in the wiring region are aligned with a periodicity corresponding to the periodicity of the meandering shape section.

11. The wiring board according to claim 10, wherein, when an average value of intervals between the peaks of the meandering shape section is referred to as a first periodicity, and when an average value of intervals between the second stretching control parts positioned in the wiring region is referred to as a second periodicity, the second periodicity is an m multiple or 1/n of the first periodicity, m and n being positive integers.

12. The wiring board according to claim 1, wherein the second stretching control parts positioned in the wiring region each include a first section and a second section having a higher deformability than the first section of the second stretching control parts.

13. The wiring board according to claim 12, wherein a thickness of the second section of the second stretching control parts positioned in the wiring region is at least partially reduced as a distance from the first section of the second stretching control parts increases.

14. The wiring board according to claim 12, wherein an elastic modulus of the second section of the second stretching control parts positioned in the wiring region is smaller than an elastic modulus of the first section of the second stretching control parts positioned in the wiring region.

15. The wiring board according to claim 12, wherein a density distribution of the second section of the second stretching control parts positioned in the wiring region is smaller than a density distribution of the first section of the second stretching control parts positioned in the wiring region.

16. The wiring board according to claim 1, wherein at least two of the second stretching control parts in the wiring region are positioned in a range of one period of the meandering shape section and are in contact with each other.

17. The wiring board according to claim 1, wherein the second stretching control parts of the stretching control mechanism in the wiring region are positioned on the wiring or on the first surface of the substrate.

18. The wiring board according to claim 1, wherein the second stretching control part of the stretching control mechanism in the wiring region is positioned between the wiring and the substrate.

19. The wiring board according to claim 1, wherein the second stretching control part of the stretching control mechanism in the wiring region is embedded inside the substrate.

20. The wiring board according to claim 1, wherein the second stretching control part of the stretching control mechanism in the wiring region is positioned on a second surface side on an opposite side of the first surface of the substrate.

21. The wiring board according to claim 1, wherein the elastic modulus of the support substrate is more than 100 times the elastic modulus of the substrate.

22. The wiring board according to claim 1, further comprising:

an adhesive layer provided between the first surface of the substrate and the second surface of the support substrate and bonding the support substrate to the substrate.

23. The wiring board according to claim 22, wherein the stretching control mechanism is positioned on the first surface side of the support substrate.

24. The wiring board according to claim 23, wherein the stretching control mechanism overlaps the adhesive layer in a plan view.

25. The wiring board according to claim 24, wherein the adhesive layer entirely spreads on the second surface of the support substrate.

26. The wiring board according to claim 1, further comprising:

the electronic component positioned in the component region on the first surface side of the substrate and having the electrode; and wherein the wiring is electrically connected to the electrode of the electronic component.

27. The wiring board according to claim 1, wherein the wiring includes a plurality of conductive particles.

28. A method for manufacturing a wiring board, the method comprising:

applying tensile stress to a substrate so as to extend the substrate, the substrate having a first surface, and being stretchable and including a wiring region and a component region that is adjacent to the wiring region, and in which an electronic component having an electrode is mounted on the wiring board, wherein the component region of the substrate includes a component-fixing region overlapping the electronic component mounted on the wiring board when viewed along the normal direction of the first surface of the substrate and a component-surrounding region positioned around the component-fixing region;

providing wiring in the wiring region, on a first surface side of the substrate, which is in an extended state;

bonding a support substrate, on which the wiring is provided, to the first surface of the substrate;

removing the tensile stress from the substrate, wherein, after the tensile stress has been removed from the substrate, the wiring has a meandering shape section that includes pluralities of peaks and valleys aligned along a first direction that is one of planar directions of the first surface of the substrate, wherein the wiring board is provided with a stretching control mechanism that controls extension and contraction of the substrate, wherein the stretching control mechanism includes a first stretching control part and second stretching control parts, the first stretching control part being positioned in the component-surrounding region and spreading to a border between the component-surrounding region and the component-fixing region, and the second stretching control parts being positioned in the wiring region of the substrate and being aligned along the first direction, and wherein the first stretching control part includes a first section and a second section, the second section of the first stretching control part having a higher deformability than the first section of the first stretching control part and being positioned closer to the wiring region than the first section of the first stretching control part.

29. The wiring board according to claim 1, wherein the thickness of the second section of the first stretching control part is smaller than the thickness of the first section of the first stretching control part.

30. The method according to claim 28, wherein the thickness of the second section of the first stretching control part is smaller than the thickness of the first section of the first stretching control part.

* * * * *